(12) United States Patent
Misaka

(10) Patent No.: US 7,897,298 B2
(45) Date of Patent: Mar. 1, 2011

(54) PHOTOMASK, PHOTOMASK FABRICATION METHOD, PATTERN FORMATION METHOD USING THE PHOTOMASK AND MASK DATA CREATION METHOD

(75) Inventor: Akio Misaka, Osaka (JP)

(73) Assignee: Panasonic Corporation, Osaka (JP)

( * ) Notice: Subject to any disclaimer, the term of this patent is extended or adjusted under 35 U.S.C. 154(b) by 488 days.

(21) Appl. No.: 11/884,554

(22) PCT Filed: Feb. 27, 2007

(86) PCT No.: PCT/JP2007/053602
§ 371 (c)(1),
(2), (4) Date: Aug. 17, 2007

(87) PCT Pub. No.: WO2007/102337
PCT Pub. Date: Sep. 13, 2007

(65) Prior Publication Data
US 2008/0286661 A1      Nov. 20, 2008

(30) Foreign Application Priority Data
Mar. 6, 2006   (JP) .............................. 2006-059602

(51) Int. Cl.
*G03F 1/00* (2006.01)
*G03C 5/00* (2006.01)

(52) U.S. Cl. .......................................... 430/5; 430/311

(58) Field of Classification Search ...................... 430/5, 430/311, 394
See application file for complete search history.

(56) References Cited

U.S. PATENT DOCUMENTS 5,281,500 A    1/1994   Cathey et al.

| | | | |
|---|---|---|---|
| 2002/0155362 A1* | 10/2002 | Heissmeier et al. | 430/5 |
| 2004/0081899 A1* | 4/2004 | Misaka | 430/5 |
| 2004/0121244 A1* | 6/2004 | Misaka | 430/5 |
| 2004/0161678 A1* | 8/2004 | Misaka | 430/5 |
| 2004/0265708 A1* | 12/2004 | Misaka | 430/5 |
| 2006/0121366 A1* | 6/2006 | Misaka | 430/5 |

FOREIGN PATENT DOCUMENTS

| JP | 5-197130 | 8/1993 |
|---|---|---|
| JP | 5-297565 | 11/1993 |
| JP | 7-271013 | 10/1995 |
| JP | 08-292550 | 11/1996 |

(Continued)

OTHER PUBLICATIONS

Japanese Office Action, with English Translation, issued in Japanese Patent Application No. JP 2007-528495 dated on Sep. 2, 2008.

*Primary Examiner*—Stephen Rosasco
*Assistant Examiner*—Rashid Alam
(74) *Attorney, Agent, or Firm*—McDermott Will & Emery LLP

(57) ABSTRACT

A mask pattern including a light-shielding portion 101 and a semi-light-shielding portion 102 is provided on a transparent substrate 100 having a transparent property against exposing light so as to be surrounded with a transparent portion 104. The semi-light-shielding portion 102 is disposed in an outer region of the mask pattern and partially transmits the exposing light in an identical phase to the exposing light passing through the transparent portion 104.

36 Claims, 36 Drawing Sheets

FOREIGN PATENT DOCUMENTS

| JP | 09-127677 | 5/1997 |
| JP | 2006-201434 | 8/2006 |
| JP | 2007-41024 | 2/2007 |
| JP | 2007-72451 | 3/2007 |
| WO | WO 03/062923 A1 | 7/2003 |

* cited by examiner

LIGHT-SHIELDING PORTION(Cr)

PHASE SHIFTER PORTION
(TRANSMITTANCE : T)

L

CD region where MEF≒0 can be realized by
changing transmittance of each pattern

[GENERAL EXPOSURE LIGHT SOURCE]

[ANNULAR EXPOSURE LIGHT SOURCE]

[QUADRUPOLE EXPOSURE LIGHT SOURCE]

[QUADRUPOLE EXPOSURE LIGHT SOURCE]

PHOTOMASK, PHOTOMASK FABRICATION METHOD, PATTERN FORMATION METHOD USING THE PHOTOMASK AND MASK DATA CREATION METHOD

RELATED APPLICATIONS

This application is the U.S. National Phase under 35 U.S.C. §371 of International Application No. PCT/JP2007/053602, filed on Feb. 27, 2007, which in turn claims the benefit of Japanese Application No. 2006-059602, filed on Mar. 6, 2006, the disclosures of which Applications are incorporated by reference herein.

TECHNICAL FIELD

The present invention relates to a photomask for use in forming a fine pattern in fabrication of a semiconductor integrated circuit device or the like, a pattern formation method using the photomask and a mask data creation method for the photomask.

BACKGROUND ART

Recently, there are increasing demands for further refinement of circuit patterns for increasing the degree of integration of a large scale integrated circuit device (hereinafter referred to as the LSI) realized by using semiconductor. As a result, it has become very significant to thin an interconnect pattern included in a circuit.

Now, the thinning of an interconnect pattern by a conventional optical exposure system will be described on the assumption that positive resist process is employed. In this case, a line pattern means a portion of a resist film not exposed to exposing light, namely, a resist portion (a resist pattern) remaining after development. Also, a space pattern means a portion of the resist film exposed to the exposing light, namely, an opening portion (a resist removal pattern) formed by removing the resist film through the development. In the case where negative resist process is employed instead of the positive resist process, the definitions of the line pattern and the space pattern are replaced with each other.

When a pattern is formed by using the optical exposure system, a photomask in which a light-shielding pattern of Cr (chromium) or the like is drawn in accordance with a desired pattern on a transparent substrate (a substrate having a transparent property) of quartz or the like is conventionally used. In such a photomask, a region where the Cr pattern exists is a light-shielding portion that does not transmit exposing light of a given wavelength at all (having transmittance of substantially 0%) and a region where no Cr pattern exists (an opening) is a transparent portion that has transmittance equivalent to that of the transparent substrate (having transmittance of substantially 100%) against the exposing light. At this point, all mask patterns are drawn on the transparent substrate, and in the pattern exposure, the transparent substrate is irradiated from a back side (i.e., a side where the mask patterns are not provided), and therefore, the mask patterns are irradiated with the exposing light having passed through the transparent substrate. Accordingly, when the transmittance of a mask pattern against exposing light is herein argued, the absolute transmittance of each portion of the mask pattern is not used but relative transmittance obtained on the basis of the transmittance of a transparent substrate against the exposing light (100%) is used.

In the case where the photomask as described above is used for the exposure of a wafer where a resist has been applied, an image of light having passed through the mask is projected onto the wafer. In this case, a light-shielding portion of the mask corresponds to an unexposed portion of the resist and an opening (transparent portion) of the mask corresponds to an exposed portion of the resist, so that a desired resist pattern can be formed on the wafer. Accordingly, such a photomask, namely, a photomask composed of a light-shielding portion and a transparent portion against exposing light of a given wavelength, is designated as a binary mask.

It is, however, difficult to accurately form a fine pattern smaller than the exposure wavelength (the wavelength of the exposing light) by using the binary mask because of the light diffraction phenomenon. This is for the following reason: Since the amplitude intensity of a diffraction image of light passing through the mask and projected onto a wafer is reduced, the proportion of zero-order light corresponding to non-diffracted light, namely, the proportion of a noise component in an optical image, is increased, and hence, a clear image cannot be obtained. As a result, a dimension error of a pattern provided on the mask is enhanced in the projected light image, which makes it difficult to form a pattern with desired dimensional accuracy. Such a phenomenon is designated as increase of MEF (mask error factor). In recent LSIs in which patterns are desired to be formed under highly accurate dimensional control, the reduction of the MEF is particularly a significant problem.

Therefore, a mask pattern having a function to shift a phase of light, namely, a photomask provided with a phase shifter (phase shifting mask), is recently used. In a phase shifting mask, a phase shifter for transmitting light in an opposite phase with respect to a transparent portion is used in a pattern region where a light-shielding portion is used in a conventional mask. Owing to this structure, zero-order light of light passing through a transparent portion can be cancelled through an interference effect by light in the opposite phase passing through the phase shifter, so that an optical image with high contrast can be formed. As a result, the increase of the MEF can be suppressed.

In the case where a phase shifter is used for forming a fine line pattern, the phase shifter preferably has transmittance as high as possible and ideally has transmittance equivalent to that of a transparent portion (100%). When a phase shifter with high transmittance is used for forming a thick line pattern, however, light in the opposite phase passing through the center of the phase shifter is unavoidably transferred onto a resist. Therefore, in order to simultaneously form a fine line pattern and a comparatively thick pattern, a halftone phase shifter (typically having transmittance of approximately 6%) for partially transmitting light in the opposite phase is used. Since the halftone phase shifter merely partially transmits light in formation of a comparatively thick pattern, the problem that the light in the opposite phase passing through the center of the phase shifter is transferred onto a resist can be avoided.

Furthermore, a photomask for simultaneously forming a fine line pattern and a comparatively thick pattern in which a phase shifter is used for forming a fine line pattern and a light-shielding portion is used for forming a comparatively thick pattern has been proposed (see, for example, Patent Document 1).

FIG. 36A is a diagram of a desired pattern to be formed by using a conventional photomask disclosed in Patent Document 1, and FIG. 36B is a plan view of the conventional photomask.

As shown in FIG. 36A, the desired pattern 20 to be formed on a wafer through exposure is composed of a fine line pattern and a thick pattern. Also, as shown in FIG. 36B, a transparent portion 14 is provided in a sufficiently large area on a transparent substrate 10, and a mask pattern composed of a light-shielding portion 11 and a phase shifter portion 13 is provided on the transparent portion 14 in a position corresponding to the desired pattern 20. It is noted that the transparent substrate 10 is perspectively shown in FIG. 36B. At this point, for forming a fine pattern with a width not larger than an exposing wavelength (a pattern A), the phase shifter portion 13 with high transmittance against exposing light is used, and for forming a pattern with a width sufficiently larger than the exposing wavelength (a pattern B), the transparent portion 11 or a phase shifter portion with low transmittance against the exposing light is used. In this manner, high contrast can be attained also in the formation of the fine pattern A with a width not larger than the exposing wavelength, and hence, the desired pattern 20 including the fine line pattern can be resolved. In other words, the desired pattern 20 can be formed with high resolution. Furthermore, in the formation of the pattern B with a width sufficiently larger than the exposing wavelength, the light-shielding portion 11 is used as a mask pattern, and therefore, the pattern formation can be satisfactorily performed while preventing degradation of contrast derived from a side effect of the light passing through the mask pattern.

Patent Document 1: Japanese Laid-Open Patent Publication No. 5-297565

Patent Document 2: Japanese Laid-Open Patent Publication No. 7-271013

DISCLOSURE OF THE INVENTION

Problems to be Solved by the Invention

Patterns having a variety of dimensions including a fine line pattern can be simultaneously formed by using the conventional photomask using a halftone phase shifter or the conventional photomask using a phase shifter for forming a fine line pattern and using a light-shielding portion for forming a comparatively thick pattern described above.

These conventional photomasks, however, cannot reduce the MEF in forming a pattern with an arbitrary dimension as compared with a photomask simply using a light-shielding portion. The reason is as follows:

First, in the conventional photomask using a halftone phase shifter, the transmittance of the halftone phase shifter against exposing light is set to be low for preventing pattern transfer derived from light passing through the center of the phase shifter in forming a comparatively thick pattern, and therefore, the contrast of an optical image attained in forming a fine line pattern is sacrificed. In other words, as compared with a phase shifter with transmittance of 100% against the exposing light, the effect to reduce the MEF attained in forming a fine line pattern is reduced. On the contrary, the contrast is also lowered in forming a comparatively thick pattern, and therefore, as compared with a conventional photomask simply using a light-shielding portion, an effect to improve the MEF is minimally attained.

Furthermore, the conventional photomask using a phase shifter with the transmittance of 100% in forming a fine line pattern and a light-shielding portion in forming a comparatively thick pattern exhibits a remarkable effect to reduce the MEF in forming a fine line pattern with a dimension in a very narrowly limited range but cannot achieve any effect to improve the MEF as compared with a conventional photomask simply using a light-shielding portion in forming a pattern with a dimension out of the range.

In consideration of the aforementioned circumstances, an object of the invention is providing a photomask that can attain an MEF reducing effect in formation of a pattern with an arbitrary dimension in simultaneously forming patterns with various dimensions including a fine line pattern so as to accurately form a pattern with a desired dimension, a pattern formation method using the photomask, and a mask data creation method for the photomask.

Means for Solving the Problem

In order to achieve the object, the first photomask of this invention includes a mask pattern provided on a transparent substrate having a transparent property against exposing light, the mask pattern includes a light-shielding portion and a semi-light-shielding portion, a transparent portion having a transparent property against the exposing light and surrounding the mask pattern is provided on the transparent substrate, and the semi-light-shielding portion is provided in at least a part of an outer region of the mask pattern and partially transmits the exposing light in an identical phase to the exposing light passing through the transparent portion.

The second photomask of this invention includes a mask pattern surrounded with a reflection portion on a substrate, the mask pattern includes a non-reflection portion and a semi-reflection portion, and the semi-reflection portion is provided in at least a part of an outer region of the mask pattern and partially reflects exposing light in an opposite phase to the exposing light reflected by the reflection portion.

The method for fabricating a photomask of this invention is a method for fabricating the first photomask of the invention, in which the mask pattern at least includes a first pattern region having a first width and a second pattern region having a second width larger than the first width, a phase shifter portion for transmitting the exposing light in an opposite phase to the exposing light passing through the transparent portion is provided in the first pattern region, the light-shielding portion is provided in the second pattern region, and the semi-light-shielding portion is provided in an outer region of at least the second pattern region, and the method includes the steps of (a) successively forming a semi-light-shielding film and a light-shielding film on the transparent substrate; (b) removing the semi-light-shielding film and the light-shielding film in a region for the transparent portion and in a region for the phase shifter portion; (c) trenching the transparent substrate in the region for the phase shifter portion by a given depth after the step (b); and (d) removing the light-shielding film in a region for the semi-light-shielding portion after the step (b).

The pattern formation method of this invention is a pattern formation method using the first or second photomask of the invention and includes the steps of (a) forming a resist film on a substrate; (b) irradiating the resist film with the exposing light through the photomask; and (c) forming a resist pattern by developing the resist film having been irradiated with the exposing light.

The mask data creation method of the invention is a mask creation method for a photomask including a mask pattern formed on a transparent substrate having a transparent property against exposing light and a transparent portion of the transparent substrate where the mask pattern is not formed, and includes the steps of (a) creating a pattern corresponding to a desired unexposed region of a resist by irradiating the resist with the exposing light through the photomask; (b) dividing the pattern into a first region having a width not larger than a given value and a second region having a width larger than the given value; (c) providing, in the first region, a phase shifter portion for transmitting the exposing light in an opposite phase to the exposing light passing through the transparent portion; (d) providing a light-shielding portion in the second region; and (e) providing, in an outer region of the second region, a semi-light-shielding portion for partially transmitting the exposing light in an identical phase to the exposing light passing through the transparent portion.

EFFECT OF THE INVENTION

According to the present invention, since a semi-light-shielding portion is provided in an outer region of or around a mask pattern, the MEF can be reduced in formation of a pattern with an arbitrary dimension in simultaneously forming patterns with various dimensions including a fine line pattern, and therefore, a pattern with a desired dimension can be accurately formed on a wafer.

Figure 1A:
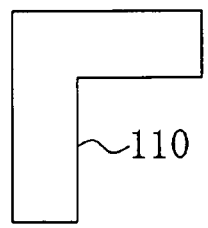
FIG. 1A is a diagram for showing the shape of a desired resist pattern to be formed by using a photomask according to Embodiment 1 of the invention.

DESCRIPTION OF REFERENCE NUMERALS 100 transparent substrate
101 light-shielding portion
101' non-reflection portion
102 semi-light-shielding portion
102' semi-reflection portion
103 phase shifter portion
103' phase shifter portion
104 transparent portion
104' reflection portion
105 quartz substrate
105a trench portion
106 light-shielding film (Cr film)
107 semi-light-shielding film (metal thin film)
108 phase shifting film
109 phase shifting film
110 resist pattern
120 desired pattern
130 resist pattern
151 resist film
151A resist pattern
152 resist film
152A resist pattern
153 resist film
153A resist pattern
201 first region
202 second region
301 recessed pattern
302 protruding pattern
500 substrate
501 first reflection layer
502 second reflection layer
503 absorption layer
600 substrate
601 target film
602 resist film
602a latent image portion
603 exposing light
604 exposing light passing through photomask
605 resist pattern
701 through 703 desired patterns
711 first pattern region
712 second pattern region
721 phase shifter portion
722 light-shielding portion
723 through 725 semi-light-shielding portions
731 through 733 CD adjustment edges
821 phase shifter portion
822 light-shielding portion
823 through 825 semi-light-shielding portions

BEST MODE FOR CARRYING OUT THE INVENTION

Prerequisites

Prerequisites for describing preferred embodiments of the invention will be first described.

Since a photomask is generally used in a reduction projection type aligner, it is necessary to consider a reduction ratio in arguing a pattern dimension on the mask. However, in order to avoid confusion, in the description of each embodiment below, when a pattern dimension on a mask is mentioned in correspondence to a desired pattern to be formed (such as a resist pattern), a value obtained by converting the pattern dimension by using a reduction ratio is used unless otherwise mentioned. Specifically, also in the case where a resist pattern with a width of 100 nm is formed by using a mask pattern with a width of M×100 nm in a 1/M reduction projection system, the width of the mask pattern and the width of the resist pattern are both described as 100 nm.

Also, in each embodiment of the invention, M and NA respectively indicate a reduction ratio and numerical aperture of a reduction projection optical system of an aligner and $\lambda$ indicates the wavelength of exposing light unless otherwise mentioned.

Furthermore, in the case where a pattern dimension for attaining an effect related to any of various optical characteristics is defined in each embodiment of the invention, when merely the upper limit of the pattern dimension is mentioned, the lower limit of the pattern dimension is $0.02 \times \lambda/NA \times M$. This is for the following reason: When a pattern singly present has a dimension smaller than approximately $0.02 \times \lambda/NA \times M$, it is experimentally obvious that any significant optical characteristic effect cannot be attained by the pattern no matter whether the pattern is an opening or a light-shielding portion. For example, when it is described that a specific effect is attained by a pattern with a dimension not more than $0.8 \times \lambda/NA \times M$, it means that the range of the pattern dimension for attaining the specific effect is a range not less than $0.02 \times \lambda/ \text{NA} \times \text{M}$ and not more than $0.8 \times \lambda/\text{NA} \times \text{M}$.

Moreover, in each embodiment of the invention, pattern formation is described on the assumption that the positive resist process for forming a resist pattern correspondingly to an unexposed region of a resist is employed. In the case where negative resist process is employed instead of the positive resist process, since an unexposed region of a resist is removed in the negative resist process, a resist pattern of the positive resist process is replaced with a space pattern.

Moreover, it is assumed that a photomask described in each embodiment of the invention is a transmission mask. In the case where the present photomask is applied to a reflection mask instead of a transmission mask, since a transparent region and a light-shielding region of a transmission mask respectively correspond to a reflection region and a non-reflection region, the transmission phenomenon of a transmission mask is replaced with the reflection phenomenon. Specifically, a transparent substrate of a transmission mask is replaced with a substrate having, on its surface, a reflection film for reflecting exposing light, a transparent portion or a transparent region is replaced with a reflection portion or a reflection region, and a light-shielding portion is replaced with a non-reflection portion. Furthermore, a region partially transmitting light in a transmission mask is replaced with a region partially reflecting light in a reflection mask, and transmittance is replaced with reflectance. Also, a semi-light-shielding portion is replaced with a semi-reflection portion. It is noted that a phase shifter portion of a reflection mask is a portion for reflecting light so as to cause a phase difference from light reflected by a reflection portion.

Furthermore, in the case where transmittance of a mask pattern is argued in each embodiment, absolute transmittance of each portion of a mask pattern is not used but relative transmittance obtained on the basis of the transmittance (100%) of a transparent substrate against exposing light is used. Accordingly, in the case where the photomask is applied not to a transmission mask but to a reflection mask and the transmittance is replaced with the reflectance, absolute reflectance of each portion of a mask pattern is not used but relative reflectance obtained on the basis of the reflectance (100%), against exposing light, of a substrate having, on its surface, a reflection film is used.

Embodiment 1

A photomask according to Embodiment 1 of the invention will now be described with reference to the accompanying drawings.

Figure 1B:
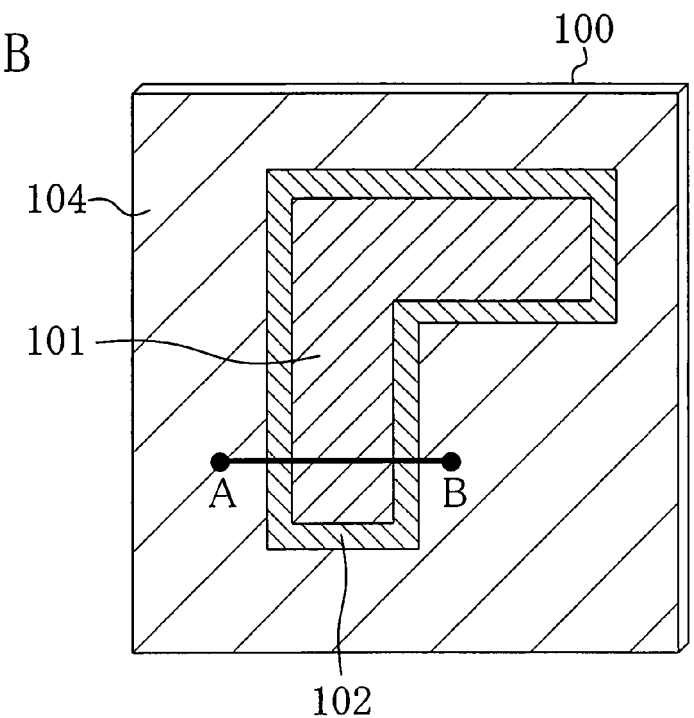
FIG. 1B is a plan view of the photomask according to Embodiment 1 of the invention and FIG. 1C is a cross-sectional view thereof taken on line AB of FIG. 1B.

FIG. 1A is a diagram for showing the shape of a desired resist pattern and FIG. 1B is a plan view of the photomask according to Embodiment 1. It is noted that a transparent substrate is perspectively shown in FIG. 1B.

As shown in FIG. 1A, the desired pattern is a resist pattern 110.

As shown in FIG. 1B, a transparent portion 104 (a bare region of a transparent substrate 100) is provided over a sufficiently large area on the transparent substrate 100. Also, a mask pattern composed of a light-shielding portion 101 and a semi-light-shielding portion 102 is provided on the transparent substrate 100 in a position corresponding to the resist pattern (desired pattern) 110 to be formed on a wafer through exposure. In this embodiment, the semi-light-shielding portion 102 is provided in a peripheral portion (in the whole outer region) of the mask pattern, and the light-shielding portion 101 is provided at the center of the mask pattern. In other words, the light-shielding portion 101 is surrounded with the semi-light-shielding portion 102. It is noted that the mask pattern of this embodiment aims to reduce the MEF in formation of a comparatively thick pattern.

The light-shielding portion 101 is a portion that substantially does not transmit light. However, in practical use, the light-shielding portion 101 may have transmittance of approximately 1% against exposing light, and also in this case, it is assumed that the effect attained by the light-shielding portion 101 is substantially the same as that attained by a light-shielding portion with transmittance of 0%. Also, the semi-light-shielding portion 102 is a portion partially transmitting light. In other words, the semi-light-shielding portion 102 is a portion that transmits light more than the light-shielding portion 101 simultaneously present and does not transmit light more than the transparent portion 104 simultaneously present. At this point, there is an identical phase relationship (specifically, a relationship with a phase difference not less than $(-30+360 \times n)$ degrees and not more than $(30+360 \times n)$ degrees (wherein n is an integer)) between light passing through the semi-light-shielding portion 102 and light passing through the transparent portion 104.

Figure 1C:
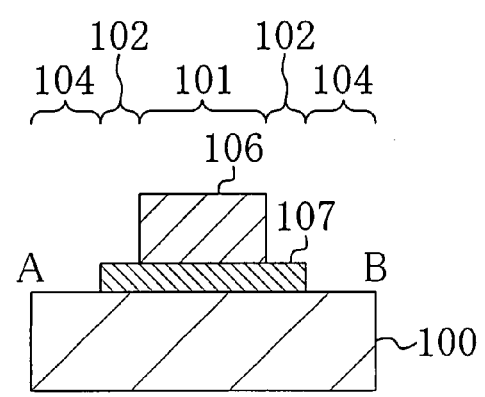

FIG. 1C shows an exemplified cross-sectional structure of the photomask shown in the plan view of FIG. 1B. Specifically, FIG. 1C shows the cross-sectional structure of a portion corresponding to line AB of FIG. 1B. As shown in FIG. 1C, the transparent portion 104 corresponds to a bare region of the transparent substrate 100. The transparent substrate 100 may be, for example, a quartz substrate or the like. The semi-light-shielding portion 102 is formed by depositing a metal thin film 107 of, for example, Mo on the transparent substrate 100 as a semi-light-shielding film. The material for the metal thin film 107 may be, for example, Ta apart from Mo. Specifically, transmittance of approximately 5 through 50% against light of a wavelength of 193 nm can be realized by using a metal thin film 107 with a thickness of approximately 10 through 30 nm. The light-shielding portion 101 is formed by further stacking, for example, a Cr film 106 as a light-shielding film on the metal thin film 107. Specifically, in the case where a Cr film 106 with a thickness of approximately 50 nm is singly deposited on the transparent substrate 100 of, for example, a quartz substrate, a light-shielding portion 101 with transmittance of approximately 1% against the light of the wavelength of 193 nm can be realized, and in the case where a Cr film 106 with a thickness of approximately 100 nm is singly deposited on the transparent substrate 100 of, for example, a quartz substrate, a light-shielding portion 101 with transmittance less than 0.1% against the light of the wavelength of 193 nm can be realized. Accordingly, in the case where the Cr film 106 is deposited on the metal thin film 107 of, for example, Mo as in this embodiment, the light-shielding portion 101 substantially does not transmit the light.

The photomask of this embodiment having the aforementioned structure exhibits a good pattern formation characteristic, and more particularly, an MEF reducing effect in forming a pattern on a wafer, which will now be described on the basis of a result of simulation. Before describing the result of the simulation related to this embodiment, the MEF will be simply described based on a simulation result. In the following description, exposure conditions employed in optical calculation in the simulation are an exposure wavelength $\lambda$ of 193 nm and a numerical aperture NA of 0.85 unless otherwise mentioned. Also, as illumination conditions, ⅔ annular illumination having the outer diameter with a degree of interference of 0.8 and the inner diameter with a degree of interference of 0.53 is used.

Figure 2A:
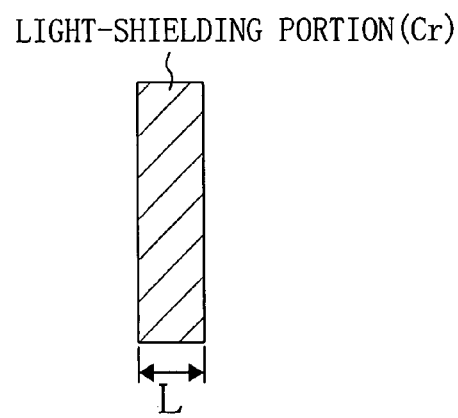
FIG. 2A is a diagram of a mask pattern used for describing MEF.

FIG. 2A shows a mask pattern used for describing the "MEF", and the mask pattern of FIG. 2A is a line-shaped pattern with a width L made of a light-shielding portion of, for example, Cr or the like.

Figure 2B:
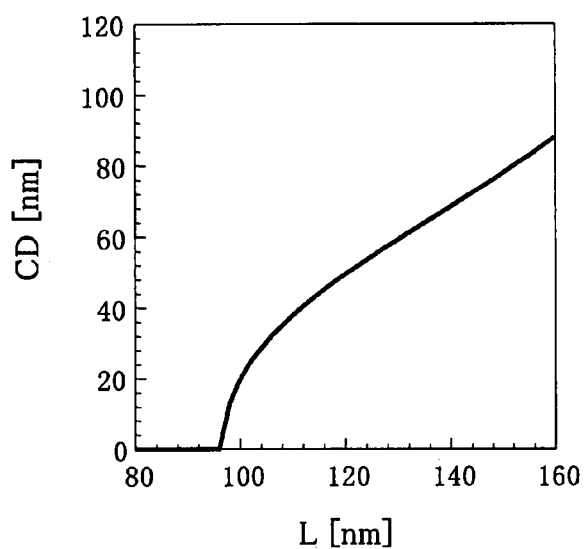
FIG. 2B is a diagram for showing a result of simulation for a dimension of a pattern formed on a wafer through exposure of the mask pattern of FIG. 2A

A graph of FIG. 2B shows a result of the simulation for a dimension of a pattern formed on a wafer through exposure of the mask of FIG. 2A, and specifically, change of a dimension (a CD value) of a pattern formed on a wafer caused by changing the width L of the mask pattern (hereinafter referred to as the mask width L) is plotted. As shown in FIG. 2B, as the mask width L is smaller, the CD value is abruptly reduced, and when the mask width L is smaller than 100 nm, the pattern cannot be formed. In order to make this phenomenon easily understood, the "MEF" is defined in accordance with the following Formula (1):

$$MEF=\Delta CD/\Delta L \quad \text{Formula (1)}$$

As shown in Formula (1), the MEF (mask error factor) corresponds to a ratio of change of a CD value against change of a mask width L.

Figure 2C:
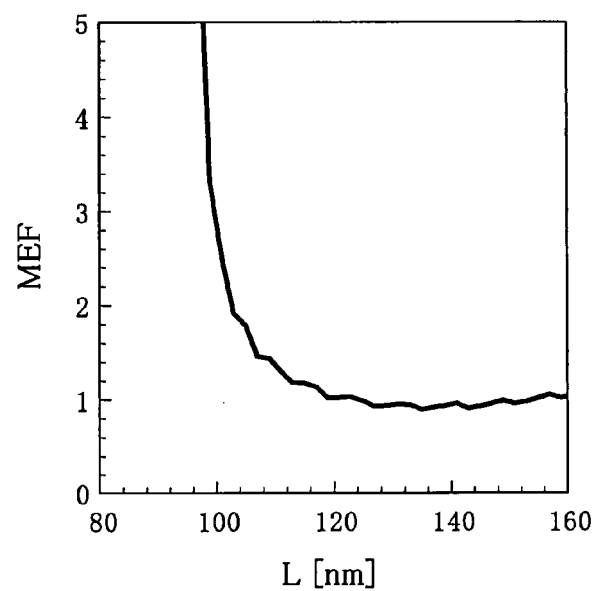
FIG. 2C is a diagram for showing a result of simulation for the MEF obtained through the exposure of the mask pattern of FIG. 2A.

A graph shown in FIG. 2C is obtained by plotting MEFs calculated in accordance with Formula (1) against respective mask widths L. It is understood from FIG. 2C that the phenomenon that the CD value is abruptly reduced as the mask width L is smaller occurs owing to increase of the MEF.

As the MEF is increased, an error in the mask width is enhanced, and the CD value becomes different from a desired CD value, and hence, it is difficult to precisely control the CD value. In an extreme case, a fine line patter desired to be formed cannot be formed. Accordingly, it is understood that the MEF has preferably a small value for precisely controlling the CD value. As shown in FIG. 2C, in the case where a light-shielding portion is simply used as a mask pattern, in formation of a comparatively thick pattern, the MEF is approximately 1 and is so large that a desired resolution limit cannot be realized.

Figure 3:
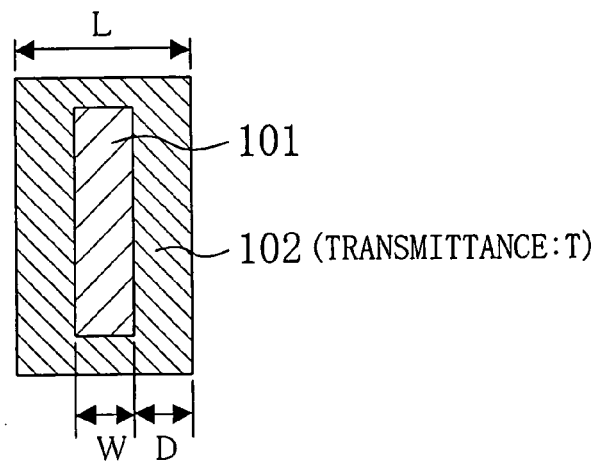
FIG. 3 is a diagram of a mask pattern used in simulation for a mask pattern of Embodiment 1 of the invention.

Next, the result of the simulation for the mask pattern of this embodiment will be described. FIG. 3 shows a mask pattern used in the simulation, and the mask pattern is a line-shaped pattern with a width L and is composed of a light-shielding portion 101 with a width W and a semi-light-shielding portion 102 surrounding the light-shielding portion 101. Also, each of portions of the semi-light-shielding portion 102 disposed on both sides (both sides along the width direction) of the light-shielding portion 101 has a width D. In other words, there is a relationship of L=W+2×D with respect to the width L of the mask pattern. At this point, the MEF is defined in accordance with the following Formulas (2) and (3) as influence on the pattern dimension (CD) of the widths W and D: Influence on the CD of change of the width W of the light-shielding portion 101 (a change ratio of the CD value against the width W):

$$\rightarrow MEF(W)=\Delta CD(W,D)/\Delta W \quad \text{Formula (2)}$$

Influence on the CD of change of the width D of the semi-light-shielding portion 102 (a change ratio of the CD value against the width D):

$$\rightarrow MEF(D)=\Delta CD(W,D)/\Delta D \quad \text{Formula (3)}$$

Figure 4:
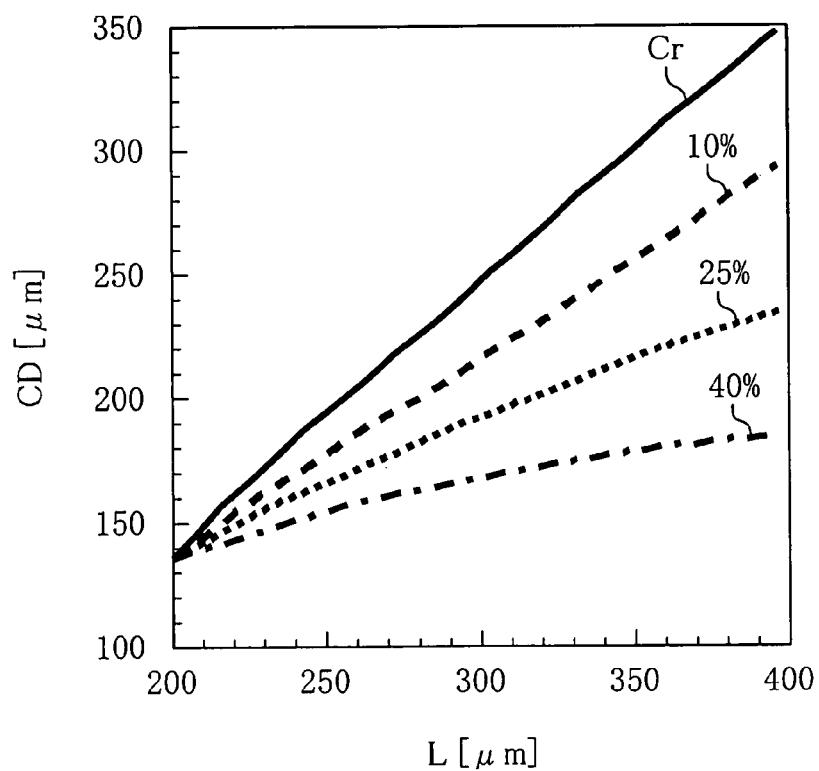
FIG. 4 is a diagram of CD values attained by a mask structure of Embodiment 1 of the invention obtained as a result of simulation.

A graph of FIG. 4 shows a result of simulation for a CD value obtained when the width D is changed from 0 to 200 nm with the width W fixed to 200 nm, namely, when the width L is changed from 200 nm to 400 nm, in the pattern of FIG. 3. FIG. 4 shows CD values attained when the transmittance of the semi-light-shielding portion 102 against exposing light is set to 10%, 25% and 40% in the simulation. FIG. 4 also shows simulated change of a CD value obtained with the width L of a light-shielding pattern made of Cr alone changed from 200 nm to 400 nm as a reference. As shown in FIG. 4, as the transmittance of the semi-light-shielding portion 102 is higher, the dependency of the CD value on the width L, namely, the dependency of the CD value on the width D (the gradient of the graph), is lower. This reveals that the MEF(D) shown in Formula (3) can be reduced when the transmittance of the semi-light-shielding portion 102 is set to be higher, and thus, the MEF not more than 1 can be realized. Specifically, when the transmittance of the semi-light-shielding portion 102 is set to 25%, the MEF (specifically, the MEF(D)) can be reduced to approximately 0.50, which is substantially a half of a normal value (i.e., a value of the MEF obtained when the width of the Cr mask of FIG. 2C is comparatively large). Alternatively, the MEF (specifically, the MEF(D)) obtained when the transmittance of the semi-light-shielding portion 102 is set to 10% is approximately 0.79, and the MEF (specifically, the MEF(D)) obtained when the transmittance of the semi-light-shielding portion 102 is set to 40% is approximately 0.25. In other words, when the transmittance of the semi-light-shielding portion 102 is approximately 10% or less, a sufficient MEF reducing effect can be attained.

It is understood from the result shown in FIG. 4 that the CD value can be controlled with the MEF suppressed to be smaller than 1 by changing the width D of the semi-light-shielding portion 102 in the photomask of this embodiment.

Figure 5:
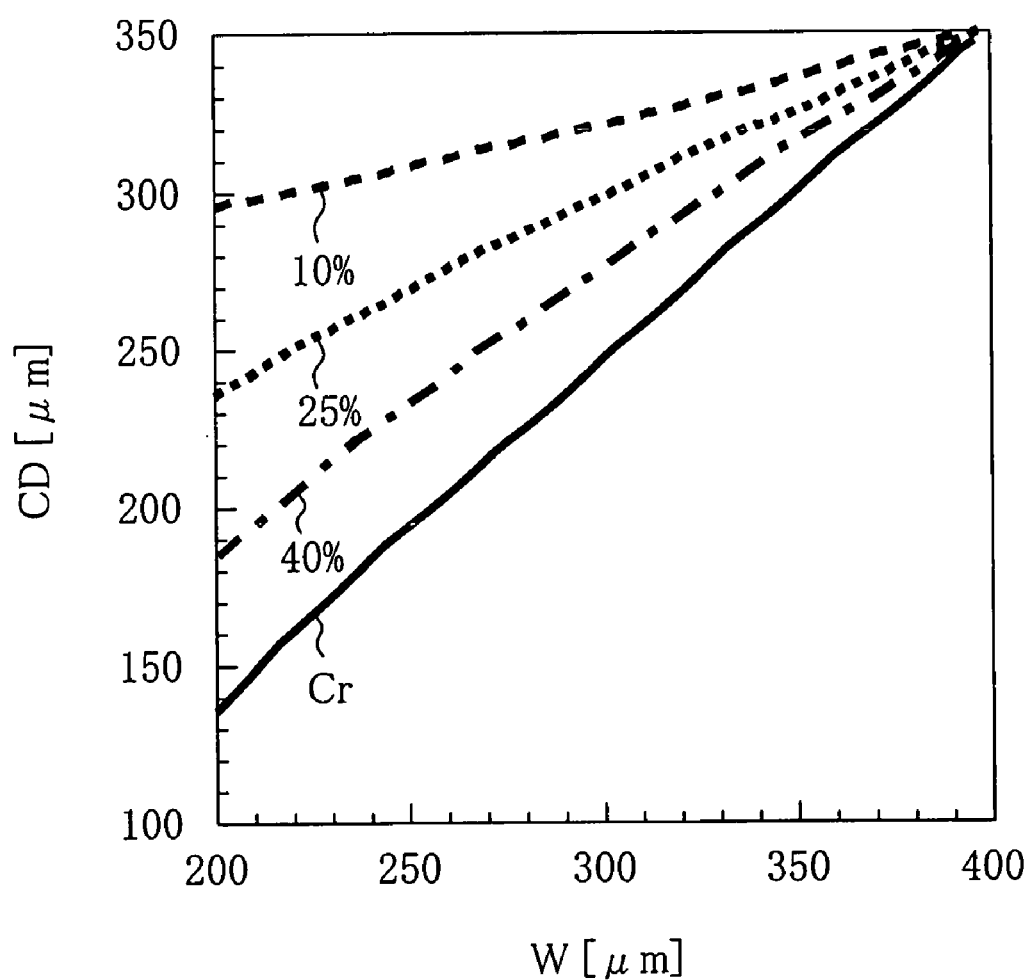
FIG. 5 is a diagram of CD values attained by the mask structure of Embodiment 1 of the invention obtained as a result of simulation.

A graph of FIG. 5 shows a result of simulation for a CD value obtained when the width W is changed from 400 to 200 nm with the width L fixed to 400 nm in the pattern of FIG. 3. At this point, the width W reduced from 400 nm to 200 nm with the width L fixed to 400 nm means that an area occupied by the semi-light-shielding portion 102 is increased from 0 nm to 200 nm. Also FIG. 5 shows CD values obtained when the transmittance of the semi-light-shielding portion 102 against the exposing light is set to 10%, 25% and 40% in the simulation. Furthermore, simulated change of a CD value obtained with a width L of a light-shielding pattern made of Cr alone changed from 400 nm to 200 nm is shown as a reference (whereas the abscissa of FIG. 5 indicates the width W alone). As shown in FIG. 5, as the transmittance of the semi-light-shielding portion 102 is lower, the dependency of the CD value on the width W, namely, the gradient of the graph, is lower. This reveals that the MEF(W) shown in Formula (4) can be reduced when the transmittance of the semi-light-shielding portion 102 is set to be lower, and thus, MEF not more than 1 can be realized. Specifically, when the transmittance of the semi-light-shielding portion 102 is set to 25%, the MEF (specifically, the MEF(W)) can be reduced to approximately 0.57, which is substantially a half of a normal value (i.e., a value of the MEF obtained when the width of the Cr mask of FIG. 2C is comparatively large). Alternatively, the MEF (specifically, the MEF(W)) obtained when the transmittance of the semi-light-shielding portion 102 is set to 10% is approximately 0.28, and the MEF (specifically, the MEF(W)) obtained when the transmittance of the semi-light-shielding portion 102 is set to 40% is approximately 0.82. In other words, when the transmittance of the semi-light-shielding portion 102 is approximately 40% or less, a sufficient MEF reducing effect can be attained.

On the basis of the results shown in FIGS. 4 and 5, according to the photomask of this embodiment obtained by providing a semi-light-shielding portion in an outer region of a conventional mask pattern made of a light-shielding portion alone, the CD value of a pattern to be formed on a wafer can be controlled by changing the dimension of the light-shielding portion and the dimension of the semi-light-shielding portion. At this point, when the transmittance of the semilight-shielding portion is set to 25%, the MEFs, with respect to the dimension of the light-shielding portion and the dimension of the semi-light-shielding portion, of the CD value of the pattern to be formed on a wafer are respectively reduced to substantially a half of normal values (i.e., a value of the MEF obtained when the width of the Cr mask of FIG. 2C is comparatively large). Specifically, the optimum transmittance of the semi-light-shielding portion of the photomask of this embodiment is approximately 25% and is preferably within a range of 10% above and below 25% (namely, not less than 15% and not more than 35%). Furthermore, as shown in FIGS. 4 and 5, a sufficient MEF reducing effect can be attained in a range of the transmittance of approximately 15% above and below 25% (namely, not less than 10% and not more than 40%).

The effect of this embodiment described above will now be described more theoretically. The transmittance of a semi-light-shielding portion against exposing light being 25% means that the energy of light passing through the semi-light-shielding portion is 25% of the energy of light passing through a transparent portion. Furthermore, since the energy of light is in proportion to a square of the amplitude of the light, the energy of the light passing through the semi-light-shielding portion being 25% of the energy of the light passing through the transparent portion means that the amplitude of the light passing through the semi-light-shielding portion is 50% of the amplitude of the light passing through the transparent portion. When the amplitude of the light passing through the semi-light-shielding portion is 50% of the amplitude of the light passing through the transparent portion, the influence of the change of the mask width of the semi-light-shielding portion on an optical image is a half of the influence on the optical image caused by replacing a light-shielding portion having a mask width corresponding to the change with a transparent portion. Accordingly, when an outer region of a light-shielding portion, where there occurs transition from a light-shielded image formed by the light-shielding portion to a transparent image formed by the transparent portion in pattern exposure, is replaced with a semi-light-shielding portion as in this embodiment, the MEF can be halved.

Moreover, it is understood from the aforementioned principle that change in the amplitude of exposing light exceeding 20% can cause a significant difference in the exposure. Therefore, in order to cause a significant difference by using a semi-light-shielding portion as compared with the case where a light-shielding portion is used, in other words, in order to attain a sufficiently advantageous MEF reducing effect by a semi-light-shielding portion as compared with a light-shielding portion, the amplitude of light passing through the semi-light-shielding portion is preferably 20% or more of the amplitude of light passing through the transparent portion. Also, in order to cause a significant difference by using a semi-light-shielding portion as compared with the case where a transparent portion is used, the amplitude of light passing through the semi-light-shielding portion is preferably 80% or less of the amplitude of light passing through the transparent portion. Accordingly, the transmittance of a semi-light-shielding portion against exposing light is preferably 4% or more and 64% or less theoretically.

Furthermore, since a semi-light-shielding portion forms an optical image intermediate between a light-shielded image formed by a light-shielding portion and a transparent image formed by a transparent portion, the width of the semi-light-shielding portion provided in the outer region of the mask pattern of this embodiment is preferably not more than the width of a transition region between a transparent image formed by a transparent portion and a light-shielded image formed by a light-shielding portion (specifically, $\lambda/NA$). However, as described in "Prerequisites" above, it goes without saying that the width of the semi-light-shielding portion is preferably $0.02 \times \lambda/NA$ or more for attaining a significant optical effect.

Although it has been described on the basis of the simulation results shown in FIGS. 4 and 5 that the sufficient MEF reducing effect can be attained when the transmittance of the semi-light-shielding portion against the exposing light is 10% or more and 40% or less, the transmittance of the semi-light-shielding portion is not limited to this range. Specifically, a significant MEF reducing effect can be theoretically attained when the transmittance is 4% or more and 64% or less as described above.

Although the outline of the semi-light-shielding portion 102 provided in the outer region of the mask pattern is analogous to the outline of the light-shielding portion 101 provided at the center of the mask pattern in this embodiment, the effect of this embodiment can be attained merely by providing the semi-light-shielding portion 102 with a width not more than $\lambda/NA$ in the outer region of the mask pattern (namely, around the light-shielding portion 101). Accordingly, the outline of the semi-light-shielding portion 102 and the outline of the light-shielding portion 101 may not be analogous to each other.

Moreover, although the semi-light-shielding portion 102 is provided in the whole outer region of the mask pattern in this embodiment, the semi-light-shielding portion may be provided in a part of the outer region of the mask pattern where the MEF is particularly desired to be reduced instead. A part where the MEF is particularly desired to be reduced is, for example, a part where the MEF is increased due to closeness to another mask pattern. In general, the MEF is remarkably increased when mask patterns are close to each other at a distance for largely causing the diffraction phenomenon (i.e., a distance of $0.4 \times \lambda/NA$).

In a mask pattern for a general LSI, it is necessary to perform optical proximity correction. In performing the optical proximity correction, the mask pattern should be deformed for realizing a desired pattern dimension. At this point, in the case where a semi-light-shielding portion is provided in the whole outer region of the mask pattern as in this embodiment, namely, in the case where a light-shielding portion is wholly surrounded with a semi-light-shielding portion, the optical proximity correction can be performed by merely adjusting the width of the semi-light-shielding portion. Thus, the optical proximity correction can be performed without simultaneously deforming two kinds of patterns having different characteristics, namely, a light-shielding pattern and a semi-light-shielding pattern, and hence, the optical proximity correction can be easily performed. In other words, from the viewpoint of the optical proximity correction, the whole periphery of a light-shielding portion corresponding to the outer region of the mask pattern is preferably surrounded with a semi-light-shielding portion in this embodiment.

Although the light-shielding portion 101 alone is provided at the center of the mask pattern in this embodiment, for attaining the MEF reducing effect, a light-shielding portion should be present within a semi-light-shielding portion provided in the outer region of the mask pattern. Therefore, it goes without saying that, for example, a transparent portion or a semi-light-shielding portion so small that it does not expose a resist may be present at the center of the mask pattern.

Modification 1 of Embodiment 1

A photomask according to Modification 1 of Embodiment 1 of the invention will now be described with reference to the accompanying drawings.

Figure 6A:
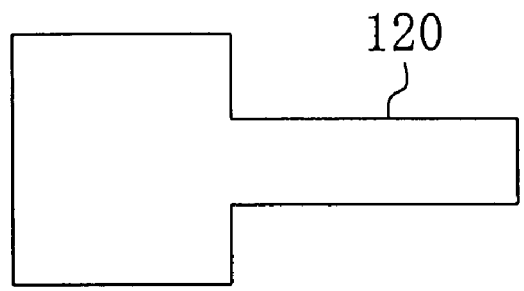
FIG. 6A is a diagram for showing the shape of a desired resist pattern to be formed by using a photomask according to Modification 1 of Embodiment 1 of the invention and FIG. 6B is a plan view of the photomask of Modification 1 of Embodiment 1 of the invention.
Figure 6B:
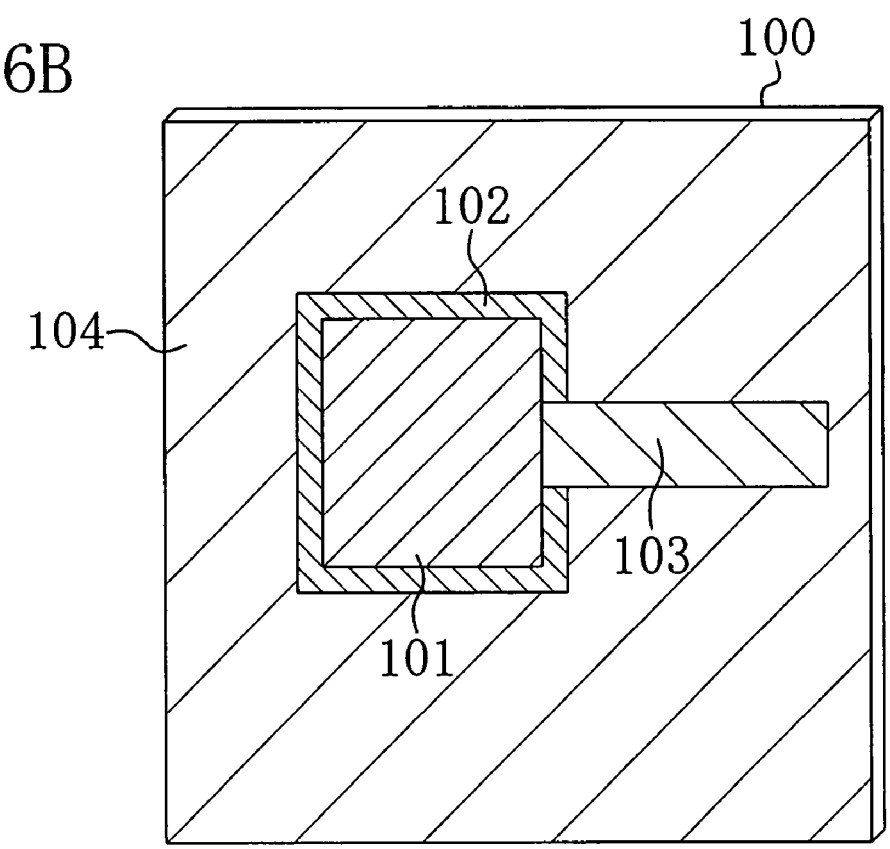

FIG. 6A is a diagram for showing the shape of a desired resist pattern and FIG. 6B is a plan view of the photomask according to Modification 1 of Embodiment 1. It is noted that a transparent substrate is perspectively shown in FIG. 6B.

As shown in FIG. 6A, the desired pattern 120 to be formed on a wafer through exposure is composed of a thin pattern and a thick pattern. Also, as shown in FIG. 6B, a transparent portion 104 is provided in a sufficiently large area on the transparent substrate 100, and a mask pattern composed of a rectangular light-shielding portion 101 and a rectangular phase shifter portion 103 is provided on the transparent substrate 100 in a position corresponding to the desired pattern 120. At this point, the phase shifter portion 103 with high transmittance against exposing light is used for forming the thin pattern (having a width, for example, smaller than the exposing wavelength), and the light-shielding portion 101 is used for forming the thick pattern (having a width, for example, sufficiently larger than the exposing wavelength). Alternatively, a phase shifter portion with low transmittance against the exposing light may be used for forming the thick pattern instead of the light-shielding portion 101.

As a characteristic of this modification, a semi-light-shielding portion 102 is provided in the periphery (in the outer region) of the light-shielding portion 101 alone in the mask pattern. In other words, no semi-light-shielding portion 102 is provided in the periphery (in the outer region) of the phase shifter portion 103 (excluding a part thereof connected to the light-shielding portion 101).

According to this modification, the MEF can be reduced in forming a thick pattern by using the light-shielding portion 101.

Modification 2 of Embodiment 1

A photomask according to Modification 2 of Embodiment 1 of the invention will now be described with reference to the accompanying drawings.

Figure 7A:
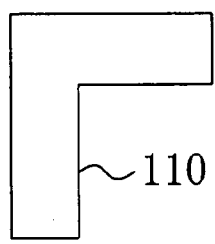
FIG. 7A is a diagram for showing the shape of a desired resist pattern to be formed by using a photomask according to Modification 2 of Embodiment 1 of the invention.
Figure 7B:
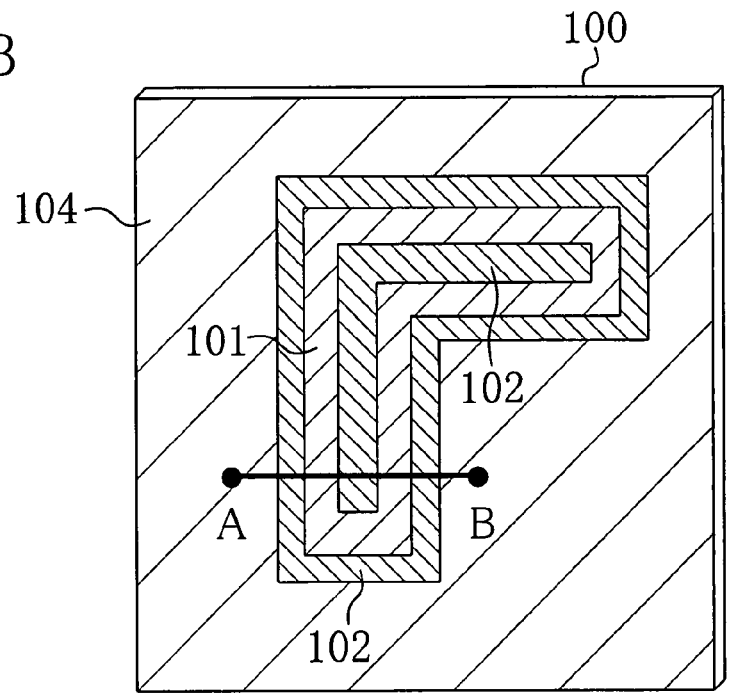
FIG. 7B is a plan view of the photomask of Modification 2 of Embodiment 1 of the invention and FIG. 7C is a cross-sectional view thereof taken on line AB of FIG. 7B.

FIG. 7A is a diagram for showing the shape of a desired resist pattern and FIG. 7B is a plan view of the photomask according to Modification 2 of Embodiment 1. It is noted that a transparent substrate is perspectively shown in FIG. 7B.

As shown in FIG. 7A, the desired pattern is a resist pattern 110.

As shown in FIG. 7B, a transparent portion 104 is formed over a sufficiently large area on the transparent substrate 100. Also, a mask pattern composed of a light-shielding portion 101 and a semi-light-shielding portion 102 is provided on the transparent substrate 100 in a position corresponding to the resist pattern (the desired pattern) 110 to be formed on a wafer through exposure. Also in this modification, the semi-light-shielding portion 102 is provided in the periphery (the whole outer region) of the mask pattern in the same manner as in Embodiment 1.

This modification is different from Embodiment 1 in a semi-light-shielding portion 102 further provided within the light-shielding portion 101 provided within the semi-light-shielding portion 102 disposed in the outer region of the mask pattern.

According to the aforementioned structure of this modification, the same effect as that of Embodiment 1, namely, the effect to reduce the MEF in forming a comparatively thick pattern, can be attained, and in addition, it is possible to attain an effect to improve a depth of focus (DOF) in forming a plurality of comparatively thick patterns close to one another.

Figure 7C:
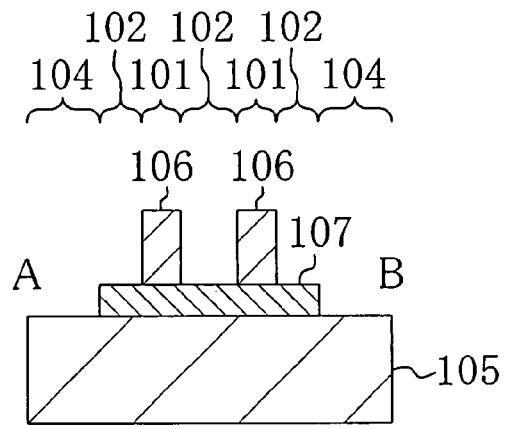

FIG. 7C shows an exemplified cross-sectional structure of the photomask shown in the plan view of FIG. 7B. Specifically, FIG. 7C shows the cross-sectional structure of a portion corresponding to line AB of FIG. 7B. As shown in FIG. 7C, the transparent portion 104 corresponds to a bare region of the transparent substrate of, for example, a quartz substrate 105. At this point, differently from the cross-sectional structure of the photomask of Embodiment 1 shown in FIG. 1C, a center of a Cr film 106 used as the light-shielding portion 101 is removed so as to expose a metal thin film (a semi-light-shielding film) 107 therein in the cross-sectional structure of the photomask of this modification. Thus, the semi-light-shielding portion 102 can be formed within the light-shielding portion 101.

The photomask of this modification having the aforementioned structure exhibits a better pattern formation characteristic than that of Embodiment 1 in forming a pattern on a wafer, which will now be described on the basis of a result of simulation. In this modification, the MEF reducing effect can be attained by providing the semi-light-shielding portion in the outer region around the light-shielding portion in the mask pattern in the same manner as in Embodiment 1, and therefore, the DOF improving effect peculiar to this modification attained by providing the semi-light-shielding portion similar to that provided in the outer region of the mask pattern also within the light-shielding portion will now be described. It is not always necessary to use the same material for forming the semi-light-shielding portion provided in the outer region of the mask pattern and the semi-light-shielding portion provided within the light-shielding portion, but when these semi-light-shielding portions are made of the same material, the cross-sectional structure of the photomask can be simplified. Thus, the MEF reducing effect and the DOF improving effect can be simultaneously realized by a mask having a simple cross-sectional structure.

Figure 8:
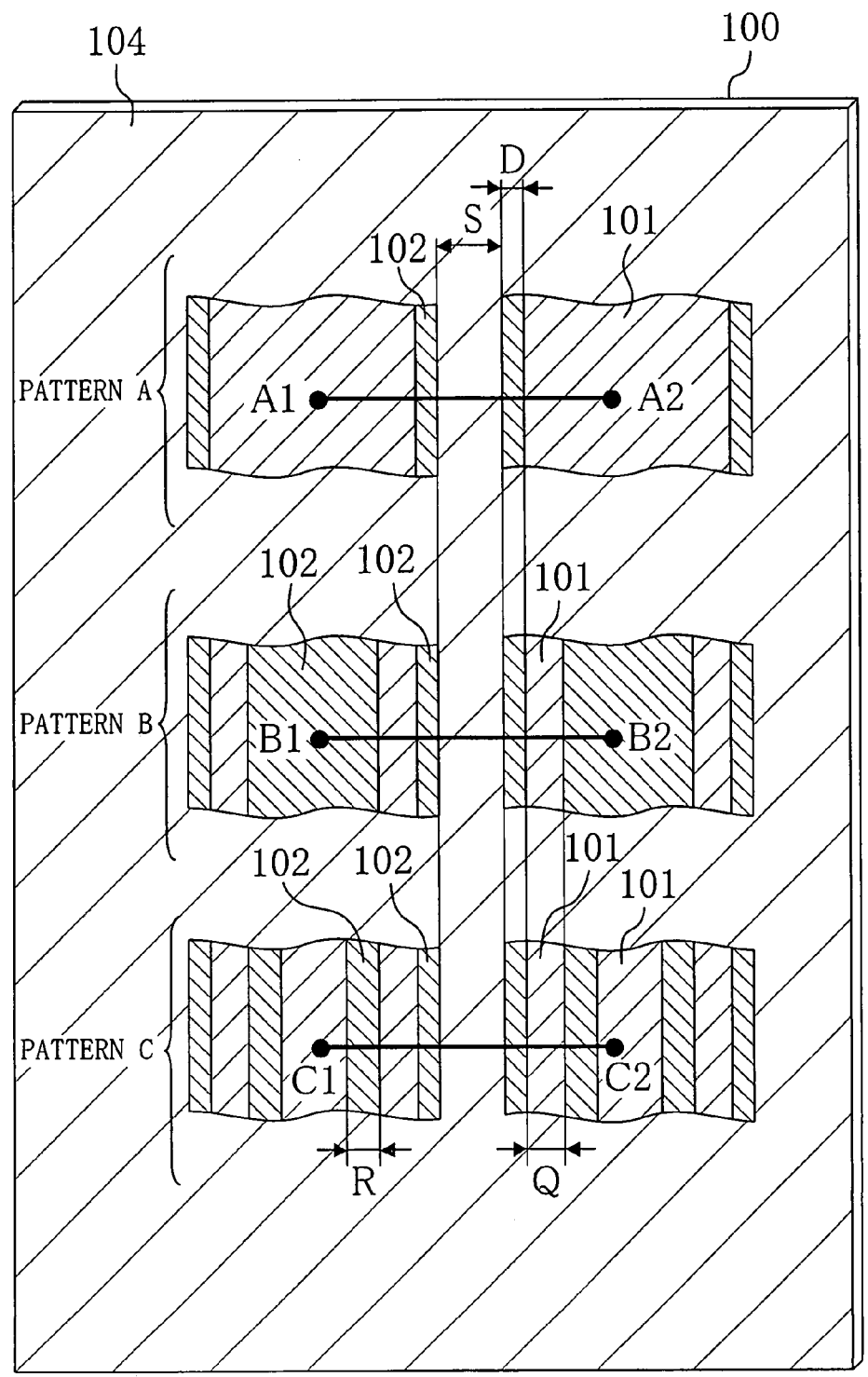
FIG. 8 is a diagram of a mask pattern used in checking an effect of the photomask according to Modification 2 of Embodiment 1 of the invention.

FIG. 8 shows mask patterns used in the simulation. As shown in FIG. 8, mask patterns A, B and C each composed of two line-shaped patterns adjacent to each other at a distance S are formed on a transparent substrate 100. A transparent portion 104 corresponding to a bare region of the transparent substrate 100 is provided in a sufficiently large area on the transparent substrate 100.

Specifically, the mask pattern A includes a line-shaped light-shielding portion 101 and semi-light-shielding portions 102 each with a width D and provided on both sides of the light-shielding portion. Since the mask pattern A basically has the same structure as the mask pattern of Embodiment 1, the width D is preferably not more than $\lambda/NA$ as described in Embodiment 1.

Furthermore, the mask pattern B includes, in addition to the structure of the mask pattern A, a semi-light-shielding portion 102 provided at the center of the line-shaped light-shielding portion 101. In other words, the mask pattern B has a structure in which the light-shielding portion 101 is provided between the semi-light-shielding portions 102 respectively disposed at the center and in the outer region. At this point, in order to attain the DOF improving effect, the light-shielding portion 101 provided between the semi-light-shielding portions respectively disposed at the center and in the outer region of the mask pattern preferably has a width Q not more than $\lambda/NA$ as described below.

Also, the mask pattern C further includes, in addition to the structure of the mask pattern B, a light-shielding portion 101 provided at the center of the semi-light-shielding portion 102 disposed within the light-shielding portion 101. Also in the mask pattern C, in order to attain the DOF improving effect, the semi-light-shielding portion 102 provided in the outer region and the semi-light-shielding portion 102 (with a width R) provided within the light-shielding portion 101 are preferably disposed with the light-shielding portion 101 having the width Q not more than $\lambda$/NA sandwiched therebetween.

Figure 9A:
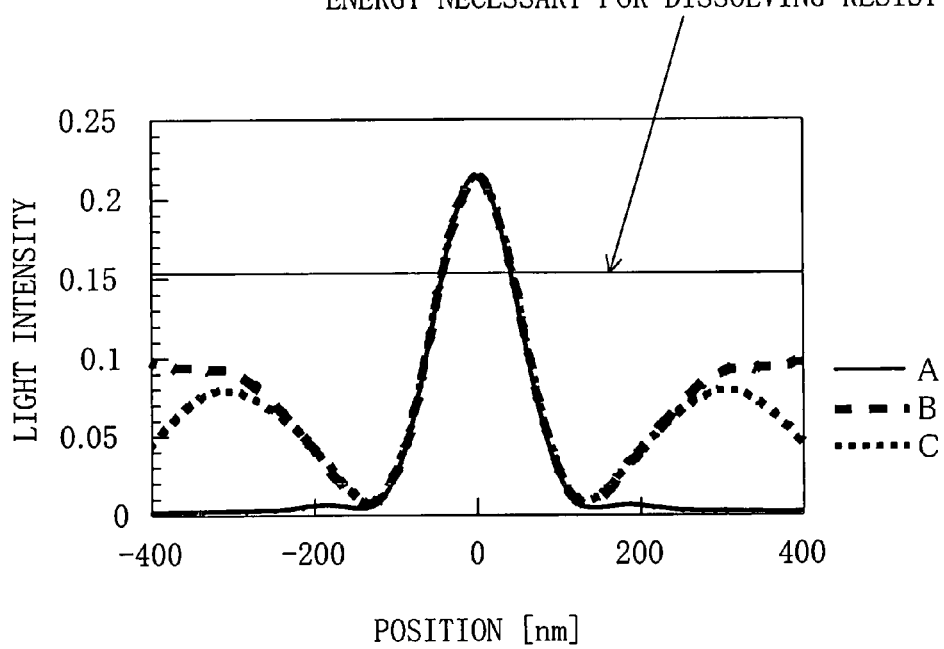
FIG. 9A is a diagram of a result of simulation for a light intensity distribution obtained by a mask pattern of FIG. 8.
Figure 9B:
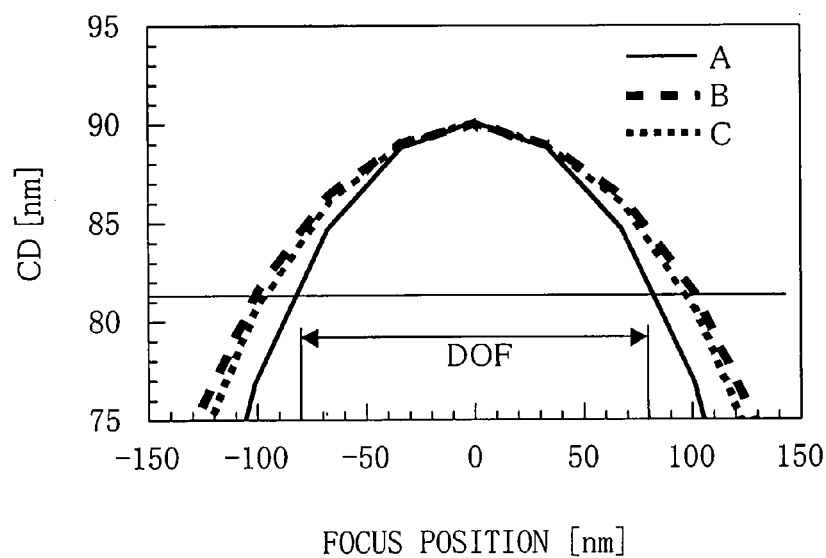
FIG. 9B is a diagram of a result of simulation for a focus characteristic obtained by the mask pattern of FIG. 8.

FIGS. 9A and 9B are diagrams for showing results of various simulation performed on the assumption that S=50 nm, D=30 nm, Q=150 nm and R=230 nm in the mask patterns A through C shown in FIG. 8. In this case, the transmittance of the semi-light-shielding portion against exposing light is set to 10% in the simulation.

FIG. 9A shows a result of simulation for light intensity distributions obtained in image formation positions corresponding to line A1-A2, B1-B2 and C1-C2 of the mask patterns A, B and C. FIG. 9A shows light intensity distribution curves respectively simulated on the mask patterns A through C. FIG. 9A also shows energy values necessary for dissolving a resist in development. It is noted that a position 0 on the abscissa corresponds to the center of a pair of line-shaped patterns included in each of the mask patterns A through C, and the light intensity indicated by the ordinate is relative light intensity obtained by assuming the intensity of exposing light as 1. As shown in FIG. 9A, resists in the same dimension can be dissolved by using any of the mask patterns A through C. In other words, space patterns in the same dimension can be formed on a wafer by using any of the mask patterns A through C.

FIG. 9B shows a result of simulation for a focus characteristic obtained when space patterns are formed on a wafer by using the mask patterns A through C shown in FIG. 8. In general, a pattern dimension (CD) is desired to be unchanged even when the focus is changed during exposure in pattern formation. Therefore, for example, in the case where a pattern dimension is 90 nm with best focus, assuming that an allowable range of pattern dimension variation (dimensional accuracy) is ±10%, the maximum width of focus variation for realizing a pattern dimension within a range of 90 nm±9 nm is defined as a depth of focus (DOF). As the DOF has a larger value, the pattern dimension variation derived from focus variation is smaller, and hence, pattern formation can be performed with higher dimension accuracy. FIG. 9B shows the range of the DOF defined as above obtained by using the mask pattern A, and the DOF obtained by using the mask patterns B and C is improved as compared with that obtained by the mask pattern A as shown in FIG. 9B. This is for the following reason: Since the semi-light-shielding portion is provided also within the light-shielding portion in the mask pattern structure of Embodiment 1, the DOF characteristic is improved owing to the diffraction phenomenon of light passing through this semi-light-shielding portion (the semi-light-shielding portion provided within the mask pattern).

As described so far, in the structure where a semi-light-shielding portion is provided in the outer region of a mask pattern having a light-shielding portion, when a semi-light-shielding portion is additionally provided within the light-shielding portion as in this modification, not only the MEF reducing effect the same as that attained in Embodiment 1 but also the DOF improving effect can be attained.

In order to attain a sufficient DOF improving effect in this modification, diffracted waves of light passing through the semi-light-shielding portion provided within the light-shielding portion and diffracted waves of light passing through the transparent portion disposed outside the mask pattern need to affect each other, and therefore, the dimension (the width) of the light-shielding portion disposed between the semi-light-shielding portion provided in the outer region of the mask pattern and the semi-light-shielding portion provided the inside region is preferably not more than $\lambda$/NA.

Furthermore, in this case, when the transmittance of the semi-light-shielding portion against the exposing light is approximately 20%, a resist is highly probably exposed to the light passing through the semi-light-shielding portion, and therefore, in order to prevent the resist from being exposed, the transmittance of the semi-light-shielding portion against the exposing light is preferably 15% or less in consideration of a margin. Thus, even when the dimension of the semi-light-shielding portion provided within the light-shielding portion is sufficiently larger than $\lambda$/NA, the resist is never exposed to the light passing through this semi-light-shielding portion. Accordingly, since there is no need to consider the upper limit of the mask dimension for avoiding the resist from being exposed with respect to each mask pattern, the freedom in the mask layout is increased, and hence, the mask layout can be easily determined. In an extreme case, a semi-light-shielding portion may be disposed in the whole region within a mask pattern spaced from the outer region by a given or larger distance. Specifically, the structure of the pattern of FIG. 7B or the pattern B of FIG. 8 may be employed.

Furthermore, the preferable range of the transmittance against the exposing light of the semi-light-shielding portion provided in the outer region of the mask pattern in this modification (the preferable range in consideration of the MEF reducing effect) is the same as that described in Embodiment 1. Also, the preferable range of the width of the semi-light-shielding portion provided in the outer region of the mask pattern (the preferable range in consideration of the MEF reducing effect) is the same as that described in Embodiment 1 (specifically, not more than $\lambda$/NA).

Moreover, also in this modification, the outline of the semi-light-shielding portion 102 provided in the outer region of the mask pattern and the outline of the light-shielding portion 101 provided inside may not be analogous to each other as in Embodiment 1.

Although the semi-light-shielding portion 102 is provided in the whole outer region of the mask pattern in this modification, the semi-light-shielding portion may be provided merely in a part of the outer region of the mask pattern where the MEF is particularly desired to be reduced as in Embodiment 1. However, from the viewpoint of the optical proximity correction, when the semi-light-shielding portion is provided in the whole outer region of the mask pattern, the optical proximity correction can be easily performed by adjusting merely the width of the semi-light-shielding portion.

Embodiment 2

A photomask according to Embodiment 2 of the invention will now be described with reference to the accompanying drawings.

Figure 10A:
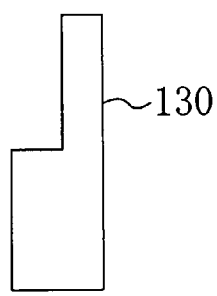
FIG. 10A is a diagram for showing the shape of a desired resist pattern to be formed by using a photomask according to Embodiment 2 of the invention.
Figure 10B:
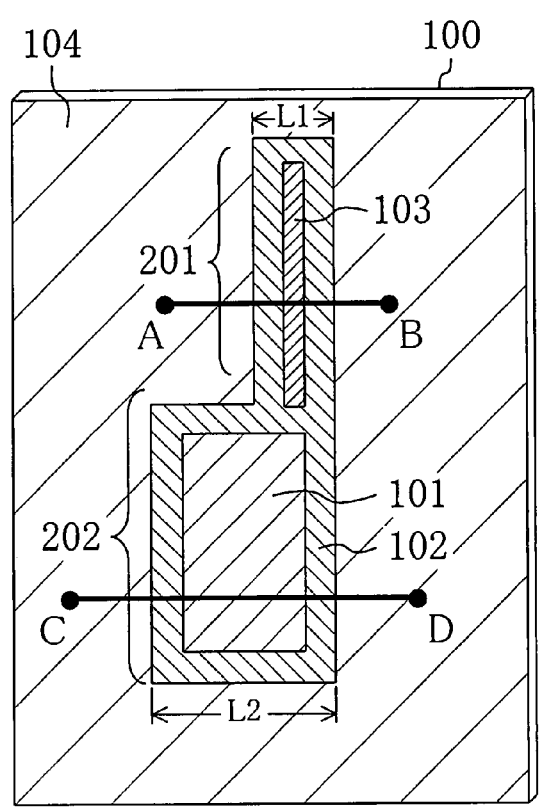
FIG. 10B is a plan view of the photomask according to Embodiment 2 of the invention and FIG. 10C is a cross-sectional view thereof taken on lines AB and CD of FIG. 10B.

FIG. 10A is a diagram for showing the shape of a desired resist pattern, and FIG. 10B is a plan view of the photomask according to Embodiment 2. It is noted that a transparent substrate is perspectively shown in FIG. 10B.

As shown in FIG. 10A, the desired pattern is a resist pattern 130.

As shown in FIG. 10B, a transparent portion 104 is provided over a sufficiently large area on the transparent substrate 100. Also, a mask pattern composed of a light-shielding portion 101, a semi-light-shielding portion 102 and a phase shifter portion 103 is provided on the transparent substrate 100 in a position corresponding to the resist pattern (the desired pattern) 130 to be formed on a wafer through exposure. At this point, the mask pattern of this embodiment includes a first pattern region 201 with a first width L1 and a second pattern region 202 with a second width L2 larger than the first width L1. In the first pattern region 201, the semi-light-shielding portion 102 is provided in an outer region and the phase shifter portion 103 in a rectangular shape is provided at the center. In the second pattern region 202, the semi-light-shielding portion 102 is provided in an outer region and the light-shielding portion 101 in a rectangular shape is provided at the center. The mask pattern of this embodiment aims to reduce the MEF in formation of a pattern with an arbitrary line width in forming a plurality of patterns mixedly including a fine line pattern and a comparatively thick pattern.

The light-shielding portion 101 and the semi-light-shielding portion 102 of this embodiment are respectively defined in the same manner as in Embodiment 1. Furthermore, the phase shifter portion 103 transmits light, and there is an opposite phase relationship (specifically, a relationship with a phase difference not less than (150+360×n) degrees and not more than (210+360×n) degrees (wherein n is an integer)) between light passing through the phase shifter portion 103 and light passing through the transparent portion 104.

Moreover, in this embodiment and all embodiments described below, a phase shifter portion is assumed to have transmittance against exposing light equivalent to that of a transparent portion (a transparent substrate), and the transmittance of the phase shifter portion is not particularly specified. However, in order to utilize the characteristic of the phase shifter portion to transmit light in an opposite phase, the transmittance of the phase shifter portion is preferably larger at least than the transmittance of a semi-light-shielding portion, and the semi-light-shielding portion is preferably made of a material having transmittance equivalent to or substantially not less than a half of the transmittance of the transparent substrate.

Figure 10C:
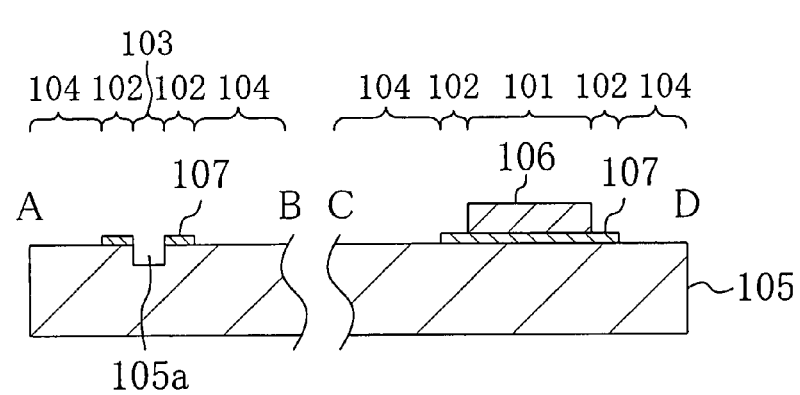

FIG. 10C shows an exemplified cross-sectional structure of the photomask shown in the plan view of FIG. 10B. Specifically, FIG. 10C shows the cross-sectional structures of portions corresponding to lines AB and CD of FIG. 10B. As shown in FIG. 10C, the transparent portion 104 corresponds to a bare region of a quartz substrate 105, that is, the transparent substrate. The semi-light-shielding portion 102 is formed by depositing a metal thin film 107 of, for example, Mo on the quartz substrate 105 as a semi-light-shielding film in the same manner as in Embodiment 1. Also, the light-shielding portion 101 is formed by further stacking, for example, a Cr film 106 as a light-shielding film on the metal thin film (the semi-light-shielding film) 107 in the same manner as in Embodiment 1. Moreover, the phase shifter portion 103 provided inside the semi-light-shielding portion 102 is formed by forming an opening in the metal thin film (the semi-light-shielding film) 107 deposited on the quartz substrate 105 and trenching the quartz substrate 105 within the opening by a depth for inverting the phase of transmitted light. When the phase shifter portion 103 is formed in this manner, a trench portion 105a of the transparent substrate of the quartz substrate 105 can be directly used as the phase shifter portion 103. In other words, the phase shifter portion 103 can be formed by using the same material as the transparent substrate. Furthermore, the mask pattern including three kinds of portions, namely, the semi-light-shielding portion 102, the phase shifter portion 103 and the light-shielding portion 101, can be fabricated by processing the two-layered film including the metal thin film (the semi-light-shielding film) 107 and the Cr film (the light-shielding film) 106 deposited on the quartz substrate 105.

The photomask of this embodiment having the aforementioned structure exhibits a good pattern formation characteristic, and more particularly, the MEF reducing effect in forming a pattern on a wafer, which will now be described on the basis of a result of simulation. In the mask pattern of this embodiment, it is obvious that the MEF reducing effect can be attained by providing the semi-light-shielding portion in the outer region of the mask pattern including the light-shielding portion in the second pattern region 202 shown in FIG. 10B in the same manner as in Embodiment 1, and therefore, the MEF reducing effect attained by the mask pattern structure of the first pattern region 201 shown in FIG. 10B will be herein described. Before describing the result of the simulation for this embodiment, a simulation result for the MEF obtained in using a phase shifter portion in a mask pattern will be simply described.

Figure 11A:
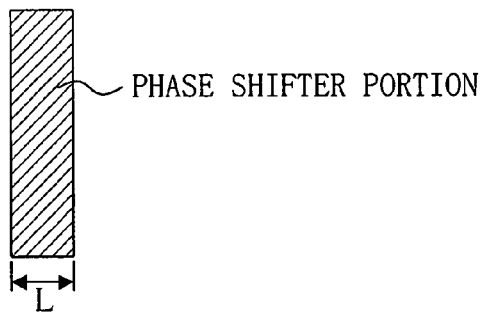
FIG. 11A is a diagram of a mask pattern used for describing the MEF.

FIG. 11A shows a mask pattern used for describing the "MEF", and the mask pattern of FIG. 11A is a line-shaped pattern with a width L made of a phase shifter portion. In this case, the transmittance of the phase shifter portion against exposing light is assumed to be 100%.

Figure 11B:
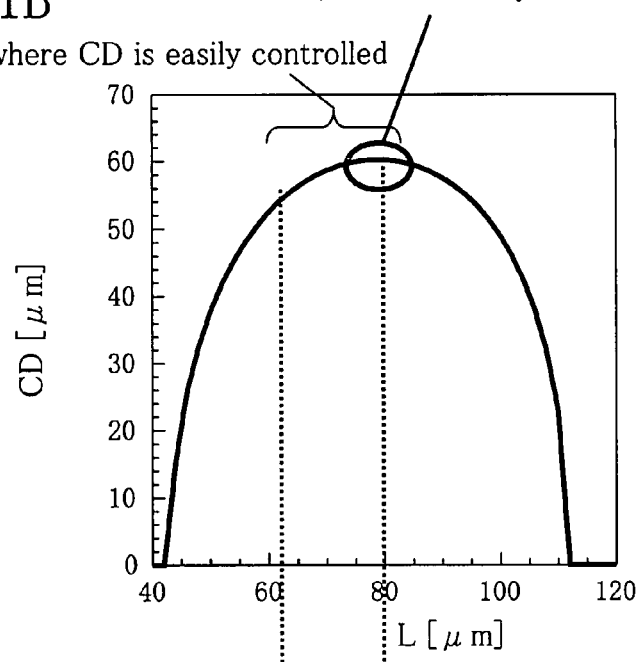
FIG. 11B is a diagram for showing a result of simulation for a dimension of a pattern formed on a wafer through exposure of the mask pattern of FIG. 11A

A graph of FIG. 11B shows a dimension of a pattern formed on a wafer through exposure of the mask of FIG. 11A obtained through the simulation, and specifically, change of the dimension (the CD value) of the pattern formed on a wafer obtained by changing the width L of the mask pattern (hereinafter referred to as the mask width L) is plotted. As shown in FIG. 11B, differently from the case where a light-shielding portion is used in the mask pattern (see FIG. 2B), there are a region where the CD value is increased as the mask width L is increased and a region where the CD value is reduced as the mask width L is increased. As shown in FIG. 11B, in this exemplified simulation, the CD value becomes the maximum at approximately 60 nm when the mask width L is approximately 80 nm, and the CD value is reduced no matter whether the mask width L is increased or reduced from 80 nm.

Figure 11C:
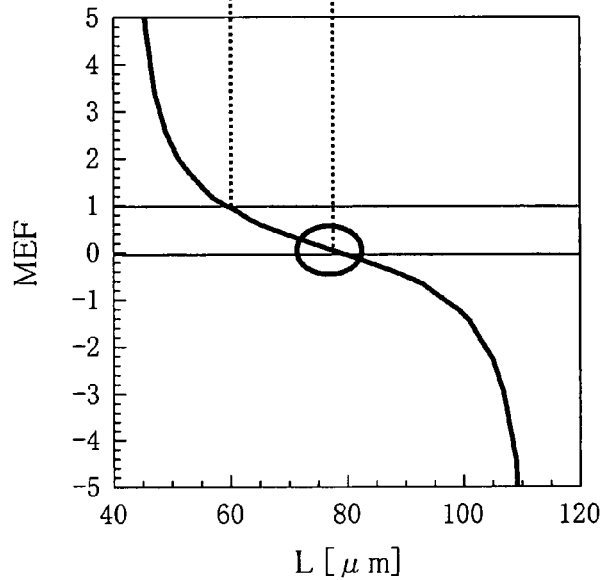
FIG. 11C is a diagram for showing a result of simulation for the MEF obtained through the exposure of the mask pattern of FIG. 11A.

In a graph of FIG. 11C, calculated values of the MEF (calculated in accordance with Formula (1) in the same manner as in Embodiment 1) are plotted against respective mask widths L. As shown in FIG. 11C, MEF≈0 when the mask width L is approximately 80 nm in this exemplified simulation. In other words, when the mask width L is approximately 80 nm, the dimension of a pattern formed on a wafer is not changed even when the mask pattern dimension is changed. This is an ideal state for performing precise pattern formation.

As described above, in the case where a phase shifter portion is used in a mask pattern, the phenomenon that MEF≈0 appears. However, this phenomenon occurs under severely restricted conditions, and the CD is easily controlled when the MEF is not more than 1 and more than 0. This is for the following reason: Although the MEF is preferably smaller than 1, when the MEF has a negative value, the CD value is reduced even when the mask width is increased, which is improper for the CD control. Furthermore, in the exemplified simulation, no matter which value the mask width L is set to, a CD value larger than 60 nm cannot be realized. In other words, an arbitrary CD value cannot be realized depending upon the adjustment of the mask width L. In this exemplified simulation, the range of the MEF not more than 1 and more than 0 corresponds to a range of the mask width L of 63 nm through 80 nm, and a CD value realized by the mask width L in this range is limited to a range from 55 nm to 60 nm.

Figure 12A:
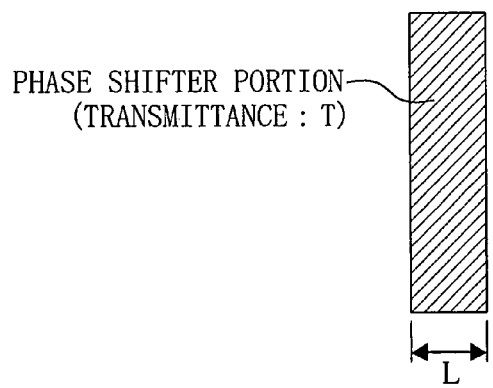
FIG. 12A is a diagram of a mask pattern used for describing the MEF and FIG. 12B is a diagram for showing a result of simulation for a dimension of a pattern formed on a wafer through exposure of the mask pattern of FIG. 12A.
Figure 12B:
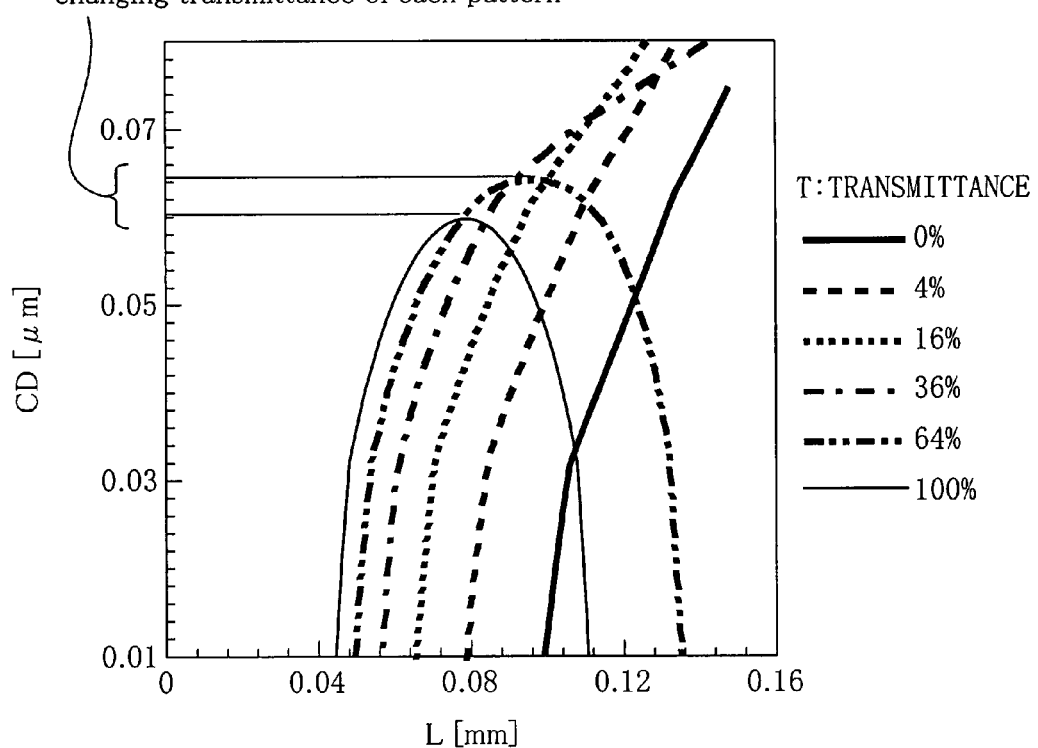

The above description is made on the assumption that the transmittance of the phase shifter portion against the exposing light is 100%, and now, a case where the transmittance against the exposing light of the phase shifter portion is not 100% will be described. FIG. 12A shows a mask pattern used for describing the "MEF", and the mask pattern of FIG. 12A is a line-shaped pattern with a width L made of a phase shifter portion. At this point, the phase shifter portion is assumed to have transmittance T against the exposing light. A graph of FIG. 12B shows a result of simulation for a dimension of a pattern formed on a wafer through exposure of the mask of FIG. 12A, and specifically, change of the dimension (the CD value) of a pattern formed on a wafer caused by changing the width L of the mask pattern (hereinafter referred to as the mask width L) is plotted with respect to phase shifter portions having various transmittances T. It is noted that a portion having transmittance T of 0% means a light-shielding portion. As shown in FIG. 12B, when the transmittance T is 36% or less, it is impossible to attain MEF≈0 (i.e., to attain the maximum value of the CD value) in this exemplified simulation. In other words, the MEF reducing effect is attained with a severely restricted CD value alone even when phase shifter portions having different transmittances are mixedly included in the mask pattern. Actually, according to the experience of the present inventor, the MEF can be reduced merely with a CD value not more than 0.3×λ/NA.

Figure 13A:
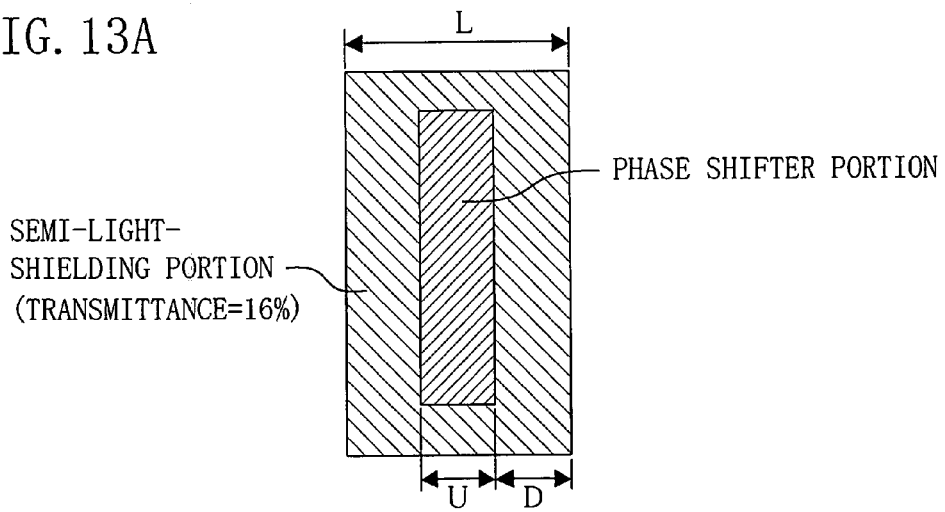
FIG. 13A is a diagram of a mask pattern used in simulation for the mask pattern of Embodiment 2 of the invention and FIG. 13B is a diagram for showing a result of simulation for influence on a CD value and the MEF of a mask structure of the mask pattern of Embodiment 2 of the invention.

Next, the result of the simulation for the first pattern region 201 (see FIG. 10B) of the mask pattern of this embodiment will be described. FIG. 13A shows a mask pattern used in the simulation, and the mask pattern is a line-shaped pattern with a width L and is composed of a phase shifter portion with a width U and a semi-light-shielding portion surrounding the phase shifter portion. Also, each of portions of the semi-light-shielding portion disposed on both sides (both sides along the width direction) of the phase shifter portion has a width D. In other words, there is a relationship of L=U+2×D with respect to the width L of the mask pattern. In this case, the transmittance of the phase shifter portion against exposing light is 100%, and the transmittance of the semi-light-shielding portion against the exposing light is 16%.

Figure 13B:
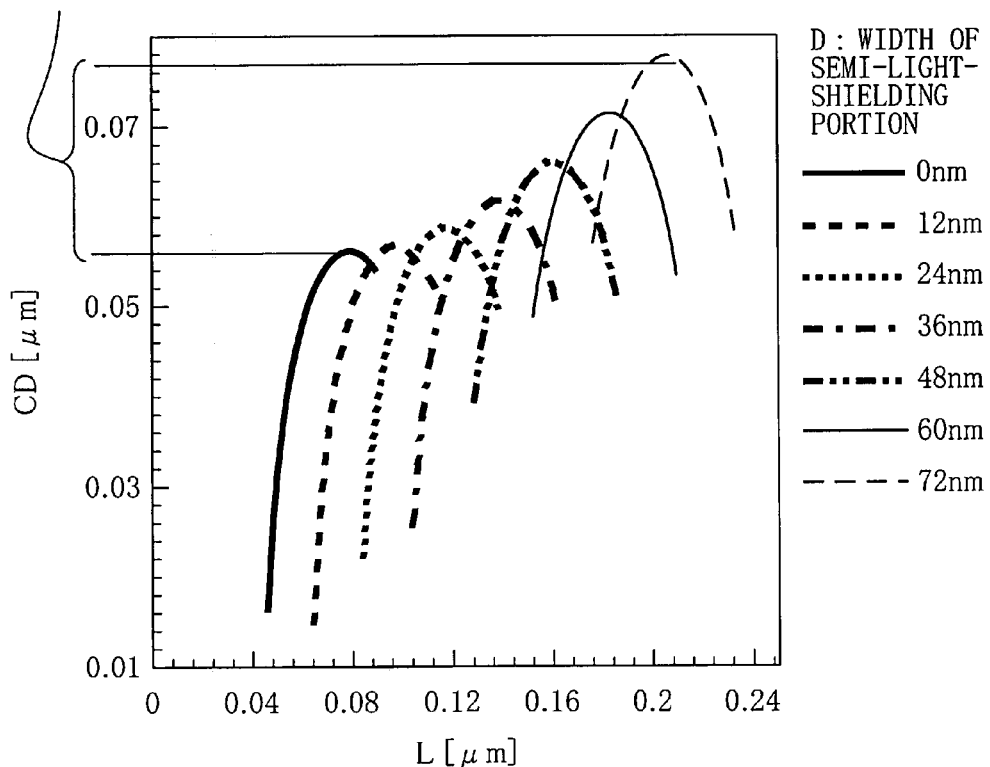

A graph of FIG. 13B shows a result of simulation for dimensions (CD values) of a pattern formed on a wafer through exposure of the mask pattern of FIG. 13A with the mask width L variously changed. In this case, the mask width L is changed by changing the width U of the phase shifter portion with the width D of the semi-light-shielding portion fixed to various values from 0 nm to 72 nm, and the dependency of the CD value on the width change is shown in FIG. 13B. As shown in FIG. 13B, as the width U of the semi-light-shielding portion is increased, the phenomenon of MEF=0 (i.e., the phenomenon that the CD value is the maximum) appears with a larger CD value. In other words, in the case where the mask pattern having the structure of this embodiment is employed, MEF≈0 can be realized with respect to a CD value in a comparatively large range by changing the width of the semi-light-shielding portion in accordance with a target CD value. Actually, according to the examination made by the present inventor, MEF≈0 can be realized with respect to a CD value not less than 100 nm (0.1 μm), and the MEF can be reduced even with a CD value not less than 0.4×λ/NA.

In order to describe, in more detail, the characteristic of the first pattern region 201 (see FIG. 10B) of the mask pattern of this embodiment described above, the MEF is defined in accordance with the following Formulas (4) and (5) in the same manner as in Embodiment 1:

Influence on the CD of change of the width U of the phase shifter portion (a change ratio of the CD value against the width U):

$$\rightarrow MEF(U)=\Delta CD(U,D)/\Delta W \qquad \text{Formula (4)}$$

Influence on the CD of change of the width D of the semi-light-shielding portion (a change ratio of the CD value against the width D):

$$\rightarrow MEF(D)=\Delta CD(U,D)/\Delta D \qquad \text{Formula (5)}$$

It is noted that MEF≈0 mentioned in the graph of FIG. 13B accurately means MEF(U)≈0.

Figure 14A:
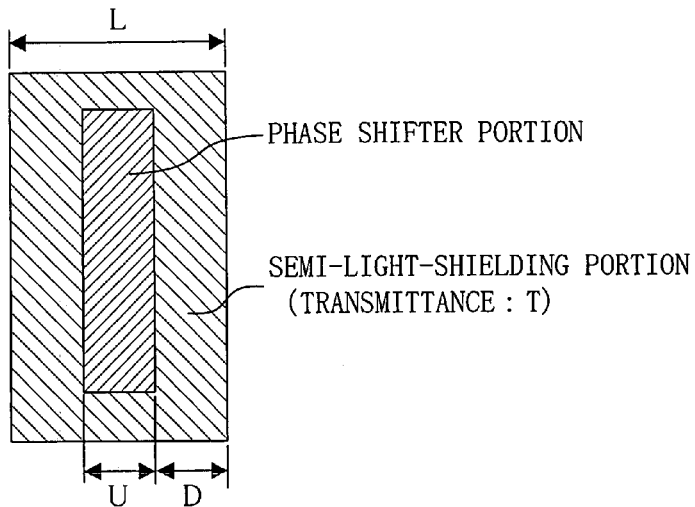
FIG. 14A is a diagram of a mask pattern used in simulation for the mask pattern of Embodiment 2 of the invention and FIG. 14B is a diagram for showing a result of simulation for influence on the MEF of transmittance of a semi-light-shielding portion of the mask pattern of Embodiment 2 of the invention.

FIG. 14A shows a mask pattern used in simulation for the first pattern region 201 (see FIG. 10B) of the mask pattern of this embodiment, and the mask pattern is a line-shaped pattern with a width L and is composed of a phase shifter portion with a width U and a semi-light-shielding portion surrounding the phase shifter portion. Also, each of portions of the semi-light-shielding portion disposed on both sides (both sides along the width direction) of the phase shifter portion has a width D. In other words, there is a relationship of L=U+2×D with respect to the width L of the mask pattern. In this case, the transmittance of the phase shifter portion against exposing light is 100% and the transmittance of the semi-light-shielding portion against the exposing light is T %.

Figure 14B:
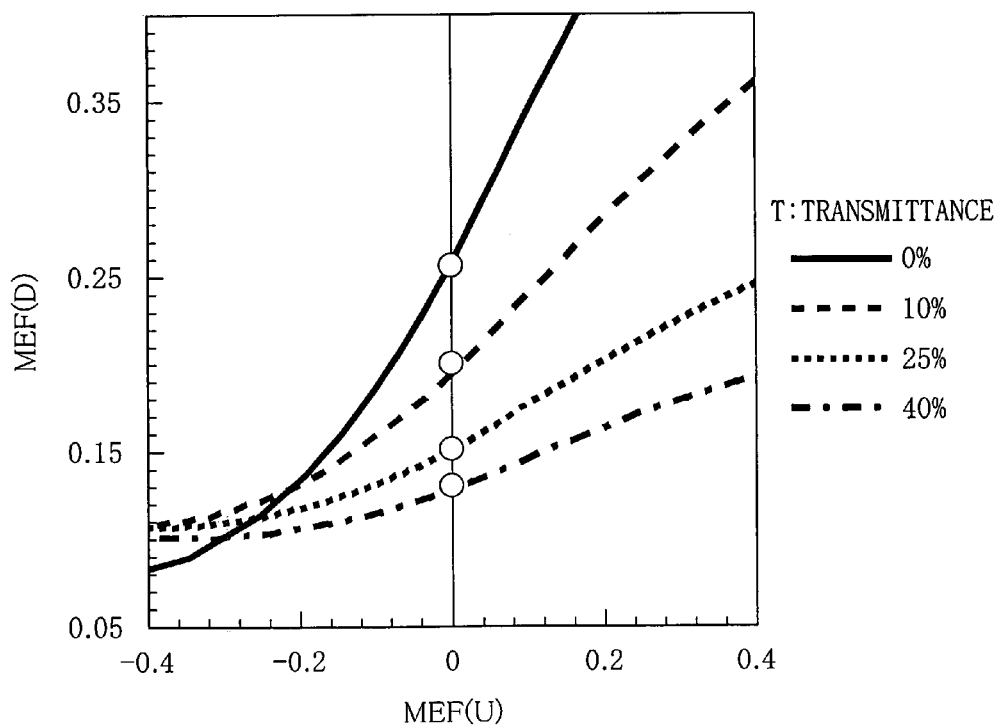

A graph of FIG. 14B shows plotted correlation between the MEF(U) and the MEF(D) obtained by calculating the MEF (U) and the MEF(D) with respect to various combinations of the widths U and D for attaining a CD value of 65 nm in the pattern of FIG. 14A. In FIG. 14B, the correlations obtained when the transmittance T of the semi-light-shielding portion against the exposing light is 0%, 10%, 25% and 40% are respectively plotted. Also, a portion with the transmittance T of 0% means a light-shielding portion. As shown in FIG. 14B, although MEF(D) is not 0 when MEF(U) is 0, as the transmittance T of the semi-light-shielding portion against the exposing light is increased, the value of the MEF(D) obtained when MEF(U)=0 is smaller.

As described so far, since the semi-light-shielding portion 102 is provided in the outer region of the mask pattern including the phase shifter portion 103 (more accurately, the first pattern region 201 shown in FIG. 10B) in this embodiment, the CD value of a pattern to be formed on a wafer can be controlled by changing the dimensions of the phase shifter portion 103 and the semi-light-shielding portion 102. Moreover, the MEF can be largely reduced by appropriately selecting the width of the semi-light-shielding portion and the width of the phase shifter portion in accordance with a target CD value. Specifically, as shown in FIG. 14B, in the case where the transmittance T of the semi-light-shielding portion 102 against the exposing light is set to 25%, MEF(U)≈0 with respect to the width U of the phase shifter portion 103 and MEF(D)≈0.15 with respect to the width D of the semi-light-shielding portion 102.

The aforementioned effect of this embodiment will now be more theoretically described. An optical image formed by using a phase shifter portion and a semi-light-shielding portion as a mask pattern is formed owing to interference between light diffracting outside the mask pattern and light passing through the mask pattern. In other words, a state where the light diffracting outside the mask pattern and the light passing through the mask pattern cancel each other the most when these lights are respectively projected in a position on a wafer corresponding to the center of the mask pattern is a state where the maximum contrast is attained. Accordingly, the contrast of a projected image (the optical image) is lowered, namely, the dimension (the CD value) of a pattern to be formed on a wafer is reduced, no matter whether the width of the phase shifter portion for realizing this state is larger or smaller. Therefore, in this state where the maximum contrast is attained, MEF≈0 (more accurately, MEF(U)≈0) with respect to the mask dimension of the phase shifter portion.

Accordingly, assuming that MEF≈0 is realized with respect to a target CD value CD1 when the phase shifter portion has a width U1 and the semi-light-shielding portion outside the phase shifter portion has a width D1 and that MEF≈0 is realized with respect to a target CD value CD2 (whereas CD2>CD1) when the phase shifter portion has a width U2 and the semi-light-shielding portion outside the phase shifter portion has a width D2, relationships of U2<U1 and D1<D2 hold. In other words, for realizing a larger CD value, a phase shifter portion with a smaller width is used.

In order to sufficiently attain the interference effect between the light diffracting outside the mask pattern and the light passing through the mask pattern, a distance between the phase shifter portion and the transparent portion disposed around the mask pattern is preferably $0.4 \times \lambda/NA$ or less. Specifically, the width D is preferably not more than $0.4 \times \lambda/NA$ where the diffraction phenomenon is remarkably attained. In this embodiment, however, since the semi-light-shielding portion disposed between the phase shifter portion and the transparent portion disposed around the mask pattern also partially transmits light, the width D is not limited to the dimension not more than $0.4 \times \lambda/NA$. However, as described in "Prerequisites" above, it goes without saying that the mask width L is preferably not less than $0.02 \times \lambda/NA$ for obtaining a significant optical effect.

As described so far, in the mask pattern of this embodiment, the first pattern region 201 having the first width L1 not more than $\lambda/NA$ includes the phase shifter portion 103 and the semi-light-shielding portion 102, and the second pattern region 202 with the second width L2 larger than $\lambda/NA$ includes the light-shielding portion 101 and the semi-light-shielding portion 102. Therefore, the MEF can be reduced in both the regions.

In the structure of the mask pattern of this embodiment, as the transmittance against the exposing light of the semi-light-shielding portion 102 provided around the phase shifter portion 103 is higher, the MEF reducing effect is increased, and on the other hand, even when the transmittance against the exposing light of the semi-light-shielding portion 102 is comparatively low (for example, 4%, that is, the lower limit), the MEF reducing effect can be sufficiently attained. Accordingly, in the case where the semi-light-shielding portion 102 of the first pattern region 201 and the semi-light-shielding portion 102 of the second pattern region 202 are made of the same material, the optimum transmittance of the semi-light-shielding portion 102 is determined so that the MEF reducing effect for the mask pattern of the second pattern region 202 can be optimized. In other words, also in the photomask of this embodiment, the transmittance against the exposing light of the semi-light-shielding portion is optimally approximately 25% and is preferably in a range of 10% above and below 25% (i.e., a range from 15% to 35%) in the same manner as in the photomask of Embodiment 1. Also, a sufficient MEF reducing effect can be attained in a range of the transmittance of approximately 15% above and below 25% (i.e., a range from 10% to 40%). Moreover, the transmittance of the semi-light-shielding portion is not limited to this range, and theoretically, a significant MEF reducing effect can be attained when it is 4% or more and 64% or less as in Embodiment 1.

Although the light-shielding portion 101 alone is provided at the center of the mask pattern of the second pattern region 202 including the light-shielding portion 101 and the semi-light-shielding portion 102 in this embodiment, for attaining the MEF reducing effect, a light-shielding portion should be present within a semi-light-shielding portion provided in the outer region of the mask pattern. Therefore, it goes without saying that, for example, a transparent portion or a semi-light-shielding portion so small that it does not expose a resist may be present at the center of the mask pattern.

Moreover, in the same manner as in Modification 2 of Embodiment 1, not only the MEF reducing effect but also the DOF improving effect can be simultaneously attained when a semi-light-shielding portion is provided within the light-shielding portion 101 in addition to the semi-light-shielding portion 102 provided in the outer region (around the light-shielding portion 101) of the mask pattern of the second pattern region 202. In this case, the transmittance against the exposing light of this semi-light-shielding portion is preferably 15% or less. However, in order to attain an effective effect by the semi-light-shielding portion, the transmittance is preferably 4% or more. Thus, even when the dimension of the semi-light-shielding portion provided within the light-shielding portion is sufficiently larger than $\lambda/NA$, a resist is never exposed to light passing through this semi-light-shielding portion. Accordingly, there is no need to consider the upper limit of the mask dimension for avoiding a resist from being exposed with respect to each mask pattern, and hence, the freedom in the mask layout is increased, so that the mask layout can be easily determined.

Figure 15A:
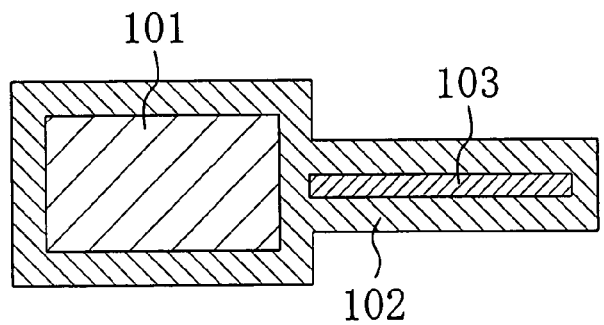
FIGS. 15A, 15B, 15C and 15D are diagrams for showing variations of the plane structure of the mask pattern of Embodiment 2 of the invention.
Figure 15B:
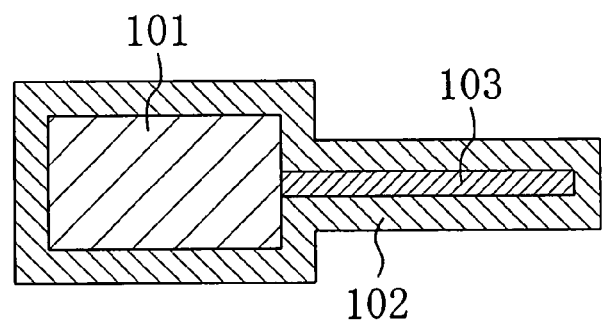
Figure 15C:
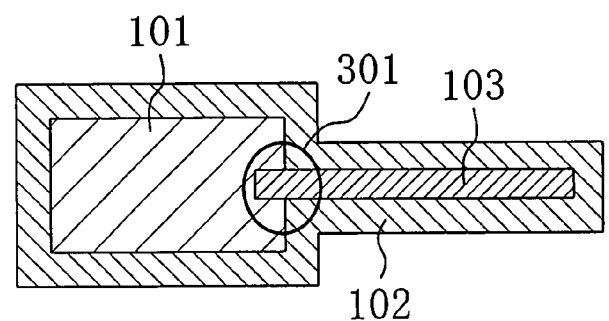
Figure 15D:
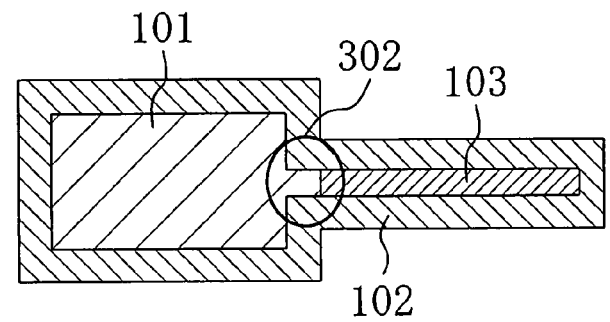

Also, in the structure of the mask pattern of this embodiment, it is assumed that the phase shifter portion 103 and the light-shielding portion 101 are individually surrounded with the semi-light-shielding portion 102, for example, as shown in FIG. 15A. Instead, when a phase shifter portion 103 and a light-shielding portion 101 in contact with each other are together surrounded with a semi-light-shielding portion 102 as shown in FIG. 15B, the same effect as that attained in this embodiment can be attained. Furthermore, in a mask pattern in which a phase shifter portion 103 and a light-shielding portion 101 in contact with each other are together surrounded with a semi-light-shielding portion 102, even when the boundary between the phase shifter portion 103 and the semi-light-shielding portion 101 is moved by, for example, approximately $0.1 \times \lambda/NA$ so that the phase shifter portion intrudes into the light-shielding portion as shown in FIG. 15C, a projected image formed by this mask pattern is minimally affected. Moreover, in a mask pattern in which a phase shifter portion 103 and a light-shielding portion 101 in contact with each other are together surrounded with a semi-light-shielding portion 102, even when the boundary between the phase shifter portion 103 and the semi-light-shielding portion 101 is moved by, for example, approximately $0.1 \times \lambda/NA$ so that a portion to be formed as the phase shifter portion 103 is actually formed as the light-shielding portion 101 as shown in FIG. 15D, a projected image formed by this mask pattern is minimally affected. However, from the viewpoint of a mask test, a fine recessed pattern 301 formed in the light-shielding portion 101 of FIG. 15C and a fine protruding pattern 302 formed in the light-shielding portion 101 of FIG. 15D are not preferred. Also, when a phase shifter portion 103 and a light-shielding portion 101 are in contact with each other, a fine irregular pattern is easily caused in the light-shielding portion 101 derived from alignment shift on the boundary therebetween in processing the phase shifter portion 103 and the light-shielding portion 101. On the other hand, when a part of the semi-light-shielding portion 102 is disposed between the light-shielding portion 101 and the phase shifter portion 103 as shown in FIG. 15A, this part of the semi-light-shielding portion 102 works as a margin region in processing the phase shifter portion 103 and the light-shielding portion 101. In other words, although substantially the same optical images are projected on a wafer by using the mask patterns shown in FIGS. 15A through 15D, from the viewpoint of the mask processing, the mask pattern structure in which the phase shifter portion 103 and the light-shielding portion 101 are individually surrounded with the semi-light-shielding portion 102 as shown in FIG. 15A is preferred.

Although the outline of the semi-light-shielding portion 102 provided in the outer region of the mask pattern is analogous to the outline of the light-shielding portion 101 or the phase shifter portion 103 provided at the center of the mask pattern in this embodiment, the outline of the semi-light-shielding portion 102 may not be analogous to the outline of the light-shielding portion 101 or the phase shifter portion 103 instead.

Although the semi-light-shielding portion 102 is provided in the whole outer region of the mask pattern in this embodiment, the semi-light-shielding portion may be provided in a part of the outer region of the mask pattern where the MEF is particularly desired to be reduced instead. However, in the case where the semi-light-shielding portion 102 is provided in the whole outer region of the mask pattern, namely, in the case where the light-shielding portion 101 and the phase shifter portion 103 are wholly surrounded with the semi-light-shielding portion 102, the optical proximity correction can be easily performed by adjusting the width of the semi-light-shielding portion 102 alone.

Now, the optical proximity correction (OPC) will be simply described. In general, a mask pattern for use in LSI fabrication is subjected to the OPC processing. In general photolithography, there occurs a phenomenon that a pattern dimension (a CD value) or shape obtained on a wafer is varied even in patterns formed by using mask patterns with the same dimension owing to the pattern shape or another pattern present around. This phenomenon is designated as a proximity effect, and processing for compensating the variation in the CD value or the shape caused by the proximity effect through correction of the dimension or the shape of the mask pattern is designated as the OPC processing.

In the case where the mask pattern of this embodiment is subjected to the OPC processing, the mask dimension of the semi-light-shielding portion provided in the outer region of the mask pattern may be corrected, or the mask dimension of the phase shifter portion or the light-shielding portion provided at the center of the mask pattern may be corrected. In a mask pattern including a phase shifter portion, however, the dimension of the phase shifter portion is set for attaining MEF≈0 by utilizing the interference effect caused between diffracted light passing the periphery of the mask pattern and light passing through the phase shifter portion within the mask pattern. Therefore, in order to perform the OPC processing while keeping the state of MEF≈0, the OPC processing is preferably performed without changing the dimension of the phase shifter portion for attaining MEF≈0. In other words, in the mask pattern of this embodiment, the OPC processing is preferably performed by correcting the mask dimension of the semi-light-shielding portion alone.

Figure 16A:
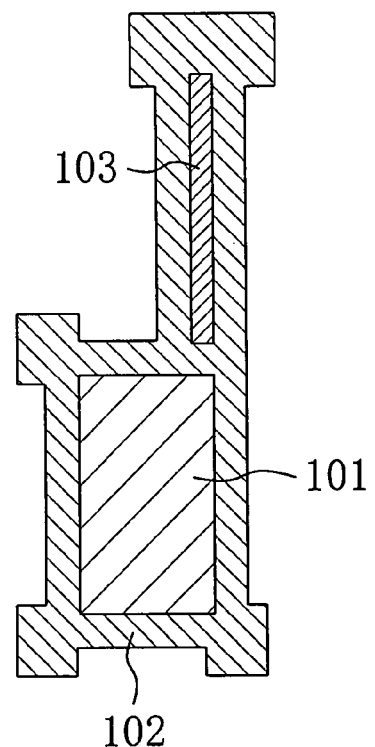
FIG. 16A is a diagram for showing a result of OPC processing performed through correction of a mask dimension of a semi-light-shielding portion in the mask pattern of Embodiment 2 of the invention and FIG. 16B is a diagram of a result of the OPC processing performed through the correction of a mask dimension of a semi-light-shielding portion when a mask pattern structure similar to that of Embodiment 2 of the invention is applied to a gate contact pattern.

FIG. 16A shows a result of the OPC processing performed by correcting the mask dimension of the semi-light-shielding portion 102 in the mask pattern of this embodiment shown in FIG. 10A.

As shown in FIG. 16A, in the outer region of a line pattern (corresponding to the first pattern region 201 of FIG. 10A) including a phase shifter portion 103, a semi-light-shielding portion 102 having an outline substantially analogous to the outline shape of the phase shifter portion 103 is provided, and a semi-light-shielding portion 102 in the shape of a hammer having a width larger than the line width is provided at the end of the line pattern. This semi-light-shielding portion 102 in the shape of a hammer is provided for the following purpose: Since the end of the isolated line pattern (corresponding to the first pattern region 201 of FIG. 10A) is surrounded with a transparent portion, diffracted light rounding from the transparent portion around the end to the back side of the end becomes excessive. Therefore, this semi-light-shielding portion is provided for preventing a part of a transferred pattern (that is, a pattern transferred onto a wafer) corresponding to the end of the line pattern from being formed in a recess position.

Also, as shown in FIG. 16A, in the outer region of a pattern including a light-shielding portion 101 (corresponding to the second pattern region 202 of FIG. 10A), a semi-light-shielding portion 102 having the outline substantially analogous to the outline of the light-shielding portion 101 is provided, and at a right-angled or acute-angled corner, a semi-light-shielding portion 102 working as a serif pattern is provided. The semi-light-shielding portion 102 working as a serif pattern is provided for a similar purpose to the aforementioned semi-light-shielding portion 102 in the shape of a hammer. Specifically, since the corner of the pattern including the light-shielding portion 101 (corresponding to the second pattern region 202 of FIG. 10A) is surrounded with the transparent portion, diffracted light rounding from the transparent portion around the corner to the back side of the corner becomes excessive. Therefore, this semi-light-shielding portion is provided for preventing a part of a transferred pattern (that is, a pattern transferred onto a wafer) corresponding to the corner of the line pattern from being formed in a recess position.

In this manner, when the semi-light-shielding portion 102 of the mask pattern of this embodiment is provided with the pattern in the shape of a hammer disposed at the end of the line and the serif pattern disposed at the corner, the OPC processing can be performed without deforming the phase shifter portion 103 and the light-shielding portion 101. It is noted that the OPC processing can be performed by correcting the width of the semi-light-shielding portion 102 provided in the outer region of the mask pattern of this embodiment in consideration of a close relationship with an adjacent pattern.

Figure 16B:
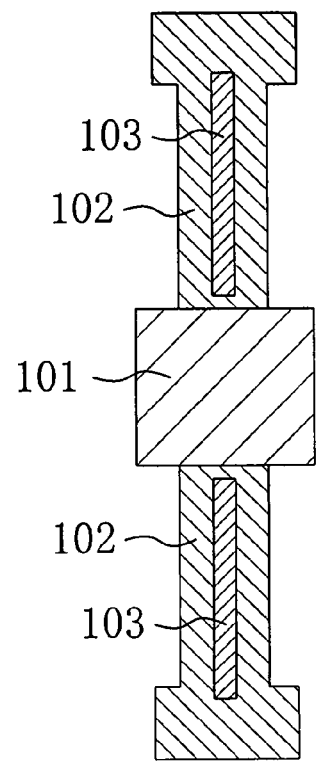

FIG. 16B shows a result of the OPC processing performed by correcting the mask dimension of a semi-light-shielding portion 102 when a mask pattern structure similar to that of this embodiment (namely, a structure including a light-shielding portion 101, a semi-light-shielding portion 102 and a phase shifter portion 103) is applied to a gate contact pattern. In the mask pattern shown in FIG. 16B, a region corresponding to a contact portion includes the light-shielding portion 101 alone, and a region corresponding to a gate portion includes the phase shifter portion 103 and the semi-light-shielding portion 102. Specifically, in the outer region of the line-shaped gate portion including the phase shifter portion 103, the semi-light-shielding portion 102 having an outline substantially analogous to the outline of the phase shifter portion 103 is provided, and the semi-light-shielding portion 102 in the shape of a hammer having a larger width than the line width is provided at the end of the line pattern.

Now, a photomask creation method according to Embodiment 2 of the invention will be described with reference to the accompanying drawings.

Figure 37:
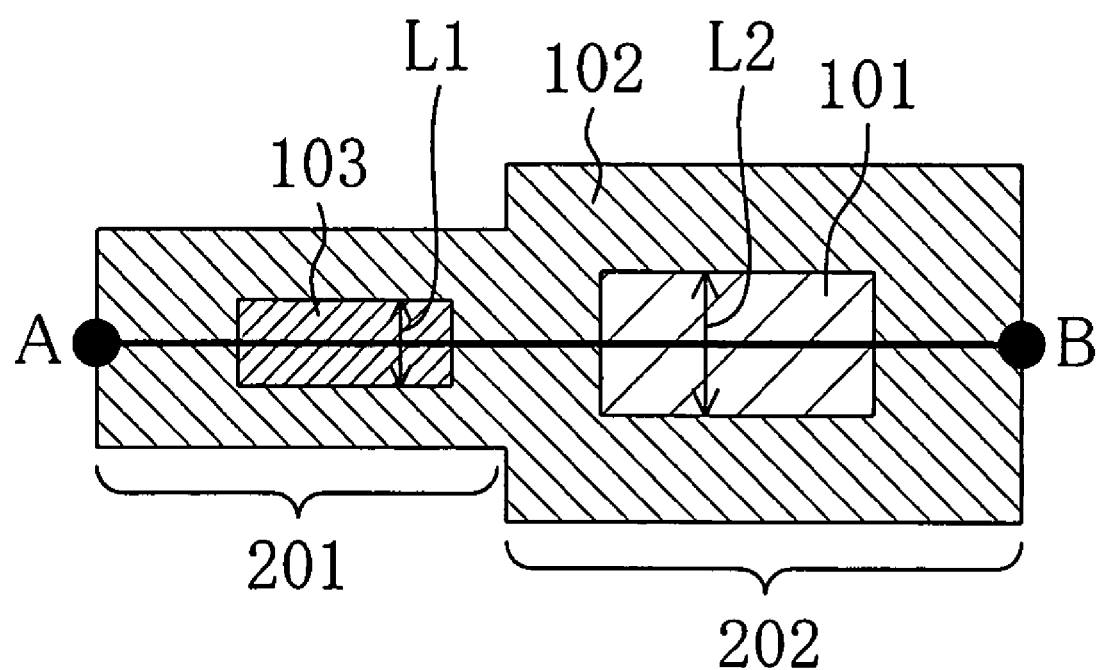
FIG. 37 is a plan view of a photomask to be fabricated by a photomask fabrication method according to Embodiment 2 of the invention.

FIG. 37 is a plan view of a photomask to be created by the photomask creation method of this embodiment. The basic structure of the photomask of FIG. 37 is equivalent to the basic structure of the photomask of Embodiment 2 shown in FIG. 10B. Specifically, a mask pattern used in the photomask of FIG. 37 includes a first pattern region 201 with a first width L1 and a second pattern region 202 with a second width L2 larger than the first width L1. In the first pattern region 201, a semi-light-shielding portion 102 is provided in the outer region and a rectangular phase shifter portion 103 is provided at the center. In the second pattern region 202, a semi-light-shielding portion 102 is provided in the outer region and a rectangular light-shielding portion 101 is provided at the center. It is noted that a transparent substrate 100 (a transparent portion 104) is omitted in FIG. 37.

FIGS. 38A through 38I are cross-sectional views (taken on line AB of FIG. 37) for showing procedures in the photomask creation method of this embodiment, and FIGS. 39A through 39F are plan views respectively corresponding to FIGS. 38B, 38C, 38E, 38F, 38H and 38I.

Figure 38A:
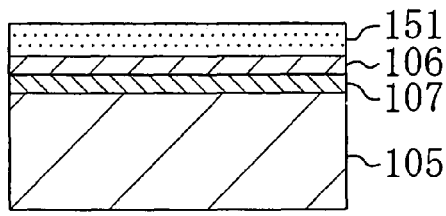
FIGS. 38A, 38B, 38C, 38D, 38E, 38F, 38G, 38H and 38I are cross-sectional views (taken on line AB of FIG. 37) of procedures in the photomask fabrication method of Embodiment 2 of the invention.

First, as shown in FIG. 38A, a metal thin film 107 of, for example, Mo and a Cr film 106 are successively formed respectively as a semi-light-shielding film and a light-shielding film on a transparent substrate of, for example, a quartz substrate 105, and thereafter, a resist film 151 is formed on the Cr film 106.

Figure 38B:
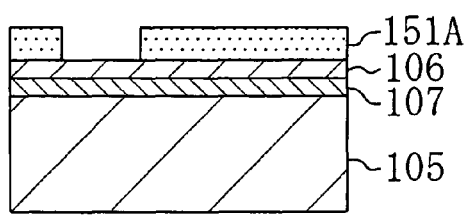
Figure 39A:
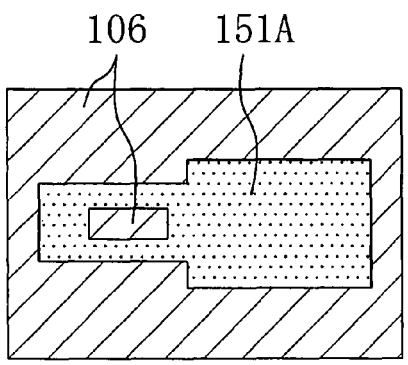
FIGS. 39A, 39B, 39C, 39D, 39E and 39F are plan views respectively corresponding to the cross-sectional views of FIGS. 38B, 38C, 38E, 38F, 38H and 38I.

Next, as shown in FIGS. 38B and 39A, the resist film 151 is patterned by lithography so as to form a resist pattern 151A for covering a region for a light-shielding portion 101 and a region for a semi-light-shielding portion 102.

Figure 38C:
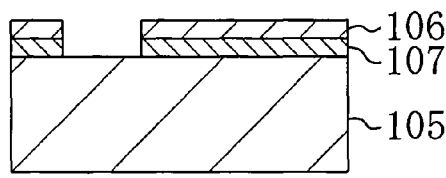
Figure 39D:
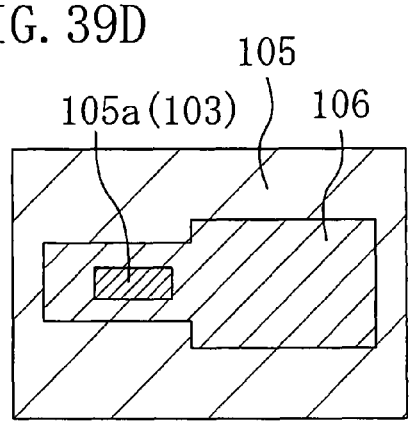
Figure 39B:
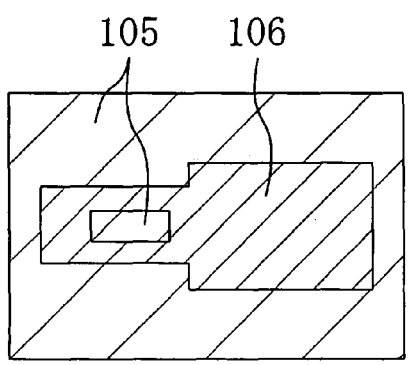

Then, the Cr film 106 and the metal thin film 107 are successively etched by using the resist pattern 151A as a mask, so as to remove portions of the Cr film 106 and the metal thin film 107 disposed in a region for a transparent portion 104 and a region for a phase shifter portion 103 as shown in FIGS. 38C and 39B, and thereafter, the resist pattern 151A is removed. In this manner, the surface of the quartz substrate 105 is exposed in the region for the transparent portion 104 and the region for the phase shifter portion 103.

Figure 38D:
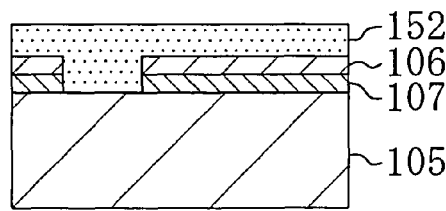
Figure 38E:
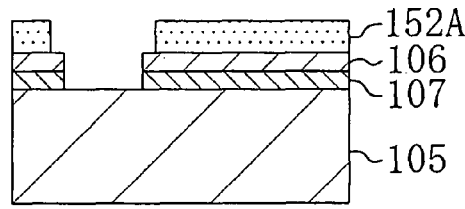
Figure 39E:
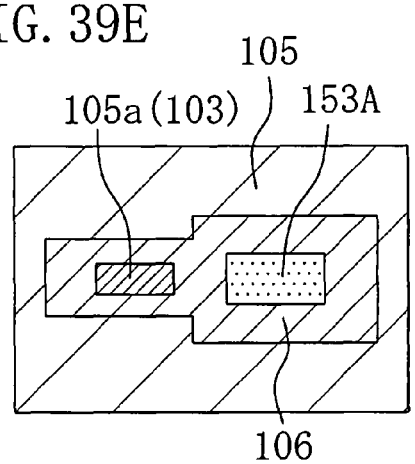
Figure 39C:
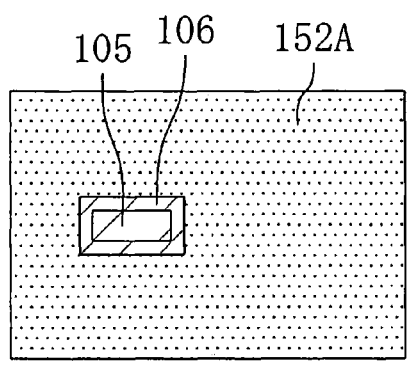

Next, as shown in FIG. 38D, a resist film 152 is formed on the patterned Cr film 106 and the quartz substrate 105, and then, as shown in FIGS. 38E and 39C, the resist film 152 is patterned by the lithography, so as to form a resist pattern 152A for covering the region for the transparent portion 104. At this point, the Cr film 106 (covering the region for the light-shielding portion 101 and the region for the semi-light-shielding portion 102) excluding a part thereof disposed in the vicinity (substantially corresponding to a mask alignment margin) of the region for the phase shifter portion 103 may be covered with the resist pattern 152A.

Figure 38F:
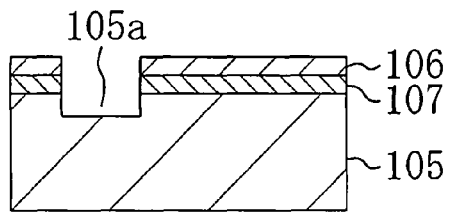

Next, the quartz substrate 105 is etched by using the resist pattern 152A and a part of the Cr film 106 as a mask, so as to trench a part of the quartz substrate 105 in a position corresponding to the region for the phase shifter portion 103 by a depth for inverting the phase of transmitted light. In this manner, a trench portion 105a used as the phase shifter portion 103 is formed as shown in FIGS. 38F and 39D, and thereafter, the resist pattern 152A is removed. At this point, the opening width of the trench portion 105a is substantially the same as the opening width of the Cr film 106.

Figure 38G:
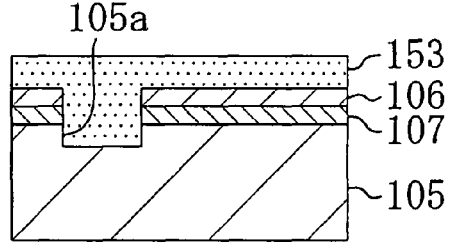
Figure 38H:
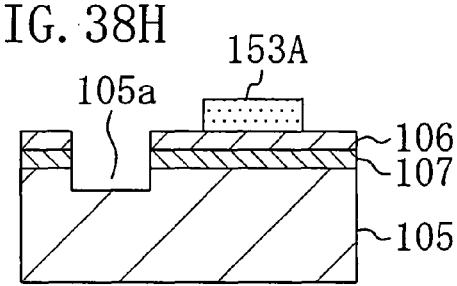

Then, as shown in FIG. 38G, a resist film 153 is formed on the patterned Cr film 106 and the quartz substrate 105 including the trench portion 105a, and subsequently, the resist film 153 is patterned by the lithography so as to form a resist pattern 153A for covering the region for the light-shielding portion 101 as shown in FIGS. 38H and 39E.

Figure 38I:
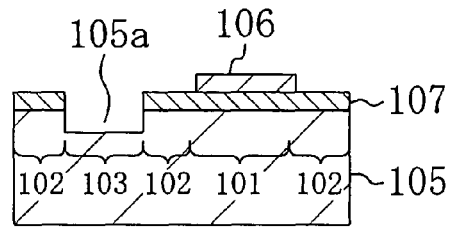
Figure 39F:
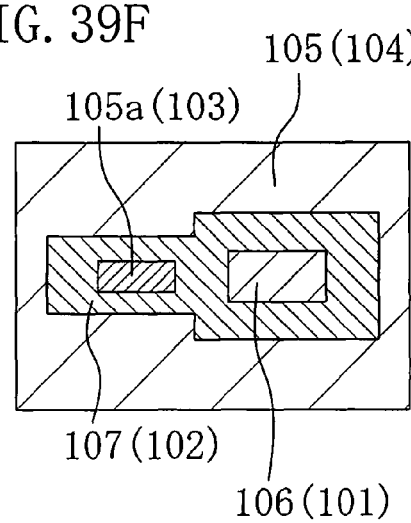

Next, the Cr film 106 (covering the region for the light-shielding portion 101 and the region for the semi-light-shielding portion 102) is etched by using the resist pattern 153A as a mask, so as to remove a part of the Cr film 106 disposed in the region for the semi-light-shielding portion 102 as shown in FIGS. 38I and 39F, and thereafter, the resist pattern 153A is removed. Thus, the Cr film 106 remains merely in the region for the light-shielding portion 101, and the metal thin film 107 is exposed in the region for the semi-light-shielding portion 102. In this manner, the photomask shown in FIG. 37 is completed.

Embodiment 3

A photomask according to Embodiment 3 of the invention will now be described with reference to the accompanying drawings.

Figure 17A:
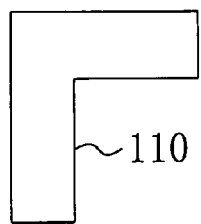
FIG. 17A is a diagram for showing the shape of a desired resist pattern to be formed by using a photomask according to Embodiment 3 of the invention.
Figure 17B:
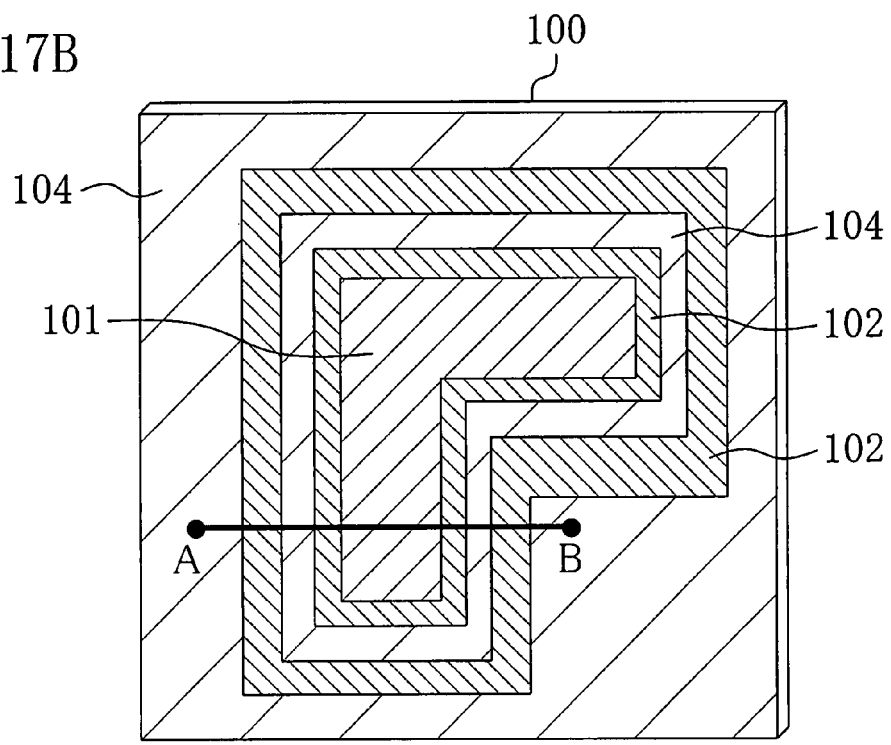
FIG. 17B is a plan view of the photomask of Embodiment 3 of the invention and FIG. 17C is a cross-sectional view thereof taken on line AB of FIG. 17B.

FIG. 17A is a diagram for showing the shape of a desired resist pattern, and FIG. 17B is a plan view of the photomask of Embodiment 3. It is noted that a transparent substrate is perspectively shown in FIG. 17B.

As shown in FIG. 17A, the desired pattern is a resist pattern 110.

As shown in FIG. 17B, a transparent portion 104 is provided over a sufficiently large area on the transparent substrate 100. Also, a mask pattern composed of a light-shielding portion 101 and a semi-light-shielding portion 102 is provided on the transparent substrate 100 in a position corresponding to the resist pattern (the desired pattern) 110 to be formed on a wafer through exposure in the same manner as in Embodiment 1. In this embodiment, the semi-light-shielding portion 102 is provided in the periphery (in the whole outer region) of the mask pattern and the light-shielding portion 101 is provided at the center of the mask pattern in the same manner as in Embodiment 1. In other words, the light-shielding portion 101 is surrounded with the semi-light-shielding portion 102. The light-shielding portion 101 and the semi-light-shielding portion 102 are defined in the same manner as in Embodiment 1.

A difference of this embodiment from Embodiment 1 is that a semi-light-shielding portion 102 is further provided around the mask pattern corresponding to the resist pattern (the desired pattern) 110, namely, around the semi-light-shielding portion 102 disposed in the outer region of the mask pattern, with a part of the transparent portion 104 sandwiched therebetween. The width of the transparent portion 104 sandwiched between the semi-light-shielding portion 102 provided in the outer region of the mask pattern and the semi-light-shielding portion 102 provided around the mask pattern is preferably λ/NA or less as described below.

Figure 17C:
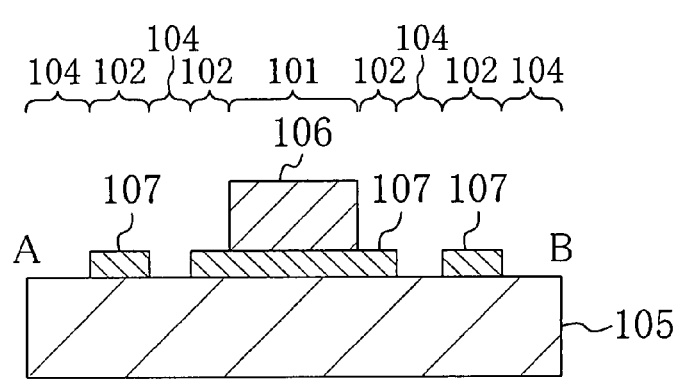

FIG. 17C shows an exemplified cross-sectional structure of the photomask shown in the plan view of FIG. 17B. Specifically, FIG. 17C shows the cross-sectional structure of a portion corresponding to line AB of FIG. 17B. As shown in FIG. 17C, the transparent portion 104 corresponds to a bare region of a transparent substrate of, for example, a quartz substrate 105. The semi-light-shielding portion 102 provided in the outer region of the mask pattern and the semi-light-shielding portion 102 provided around the mask pattern are both formed by depositing a metal thin film 107 of, for example, Mo as a semi-light-shielding film on the transparent substrate 100 in the same manner as in Embodiment 1. Also, the light-shielding portion 101 is formed by further stacking, for example, a Cr film 106 as a light-shielding film on the metal thin film 107 in the same manner as in Embodiment 1. In other words, a difference in the cross-sectional structure of the photomask of this embodiment from that of Embodiment 1 is that the semi-light-shielding portion 102 additionally provided around the mask pattern of Embodiment 1 is made of the metal thin film (the semi-light-shielding film) 107 similarly to the semi-light-shielding portion 102 provided in the outer region of the mask pattern.

In this embodiment, it is not always necessary to use the same material for forming the semi-light-shielding portion 102 provided in the outer region of the mask pattern and the semi-light-shielding portion 102 provided around the mask pattern, but when these semi-light-shielding portions 102 are made of the same material, the cross-sectional structure of the mask can be simplified.

A CD value can be adjusted with further smaller MEF than in Embodiment 1 by using the photomask of this embodiment having the aforementioned structure, which will now be described with reference to a result of simulation.

Figure 18A:
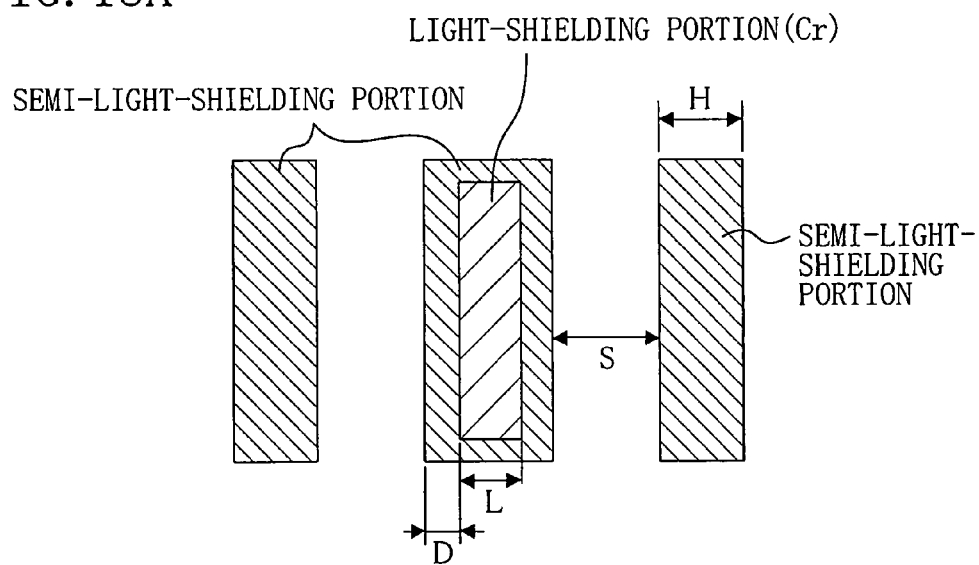
FIG. 18A is a diagram of a mask pattern used for checking an effect of the photomask of Embodiment 3 of the invention and FIG. 18B is a diagram for showing a result of simulation for a dimension of a pattern formed on a wafer through exposure of the mask pattern of FIG. 18A.
Figure 18B:
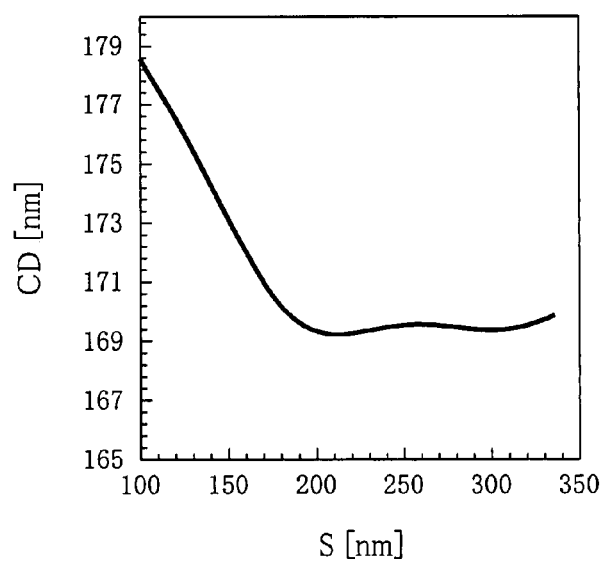

FIGS. 18A and 18B are diagrams for explaining the simulation result for the mask pattern of this embodiment. Specifically, FIG. 18A shows a mask pattern used in the simulation, and the mask pattern is a line-shaped pattern and is composed of a light-shielding portion with a width L (made of, for example, a Cr film) and semi-light-shielding portions surrounding the light-shielding portion. At this point, each of portions of the semi-light-shielding portion disposed on both sides (on both sides along the width direction) of the light-shielding portion has a width D. Furthermore, around the mask pattern, namely, around the semi-light-shielding portion provided in the outer region of the mask pattern, a semi-light-shielding portion with a width H is provided with a part of the transparent portion having a width S sandwiched therebetween. In the mask pattern shown in FIG. 18A, the transmittance of the semi-light-shielding portion against exposing light is set to 16%, the width L of the light-shielding portion is set to 200 nm, and the width D of the semi-light-shielding portion is set to 40 nm. Furthermore, the width H of the semi-light-shielding portion provided around the mask pattern is set to 150 nm so as not to form a resist pattern due to its transmittance (of 16%).

A graph of FIG. 18B shows a dimension (a CD value) of a pattern formed on a wafer through exposure of the mask pattern of FIG. 18A obtained through the simulation, and specifically, dimensions (CD values) of a pattern formed on a wafer with the width S of the transparent portion changed from 100 nm to 340 nm are plotted.

As shown in FIG. 18B, while the width S of the transparent portion is changed from 100 nm to approximately 200 nm, the CD value is reduced by approximately 10 nm. Also, when the width S of the transparent portion exceeds 200 nm, the CD value is minimally changed. In other words, in the range of the width S of the transparent portion from 100 nm to 200 nm, the MEF(S) dependent on the width S of the transparent portion is approximately −0.1. Accordingly, in the case where a line-shaped mask pattern including a light-shielding portion and a semi-light-shielding portion is further provided with a semi-light-shielding portion around the mask pattern and the CD value is adjusted by changing the width S of the transparent portion disposed between the latter semi-light-shielding portion and the line-shaped mask pattern, the CD value can be controlled with very small MEF.

This effect means that also when the mask width of the mask pattern is fixed, the CD value can be changed by increasing the intensity of light passing through the transparent portion disposed around the mask pattern. On the other hand, when the width of the transparent portion exceeds $\lambda/NA$ (which is 227 nm in the above-described simulation), light passing through the transparent portion is saturated and hence the CD value is not changed. In other words, when a mask pattern including a semi-light-shielding portion disposed in the outer region is further provided with (at least a part of) another semi-light-shielding portion disposed in a position away from the end of the mask pattern by $\lambda/NA$ or less, the CD value can be adjusted with small MEF.

In this embodiment, the width of the transparent portion sandwiched between the semi-light-shielding portion provided in the outer region of the mask pattern and the semi-light-shielding portion provided around the mask pattern is $\lambda/NA$ or less, and there is no need of the whole transparent portion surrounding the mask pattern having the same width but the transparent portion may have different widths within the range of $\lambda/NA$ or less in respective parts thereof.

Furthermore, in this embodiment, as the transmittance against the exposing light of the semi-light-shielding portion provided around the mask pattern is increased, the influence on an optical image of the change of the dimension of this semi-light-shielding portion is smaller, and hence, the MEF reducing effect is improved. However, when the transmittance against the exposing light of the semi-light-shielding portion provided around the mask pattern is low (for example, 4%, that is, the lower limit of the transmittance of the semi-light-shielding portion), a sufficient MEF reducing effect can be attained. Accordingly, in the case where the same material is used for forming the semi-light-shielding portion provided in the outer region of the mask pattern and the semi-light-shielding portion provided around the mask pattern, the optimum condition for the transmittance against the exposing light of these semi-light-shielding portions may be determined so as to optimize the MEF reducing effect obtained by the semi-light-shielding portion provided in the outer region of the mask pattern in the same manner as in Embodiment 1.

Furthermore, although the outline of the semi-light-shielding portion 102 provided in the outer region of the mask pattern and the outline of the light-shielding portion 101 provided at the center of the mask pattern are analogous to each other in this embodiment, in order to attain the effect of this embodiment, the semi-light-shielding portion 102 with a width not more than $\lambda/NA$ is provided in the outer region of the mask pattern (namely, around the light-shielding portion 101). Therefore, there is no need for the outline of the semi-light-shielding portion 102 and the outline of the light-shielding portion 101 to be analogous to each other.

Moreover, although the semi-light-shielding portion 102 is provided in the whole outer region of the mask pattern in this embodiment, the semi-light-shielding portion may be provided in a part of the outer region of the mask pattern where the MEF is particularly desired to be reduced instead. However, in the case where the semi-light-shielding portion 102 is provided in the whole outer region of the mask pattern, namely, in the case where the light-shielding portion 101 is wholly surrounded with the semi-light-shielding portion 102, the optical proximity correction can be easily performed by adjusting the width of the semi-light-shielding portion 102 alone.

Moreover, in this embodiment, when a semi-light-shielding portion is provided inside the light-shielding portion 101 in addition to the semi-light-shielding portion 102 provided in the outer region of the mask pattern (i.e., around the light-shielding portion 101) in the same manner as in Modification 2 of Embodiment 1, the MEF reducing effect and the DOF improving effect can be simultaneously obtained. In this case, the transmittance against the exposing light of the additional semi-light-shielding portion is preferably 15% or less (whereas preferably 4% or more for attaining an effective effect derived from the semi-light-shielding portion). In this manner, even when the dimension of the semi-light-shielding portion provided inside the light-shielding portion is sufficiently larger than $\lambda/NA$, a resist is not exposed to light passing through the semi-light-shielding portion. Accordingly, since there is no need to consider the upper limit of the mask dimension not for exposing a resist with respect to each mask pattern, the freedom in the mask layout is increased, and hence, the mask layout can be easily determined.

Figure 19:
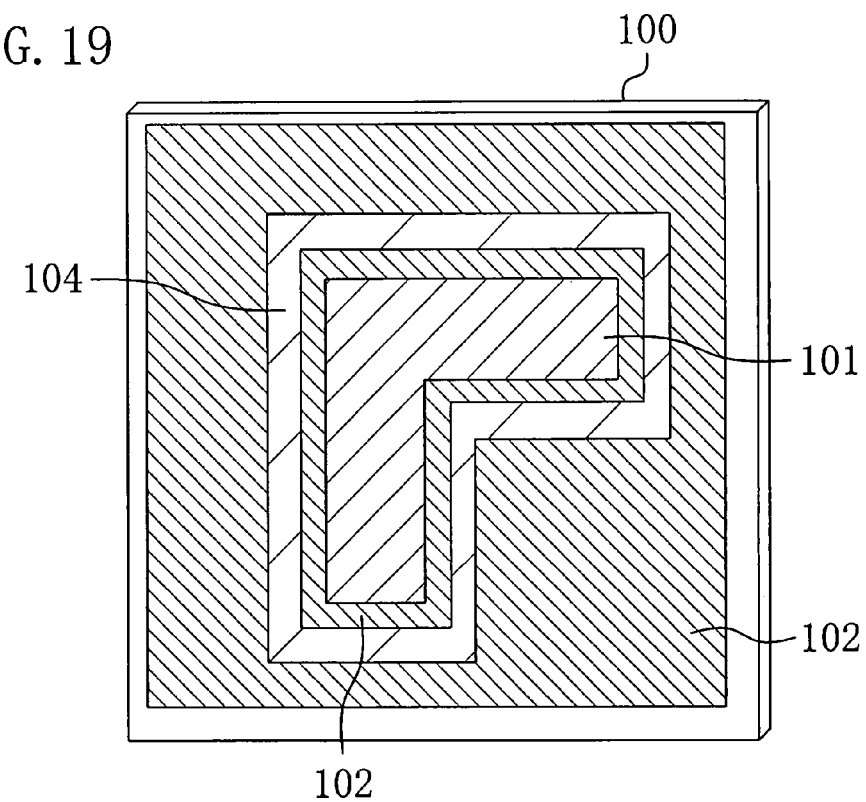
FIG. 19 is a diagram of a variation of the plane structure of the photomask of Embodiment 3 of the invention.

Also, in this embodiment, when the transmittance of the semi-light-shielding portion (specifically, the semi-light-shielding portion provided around the mask pattern) is 25% or more, the following effect can be attained: In general, when the transmittance against exposing light of a semi-light-shielding portion is approximately 20%, a resist is highly possibly exposed to light passing through the semi-light-shielding portion. Therefore, when the transmittance against the exposing light of the semi-light-shielding portion is 25%, a resist can be exposed to light passing through the semi-light-shielding portion with a margin sufficiently secured. In other words, although the semi-light-shielding portion provided around the mask pattern should have a width not for forming a resist pattern (namely, a width sufficient for exposing a resist), when the transmittance against the exposing light of the semi-light-shielding portion is 25% or more, the semi-light-shielding portion may have a sufficiently large dimension of $\lambda/NA$ or more. Therefore, since there is no need to consider the upper limit of the mask dimension not for forming a resist pattern (namely, for exposing a resist) with respect to each mask pattern, the freedom in the mask layout is increased, and hence, the mask layout can be easily determined. In an extreme case, a semi-light-shielding portion 102 can be provided as the background of a mask so as to cover a region excluding a mask pattern and a surrounding transparent portion as shown in, for example, FIG. 19. However, in order to attain an effective effect derived from the semi-light-shielding portion, the transmittance against the exposing light of the semi-light-shielding portion is preferably 64% or less.

Figure 20:
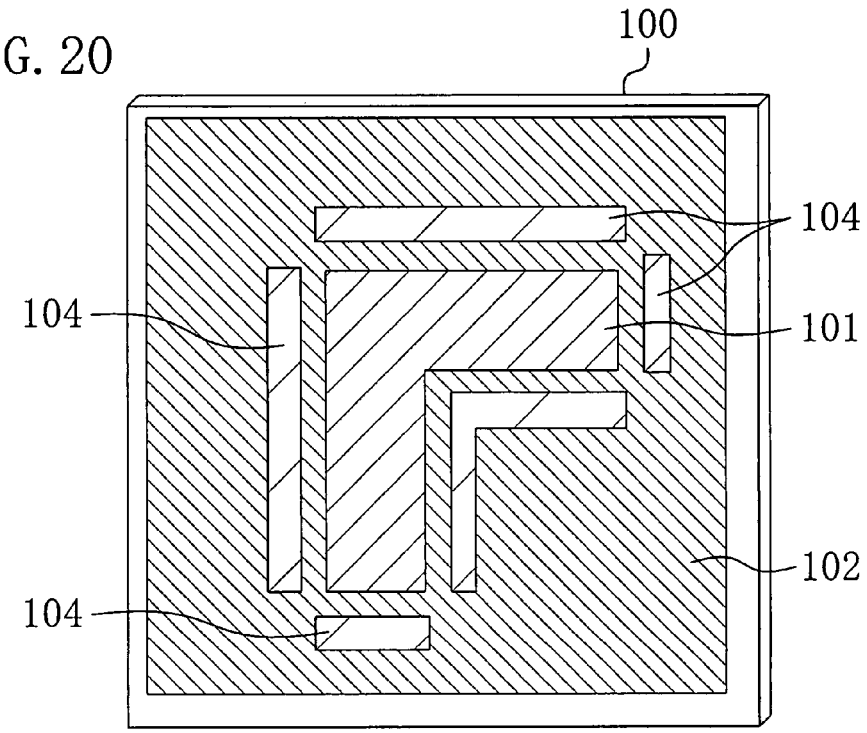
FIG. 20 is a diagram of another variation of the plane structure of the photomask of Embodiment 3 of the invention.

Furthermore, in this embodiment, the transparent portion 104 with a width not more than $1.0 \times \lambda/NA$ is provided in parallel to each side of the mask pattern corresponding to the desired pattern. Therefore, for example, a portion (with a width not more than a half of the resolution limit, i.e., not more than $0.2 \times \lambda/NA$) where no transparent portion 104 is provided may be provided in the vicinity of each corner of the mask pattern as shown in FIG. 20. This is because a dimension not more than a half of the resolution limit does not affect the resist pattern formation. In other words, in this embodiment, the respective sides of the mask pattern may be surrounded with a plurality of rectangular transparent portions, and the semi-light-shielding portion provided in the outer region of the mask pattern and the semi-light-shielding portion provided around the mask pattern (that is, the semi-light-shielding portion corresponding to the background of the mask in FIG. 20) may be connected to each other in the vicinity of the corners of the mask pattern. In this manner, line ends and corners of the mask pattern corresponding to the desired pattern are never surrounded with the transparent portion, and hence, light passing in the vicinity of these parts around the mask can be prevented from becoming excessive.

Modification of Embodiment 3

A photomask according to a modification of Embodiment 3 of the invention will now be described with reference to the accompanying drawings.

Figure 21A:
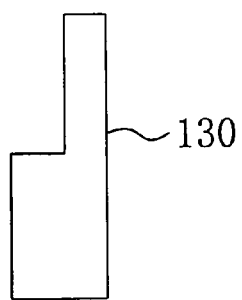
FIG. 21A is a diagram for showing the shape of a desired resist pattern to be formed by using a photomask according to a modification of Embodiment 3 of the invention.
Figure 21B:
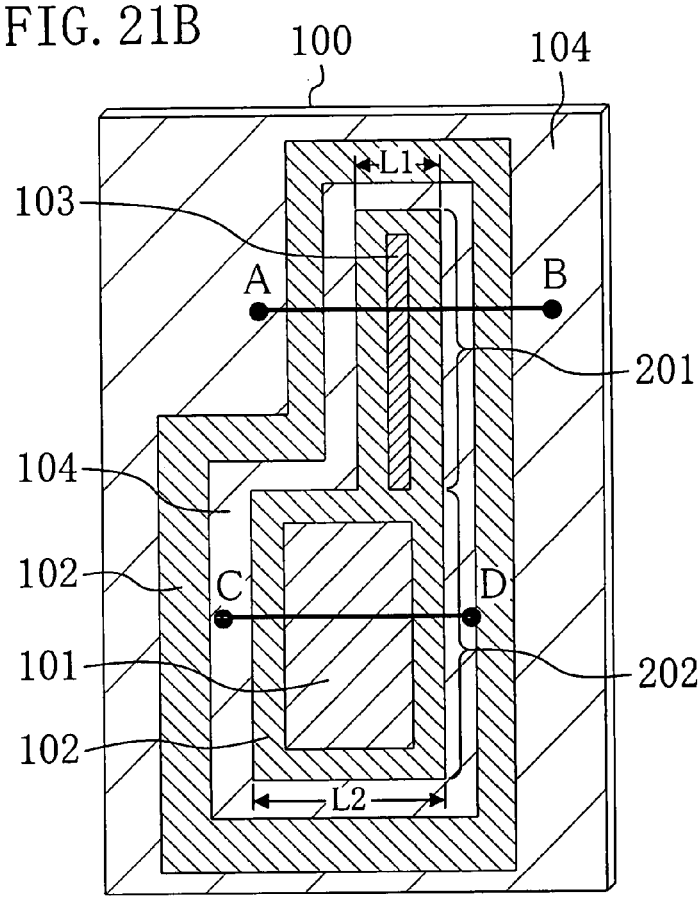
FIG. 21B is a plan view of the photomask of the modification of Embodiment 3 of the invention and FIG. 21C is a cross-sectional view taken thereof on lines AB and CD of FIG. 21B.

FIG. 21A is a diagram for showing the shape of a desired resist pattern and FIG. 21B is a plan view of the photomask according to the modification of Embodiment 3. It is noted that a transparent substrate is perspectively shown in FIG. 21B.

As shown in FIG. 21A, the desired pattern is a resist pattern 130.

As shown in FIG. 21B, a transparent portion 104 is formed over a sufficiently large area on the transparent substrate 100. Also, a mask pattern composed of a light-shielding portion 101, a semi-light-shielding portion 102 and a phase shifter portion 103 is provided on the transparent substrate 100 in a position corresponding to the resist pattern (the desired pattern) 130 to be formed on a wafer through exposure. At this point, the mask pattern of this modification includes, in the same manner as in Embodiment 2, a first pattern region 201 with a first width L1 and a second pattern region 202 with a second width L2 larger than the first width L1. In the first pattern region 201, the semi-light-shielding portion 102 is provided in the outer region and the phase shifter portion 103 is provided at the center. In the second pattern region 202, the semi-light-shielding portion 102 is provided in the outer region and the light-shielding portion 101 is provided at the center. The light-shielding portion 101, the semi-light-shielding portion 102 and the phase shifter portion 103 are respectively defined in the same manner as in Embodiment 2.

This modification is different from Embodiment 2 in the semi-light-shielding portion 102 provided around the mask pattern corresponding to the resist pattern (the desired pattern) 130, namely, around the semi-light-shielding portion 102 provided in the outer region of the mask pattern, with a part of the transparent portion 104 sandwiched therebetween. The width of the part of the transparent portion 104 sandwiched between the semi-light-shielding portion 102 provided in the outer region of the mask pattern and the semi-light-shielding portion 102 provided around the mask pattern is preferably not more than $\lambda/NA$ as in Embodiment 3.

Figure 21C:
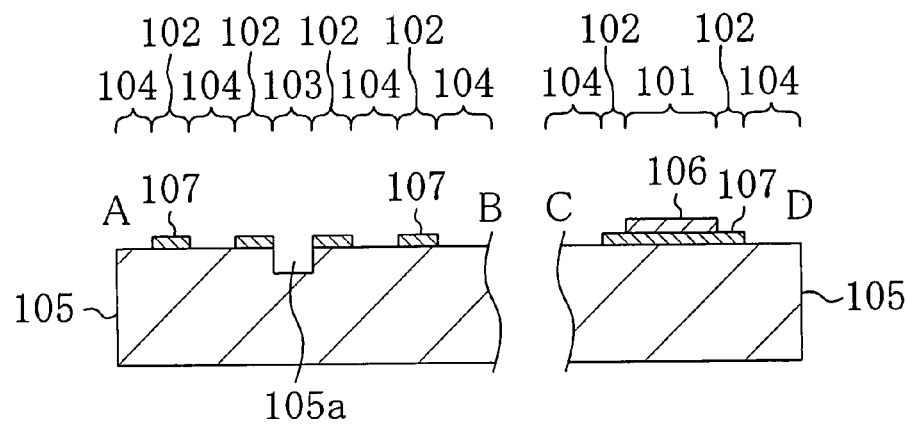

FIG. 21C shows an exemplified cross-sectional structure of the photomask shown in the plan view of FIG. 21B. Specifically, FIG. 21C shows the cross-sectional structure of portions corresponding to lines AB and CD of FIG. 21B. As shown in FIG. 21C, the transparent portion 104 corresponds to a bare region of the transparent substrate of, for example, a quartz substrate 105. The semi-light-shielding portion 102 provided in the outer region of the mask pattern and the semi-light-shielding portion 102 provided around the mask pattern are both formed by depositing a metal thin film 107 of, for example, Mo as a semi-light-shielding film on the transparent substrate 100 in the same manner as in Embodiment 2. Also, the light-shielding portion 101 is formed by further stacking, for example, a Cr film 106 as a light-shielding film on the metal thin film (the semi-light-shielding film) 107 in the same manner as in Embodiment 2. Moreover, the phase shifter portion 103 provided inside the semi-light-shielding portion 102 is formed by forming an opening in the metal thin film (the semi-light-shielding film) 107 deposited on the quartz substrate 105 and trenching the quartz substrate 105 within the opening by a depth for inverting the phase of transmitted light. In other words, the phase shifter portion 103 corresponds to a trench portion 105a of the quartz substrate 105.

In this manner, the cross-sectional structure of the photomask of this modification is different from that of Embodiment 2 in the semi-light-shielding portion 102 additionally provided around the mask pattern of Embodiment 2 being made of the metal thin film (the semi-light-shielding film) 107 in the same manner as the semi-light-shielding portion 102 provided in the outer region of the mask pattern.

It is not always necessary to use the same material for forming the semi-light-shielding portion 102 provided in the outer region of the mask pattern and the semi-light-shielding portion 102 provided around the mask pattern, but when these semi-light-shielding portions 102 are made of the same material, the cross-sectional structure of the photomask can be simplified in the same manner as in Embodiment 3.

A CD value can be adjusted with further smaller MEF than in Embodiment 2 by using the photomask of this modification having the aforementioned structure, which will now be described with reference to a result of simulation. In the mask pattern of this modification, it is obvious with respect to the second pattern region 202 shown in FIG. 21B that the MEF reducing effect can be attained by providing the semi-light-shielding portion in the outer region of the mask pattern including the light-shielding portion in the same manner as in the mask pattern of Embodiment 3, and therefore, the effect attained by the mask pattern structure of the first pattern region 201 shown in FIG. 21B will be herein described.

Figure 22A:
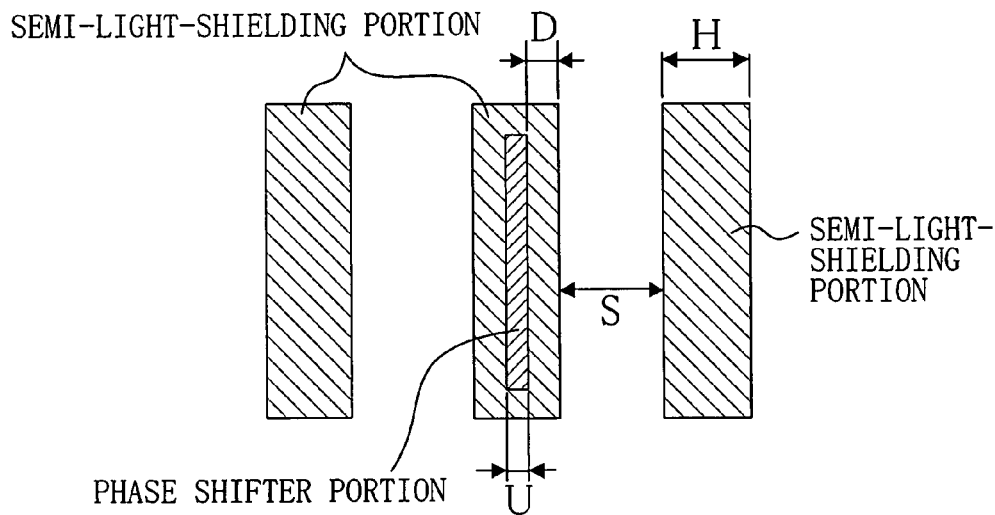
FIG. 22A is a diagram of a mask pattern used for checking an effect of the photomask of the modification of Embodiment 3 of the invention and FIG. 22B is a diagram for showing a result of simulation for a dimension of a pattern formed on a wafer through exposure of the mask pattern of FIG. 22A.
Figure 22B:
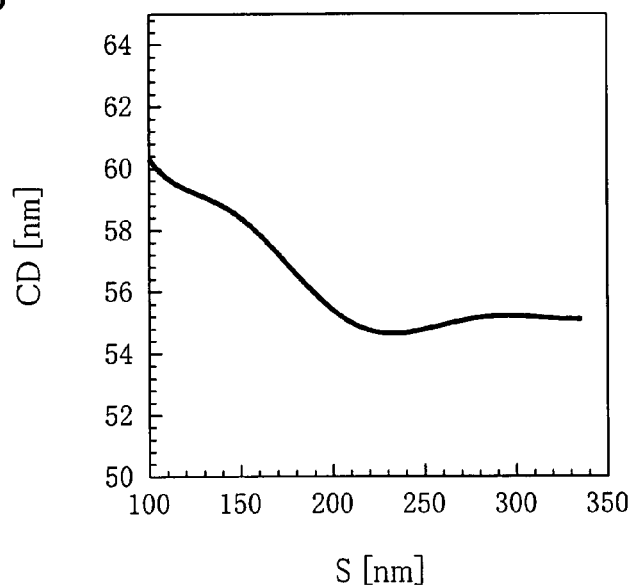

FIGS. 22A and 22B are diagrams for explaining the simulation result for the mask pattern (the first pattern region 201) of this modification. Specifically, FIG. 22A shows a mask pattern used in the simulation, and the mask pattern is a line-shaped pattern and includes a phase shifter portion with a width U and semi-light-shielding portions surrounding the phase shifter portion. At this point, each of portions of the semi-light-shielding portion disposed on both sides (on both sides along the width direction) of the phase shifter portion has a width D. Furthermore, around the mask pattern, namely, around the semi-light-shielding portion provided in the outer region of the mask pattern, a semi-light-shielding portion with a width H is provided with a part of the transparent portion having a width S sandwiched therebetween. In the mask pattern shown in FIG. 22A, the transmittance of the semi-light-shielding portion against exposing light is set to 16%, the width U of the phase shifter portion is set to 50 nm, and the width D of the semi-light-shielding portion is set to 30 nm. Furthermore, the width H of the semi-light-shielding portion provided around the mask pattern is set to 150 nm so as not to form a resist pattern due to its transmittance (of 16%).

A graph of FIG. 22B shows a dimension (a CD value) of a pattern formed on a wafer through exposure of the mask pattern of FIG. 22A obtained through the simulation, and specifically, dimensions (CD values) of the pattern formed on a wafer with the width S of the transparent portion changed from 100 nm to 340 nm are plotted.

As shown in FIG. 22B, while the width S of the transparent portion is changed from 100 nm to approximately 200 nm, the CD value is reduced by approximately 5 nm. Also, when the width S of the transparent portion exceeds 200 nm, the CD value is minimally changed. In other words, in the range of the width S of the transparent portion from 100 nm to 200 nm, the MEF(S) dependent on the width S of the transparent portion is approximately −0.05. Accordingly, in the case where a line-shaped mask pattern including a phase shifter portion and a semi-light-shielding portion is further provided with a semi-light-shielding portion around the mask pattern and the CD value is adjusted by changing the width S of a transparent portion disposed between the latter semi-light-shielding portion and the line-shaped mask pattern, the CD value can be controlled with very small MEF.

Also in this modification, when (at least a part of) another semi-light-shielding portion is provided in a position away, by λ/NA or less, from the end of the mask pattern including a semi-light-shielding portion disposed in the outer region, the CD value can be adjusted with small MEF in the same manner as in Embodiment 3.

In this modification, the width of the transparent portion sandwiched between the semi-light-shielding portion provided in the outer region of the mask pattern and the semi-light-shielding portion provided around the mask pattern is λ/NA or less, and there is no need of the whole transparent portion surrounding the mask pattern having the same width but the transparent portion may have different widths within the range of λ/NA or less in respective parts thereof.

Furthermore, in this modification, as the transmittance against the exposing light of the semi-light-shielding portion provided around the mask pattern is increased, the influence on an optical image of the change of the dimension of this semi-light-shielding portion is smaller, and hence, the MEF reducing effect is improved. However, when the transmittance against the exposing light of the semi-light-shielding portion provided around the mask pattern is low (for example, 4%, that is, the lower limit of the transmittance of the semi-light-shielding portion), a sufficient MEF reducing effect can be attained. Accordingly, in the case where the same material is used for forming the semi-light-shielding portion provided in the outer region of the mask pattern and the semi-light-shielding portion provided around the mask pattern, the optimum condition for the transmittance against the exposing light of these semi-light-shielding portions may be determined so as to optimize the MEF reducing effect derived from the semi-light-shielding portion provided in the outer region of the mask pattern in the same manner as in Embodiment 2.

Furthermore, although the outline of the semi-light-shielding portion 102 provided in the outer region of the mask pattern and the outline of the light-shielding portion 101 or the phase shifter portion 103 provided at the center of the mask pattern are analogous to each other in this modification, there is no need for the outline of the semi-light-shielding 102 portion and the outline of the light-shielding portion 101 or the phase shifter portion 103 to be analogous to each other.

Moreover, although the semi-light-shielding portion 102 is provided in the whole outer region of the mask pattern in this embodiment, the semi-light-shielding portion may be provided in a part of the outer region of the mask pattern where the MEF is particularly desired to be reduced instead. However, in the case where the semi-light-shielding portion 102 is provided in the whole outer region of the mask pattern, namely, in the case where the light-shielding portion 101 and the phase shifter portion 103 are wholly surrounded with the semi-light-shielding portion 102, the optical proximity correction can be easily performed by adjusting the width of the semi-light-shielding portion 102 alone.

Moreover, in this modification, when a semi-light-shielding portion is provided inside the light-shielding portion 101 in addition to the semi-light-shielding portion 102 provided in the outer region of the mask pattern (i.e., around the light-shielding portion 101 and the phase shifter portion 103) in the same manner as in the modification of Embodiment 2, the MEF reducing effect and the DOF improving effect can be simultaneously obtained. In this case, when this semi-light-shielding portion is made of the same material as the semi-light-shielding portion 102 provided in the outer region of the mask pattern, the transmittance against the exposing light of the additional semi-light-shielding portion is preferably not less than 4% and not more than 15% in the same manner as in the modification of Embodiment 2.

Figure 23:
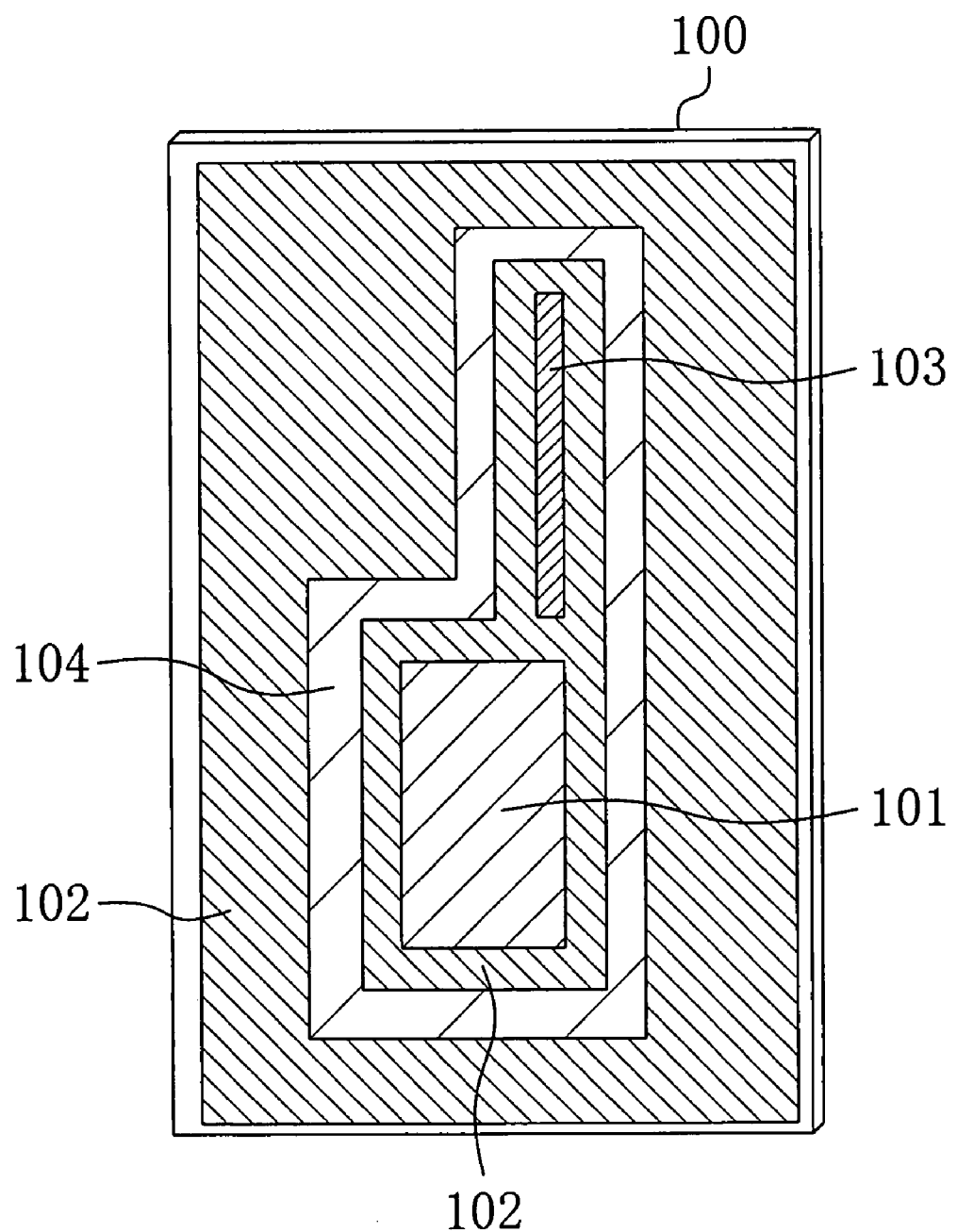
FIG. 23 is a diagram of a variation of the plane structure of the photomask of the modification of Embodiment 3 of the invention.

Also, in this modification, when the transmittance, against the exposing light, of the semi-light-shielding portion (specifically, the semi-light-shielding portion provided around the mask pattern) is 25% or more (whereas preferably 64% or less), the following effect can be attained in the same manner as in Embodiment 3: Although a semi-light-shielding portion provided around the mask pattern should have a width not for forming a resist pattern (namely, a width not for exposing a resist), when the transmittance against the exposing light of the semi-light-shielding portion is 25% or more, the semi-light-shielding portion may have a sufficiently large dimension of λ/NA or more. Therefore, since there is no need to consider the upper limit of the mask dimension not for forming a resist pattern (namely, not for exposing a resist) with respect to each mask pattern, the freedom in the mask layout is increased, and hence, the mask layout can be easily determined. In an extreme case, a semi-light-shielding portion 102 can be provided as the background of a mask so as to cover a region excluding a mask pattern and a surrounding transparent portion as shown in, for example, FIG. 23.

Figure 24:
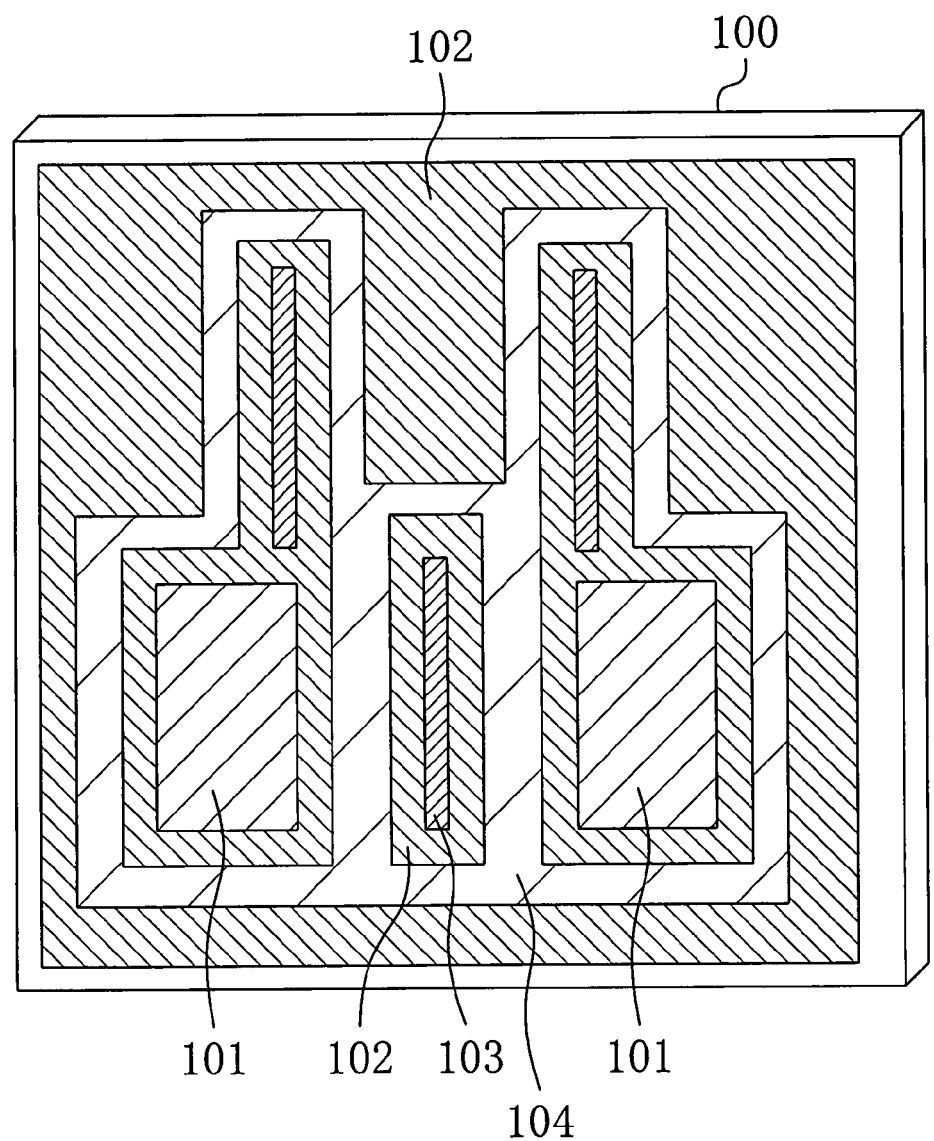
FIG. 24 is a diagram of another variation of the plane structure of the photomask of the modification of Embodiment 3 of the invention.

In the case where the semi-light-shielding portion 102 is provided as the background of the mask and the mask includes a plurality of mask patterns, the width of the transparent portion sandwiched between the semi-light-shielding portion provided in the outer region of each mask pattern and the semi-light-shielding portion provided around the mask pattern is λ/NA or less. Therefore, for example, as shown in FIG. 24, a semi-light-shielding portion 102 may be provided at the center of a region where a distance between adjacent mask patterns is 2×λ/NA or more without providing a semi-light-shielding portion in a region where the distance between adjacent mask patterns is smaller than 2×λ/NA.

Figure 25:
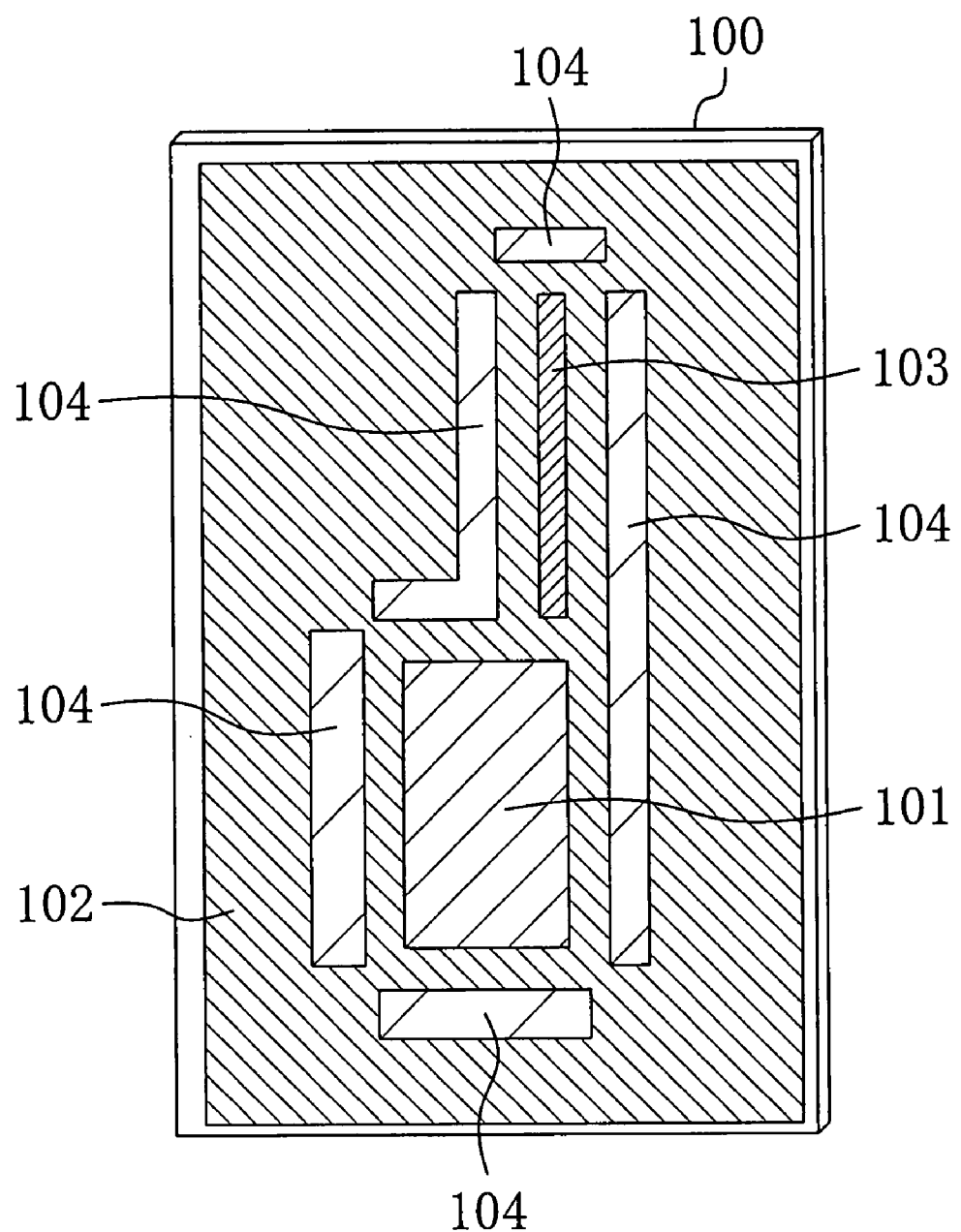
FIG. 25 is a diagram of another variation of the plane structure of the photomask of the modification of Embodiment 3 of the invention.

Furthermore, in this modification, the transparent portion 104 with a width not more than 1.0×λ/NA is provided in parallel to each side of the mask pattern corresponding to the desired pattern. Therefore, for example, a portion (with a width not more than a half of the resolution limit, i.e., not more than 0.2×λ/NA) where no transparent portion 104 is provided may be provided in the vicinity of each corner of the mask pattern as shown in FIG. 25. In other words, the respective sides of the mask pattern may be surrounded with a plurality of rectangular transparent portions, and the semi-light-shielding portion provided in the outer region of the mask pattern and the semi-light-shielding portion provided around the mask pattern (that is, the semi-light-shielding portion corresponding to the background of the mask in FIG. 25) may be connected to each other in the vicinity of the corners of the mask pattern. In this manner, line ends and corners of the mask pattern corresponding to the desired pattern are never surrounded with the transparent portion, and hence, light passing in the vicinity of these parts around the mask pattern can be prevented from becoming excessive.

The plane structure of the photomask of this modification has been mainly described so far, and the cross-sectional structure of the photomask of this modification will now be described in detail. FIGS. 26A through 26D, 27A and 27B show variations of the cross-sectional structure of portions corresponding to lines AB and CD of FIG. 21B. Although the typical cross-sectional structure for realizing the photomask has been described in each of Embodiments 1 through 3, the variations of the cross-sectional structure described below can be regarded to be common among all the embodiments. Specifically, although the cross-sectional structures shown in FIGS. 26A through 26D, 27A and 27B correspond to the plan view shown in FIG. 21B of this modification (the modification of Embodiment 3), in the case where they are regarded as the variations of the cross-sectional structure of another embodiment, composing elements not necessary for that embodiment are omitted in the cross-sectional structures shown in FIGS. 26A through 26D, 27A and 27B.

Figure 26A:
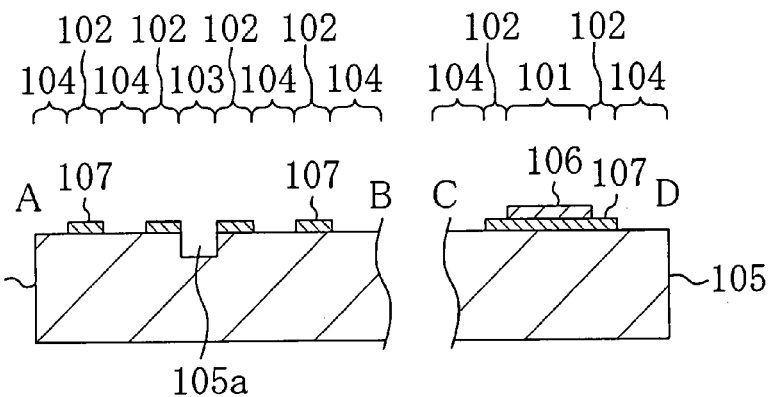
FIGS. 26A, 26B, 26C and 26D are diagrams of variations of the cross-sectional structure of portions corresponding to lines AB and CD of FIG. 21B.

First, the cross-sectional structure of the photomask shown in FIG. 26A (the cross-sectional structure of the photomask of this modification shown in FIG. 21C) is the cross-sectional structure described as a typical example in each of Embodiments 1 through 3. As shown in FIG. 26A, a translucent semi-light-shielding film (a metal thin film) 107 for causing an identical phase difference (i.e., a phase difference not less than (−30+360×n) degrees and not more than (30+360×n) degrees (wherein n is an integer)) in exposing light with respect to a transparent portion is formed on a transparent substrate of a quartz substrate 105. Hereinafter, causing an identical phase difference means causing a phase difference not less than (−30+360×n) degrees and not more than (30+360×n) degrees (wherein n is an integer)). In each of Embodiments 1 through 3, as a typical example of the semi-light-shielding film according with the definition of this "identical phase", a metal thin film in which n is 0 is used. In this case, a transparent portion 104 corresponds to a bare region of a quartz substrate 105, and a semi-light-shielding portion 102 corresponds to a bare region of the semi-light-shielding film (the metal thin film) 107 deposited on the quartz substrate 105. Furthermore, a region for a phase shifter 103 on the quartz substrate (the transparent substrate) 105 is trenched by a depth for causing an opposite phase difference (i.e., a phase difference not less than (150+360×n) degrees and not more than (210+360×n) degrees (wherein n is an integer)) in the exposing light with respect to the transparent portion. Thus, the phase shifter portion 103 is formed as a trench portion 105a of the quartz substrate 105. Hereinafter, causing an opposite phase difference means causing a phase difference not less than (150+360×n) degrees and not more than (210+360×n) degrees (wherein n is an integer)). Furthermore, a light-shielding portion 101 is formed by further stacking a light-shielding film (a Cr film) 106 substantially not transmitting the exposing light on the semi-light-shielding film (the metal thin film) 107.

In the aforementioned structure shown in FIG. 26A, an arbitrary layout including the transparent portion 104, the light-shielding portion 101, the semi-light-shielding portion 102 and the phase shifter portion 103 can be formed by preparing a substrate in which a light-shielding film is stacked on a semi-light-shielding film, appropriately removing these films and further trenching the transparent substrate. In particular, when a metal thin film is used as the semi-light-shielding film, the processing accuracy for the semi-light-shielding film is improved. Accordingly, in the structure shown in FIG. 26A, the processing accuracy for the semi-light-shielding portion provided in the outer region of the mask pattern can be improved.

Figure 26B:
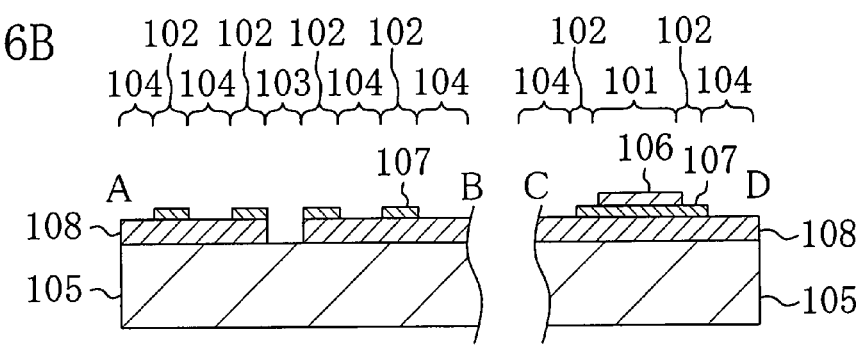

Next, in the cross-sectional structure of the photomask shown in FIG. 26B, on a transparent substrate of, for example, a quartz substrate 105, a phase shifting film 108 (having transmittance against exposing light equivalent to that of the quartz substrate 105) for causing an opposite phase difference in the exposing light with respect to a bare region of the quartz substrate 105 is formed. In this case, a transparent portion 104 corresponds to a bare region of the phase shifting film 108 deposited on the quartz substrate 105, and a phase shifter portion 103 corresponds to a bare region of the quartz substrate 105 from which the phase shifting film 103 has been selectively removed. Also, a translucent semi-light-shielding film 107 for causing an identical phase difference in the exposing light with respect to the transparent portion is further stacked on the phase shifting film 108. In this case, a semi-light-shielding portion 102 corresponds to a bare region of the semi-light-shielding film 107 formed on the phase shifting film 108. Furthermore, a light-shielding portion 101 is formed by further stacking a light-shielding film 106 substantially not transmitting the exposing light on the semi-light-shielding film 107.

In the structure shown in FIG. 26B, since the phase shifting film 108 is used, the phase of the phase shifter portion 103 is determined depending upon the thickness of the phase shifting film 108. Accordingly, as compared with the case where the phase of the phase shifter portion 103 is controlled in accordance with the depth for trenching the transparent substrate such as the quartz substrate 105, the accuracy in the phase control of the phase shifter portion 103 is improved.

Figure 26C:
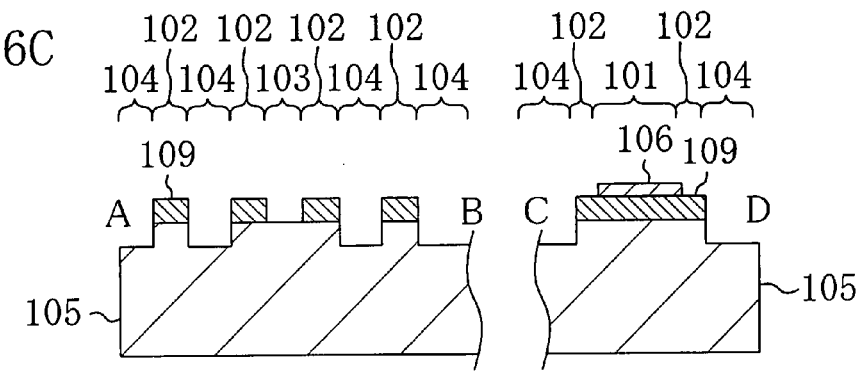

Next, in the cross-sectional structure of the photomask shown in FIG. 26C, on a transparent substrate of, for example, a quartz substrate 105, a translucent phase shifting film 109 for causing an opposite phase difference in the exposing light with respect to a bare region of the quartz substrate 105 is formed. In this case, a transparent portion 104 corresponds to a region on the quartz substrate 105 from which the phase shifting film 109 is selectively removed and that is trenched by a depth for causing an opposite phase difference. Also, a phase shifter portion 103 corresponds to a bare region of the quartz substrate 105 from which the phase shifting film 109 is removed, and a semi-light-shielding portion 102 corresponds to a bare region of the phase shifting film 109 deposited on the quartz substrate 105. Moreover, a light-shielding portion 101 is formed by further stacking a light-shielding film 106 substantially not transmitting the exposing light on the phase shifting film 109.

In the plane structure of the photomask of the present invention, there is no need to form a finer pattern for a transparent portion than a phase shifter portion on the basis of the principle of the invention. Also, a trench portion of a transparent substrate to be used as a phase shifter portion is generally formed by etching. When a pattern to be processed in the etching is finer, however, there occurs a micro loading effect that a trenched depth is varied in accordance with the pattern dimension. However, in the structure shown in FIG. 26C, a trench portion of the transparent substrate of the quartz substrate 105 is used not as a phase shifter portion but as a transparent portion, and there is no need to form a finer pattern for a transparent portion than a phase shifter portion as described above. Therefore, the micro loading effect can be avoided in trenching the transparent substrate, and hence, the mask processing can be eased.

Figure 26D:
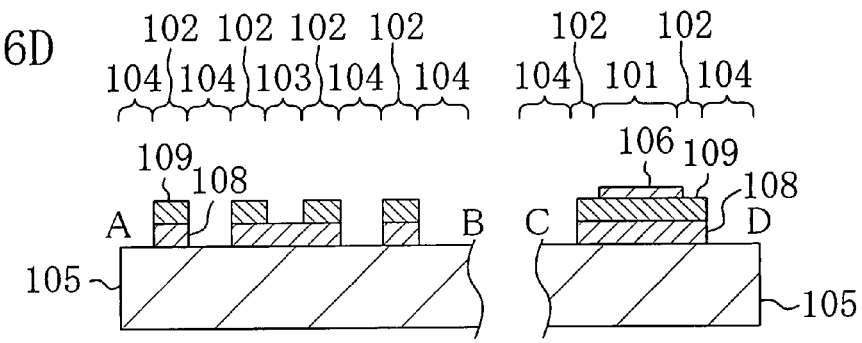

Next, in the cross-sectional structure of the photomask shown in FIG. 26D, on a transparent substrate of, for example, a quartz substrate 105, a phase shifting film 108 (with transmittance against exposing light equivalent to that of the quartz substrate 105) for causing an opposite phase difference in the exposing light with respect to a bare region of the quartz substrate 105 is formed. In this case, a transparent portion 104 corresponds to a bare region of the quartz substrate 105, and a phase shifter portion 103 corresponds to a bare region of the phase shifting film 108 deposited on the quartz substrate 105. Also, a translucent phase shifting film 109 for causing an opposite phase difference in the exposing light with respect to the transparent portion 104 is further stacked on the phase shifting film 108. In this case, a semi-light-shielding portion 102 corresponds to a bare region of the phase shifting film 109 formed on the phase shifting film 108. Furthermore, a light-shielding portion 101 is formed by further stacking a light-shielding film 106 substantially not transmitting the exposing light on the phase shifting film 109.

In the aforementioned structure shown in FIG. 26D, since the phases of the semi-light-shielding portion 102 and the phase shifter portion 103 are controlled in accordance with the thickness of the film deposited on the transparent substrate, the phase control can be highly accurately performed.

Figure 27A:
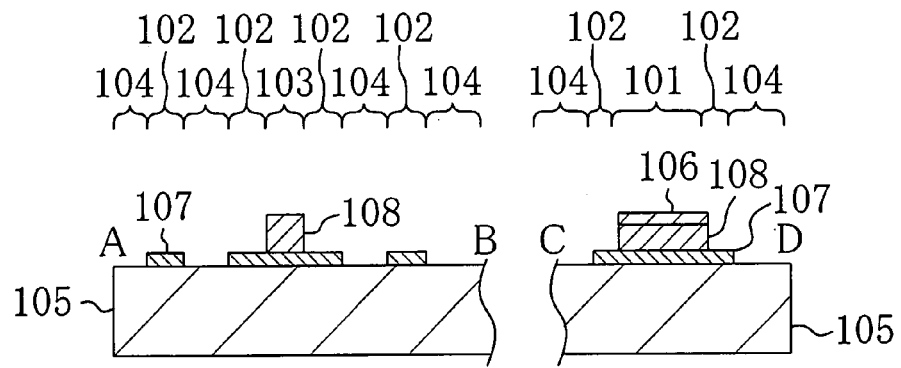
FIGS. 27A and 27B are diagrams of other variations of the cross-sectional structure of the portions corresponding to lines AB and CD of FIG. 21B.

Next, in the cross-sectional structure of the photomask shown in FIG. 27A, on a transparent substrate of, for example, a quartz substrate 105, a translucent semi-light-shielding film 107 for causing an identical phase difference in exposing light with respect to a transparent portion 104 is formed. In this case, the transparent portion 104 corresponds to a bare region of the quartz substrate 105, and a semi-light-shielding portion 102 corresponds to a bare region of the semi-light-shielding film 107 deposited on the quartz substrate 105. Furthermore, a phase shifting film 108 (with transmittance against the exposing light equivalent to that of the quartz substrate 105) for causing an opposite phase difference in the exposing light with respect to the transparent portion 104 is formed on the semi-light-shielding film 107. In this case, a phase shifter portion 103 corresponds to a bare region of the phase shifting film 108 deposited on the semi-light-shielding film 107. Also, a light-shielding portion 101 is formed by further stacking a light-shielding film 106 substantially not transmitting the exposing light on the phase shifting film 108.

In the aforementioned structure of FIG. 27A, the phases of the transparent portion 104, the phase shifter portion 103 and the semi-light-shielding portion 102 can be independently controlled, and hence, the phase differences among these portions can be accurately set in the photomask.

Figure 27B:
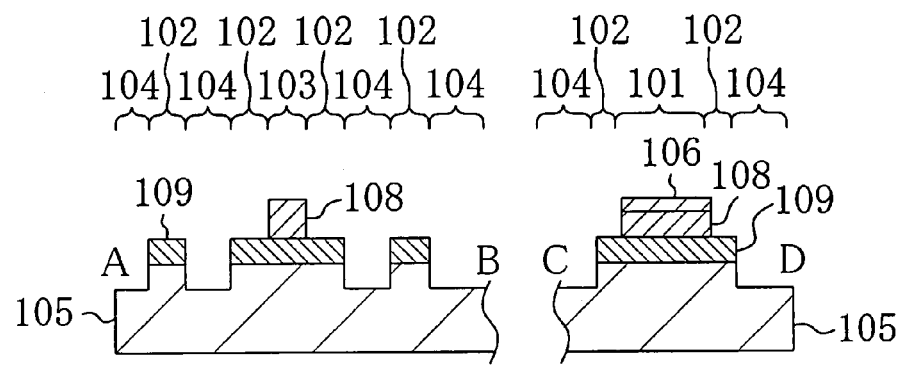

Next, in the cross-sectional structure of the photomask shown in FIG. 27B, on a transparent substrate of, for example, a quartz substrate 105, a translucent phase shifting film 109 for causing an opposite phase difference in exposing light with respect to a bare region of the quartz substrate 105 is formed. In this case, a transparent portion 104 corresponds to a portion on the quartz substrate 105 from which the phase shifting film 109 is selectively removed and that is trenched by a depth for causing an opposite phase difference. Furthermore, a phase shifting film 108 (with transmittance against the exposing light equivalent to that of the quartz substrate 105) for causing an opposite phase difference in the exposing light with respect to the bare region of the quartz substrate 105 is formed on the phase shifting film 109. In this case, a semi-light-shielding portion 102 corresponds to a bare region of the phase shifting film 109 formed on the quartz substrate 105, and a phase shifter portion 103 corresponds to a bare region of the phase shifting film 108 further stacked on the phase shifting film 109. Furthermore, a light-shielding portion 101 is formed by further stacking a light-shielding film 106 substantially not transmitting the exposing light on the phase shifting film 108.

In the photomask having the cross-sectional structure shown in any of FIGS. 26B through 26D, 27A and 27B, the thickness of the film used as the phase shifter portion causing an opposite phase difference or the thickness of the film used as the semi-light-shielding portion causing an identical phase difference needs to be approximately several hundred nm for phase adjustment. On the contrary, in the photomask having the cross-sectional structure of FIG. 26A, a thin film with a thickness of approximately several tens nm at most is used as the semi-light-shielding portion 102, and therefore, the microprocessing in performing patterning for mask processing can be easily performed. In this case, examples of the metal material usable as the thin film are metals such as Cr (chromium), Ta (tantalum), Zr (zirconium), Mo (molybdenum) and Ti (titanium) and alloys of these metals. Specific examples of the alloy is Ta—Cr alloy. Alternatively, a compound of a metal and silicon, such as Zr—Si, Mo—Si or Ti—Si, may be used.

In this manner, in the photomask having the cross-sectional structure shown in FIG. 26A, since the film to be processed is the metal thin film 107, the microprocessing for the mask processing can be eased. Accordingly, in the case where it is necessary to provide a very fine pattern used as a semi-light-shielding portion between a transparent portion 104 and a phase shifter portion 103 for attaining the effect of this invention, the photomask having the cross-sectional structure of FIG. 26A is a particularly good mask.

Although the semi-light-shielding film, the phase shifting film or the like is described as a single-layered film in each of the photomasks of FIGS. 26A through 26D, 27A and 27B, it goes without saying that any of these films may be formed as a multilayered film.

Now, an example of the application of this invention to a reflection mask will be described. As described in "Prerequisites", in the case where the invention is applied to a reflection mask instead of a transmission mask, in the description of the plane structure of the photomask of each embodiment shown in FIG. 1B or the like made with respect to a transmission mask, a transparent portion or a transparent region is replaced with a reflection portion or a reflection region, a light-shielding portion is replaced with a non-reflection portion, a semi-light-shielding portion is replaced with a semi-reflection portion, and transmittance is replaced with reflectance, whereas a phase shifter portion remains as a phase shifter portion.

Figure 28:
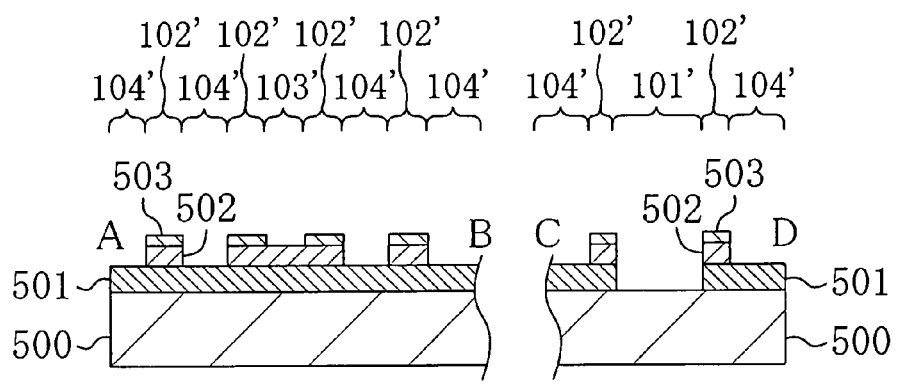
FIG. 28 is a diagram of another variation of the cross-sectional structure of the portions corresponding to lines AB and CD of FIG. 21B.

Next, in assuming that the photomask of this modification (the modification of Embodiment 3) shown in the plan view of FIG. 21B is a "reflection mask", a cross-sectional structure for realizing the plane structure will be described. FIG. 28 shows an exemplified cross-sectional structure of portions corresponding to lines AB and CD of the photomask (the reflection mask) of this modification of FIG. 21B. Although the cross-sectional structure of FIG. 28 corresponds to the plan view of FIG. 21B of this modification, when it is regarded as a variation of the cross-sectional structure of another embodiment, composing elements not necessary for that embodiment are omitted from the cross-sectional structure of FIG. 28.

In the cross-sectional structure of the photomask of FIG. 28, a first reflection layer 501 for reflecting exposing light is formed on a substrate 500, and a second reflection layer 502 for reflecting light in an opposite phase to the light reflected by the first reflection layer 501 is formed on the first reflection layer 501. It is noted that a bare region of the substrate 500 corresponds to a non-reflection portion 101' substituted for the light-shielding portion 101. Furthermore, the substrate 500 may be made of, for example, a silicon oxide-based compound or the like. Furthermore, the heights of the reflecting faces of the first reflection layer 501 and the second reflection layer 502 are different from each other in the phase by (180 degrees±30 degrees+360 degrees×n (wherein n is an integer)). In this case, a reflection portion 104' substituted for the transparent portion 104 corresponds to a bare region of the first reflection layer 501 formed on the substrate 500, and a phase shifter portion 103' substituted for the phase shifter portion 103 corresponds to a bare region of the second reflection layer 502 formed on the first reflection layer 501. Furthermore, an absorption layer 503 for partially absorbing light is further stacked on the second reflection layer 502, so as to form a semi-reflection portion 102' substituted for the semi-light-shielding portion 102.

In this manner, also in the case where the present invention is applied to a reflection mask, the same effect as that attained in the application to a transmission mask can be attained. Specifically, when a semi-reflection portion is provided in the outer region of a mask pattern or around the mask pattern, the MEF can be reduced in formation of a pattern with an arbitrary dimension in simultaneously forming patterns of various dimensions including a fine line pattern. Therefore, a pattern with a desired dimension can be accurately formed on a wafer.

Although the bare region of the substrate 500 is used as the non-reflection portion 101' in the structure shown in FIG. 28, this structure is merely an example and the non-reflection portion 101' may be any region on the substrate 500 where none of the reflection layers 501 and 502 are present.

Embodiment 4

A pattern formation method according to Embodiment 4 of the invention, and more specifically, a pattern formation method using the photomask according to any of Embodiments 1 through 3 and their modifications (hereinafter referred to as the photomask of the invention) will now be described with reference to the accompanying drawings.

FIGS. 29A through 29D are cross-sectional views for showing procedures in the pattern formation method of Embodiment 4.

Figure 29A:
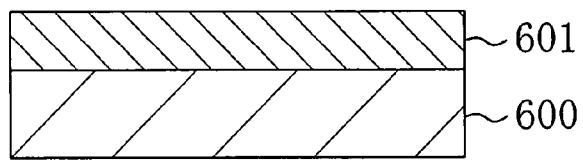
FIGS. 29A, 29B, 29C and 29D are cross-sectional views for showing procedures in a pattern formation method according to Embodiment 4 of the invention.
Figure 29B:
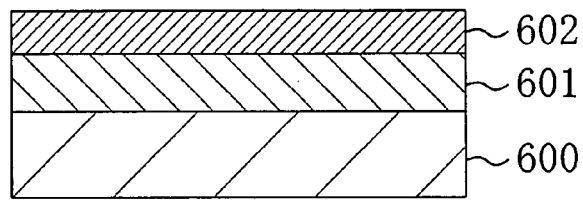

First, as shown in FIG. 29A, a target film 601 of, for example, a metal film or an insulating film is formed on a substrate 600, and thereafter, a positive resist film 602 is formed on the target film 601 as shown in FIG. 29B.

Figure 29C:
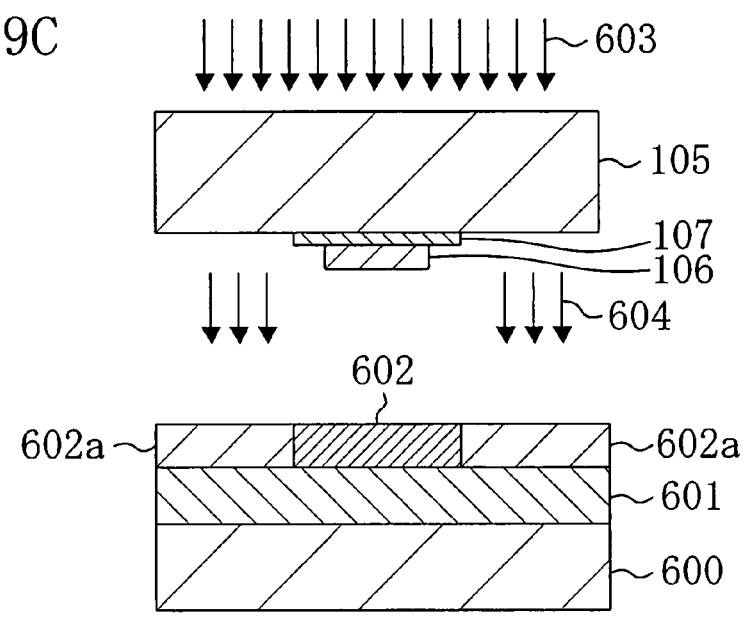

Next, as shown in FIG. 29C, the resist film 602 is irradiated with exposing light 603 through the photomask of this invention, for example, the photomask of Embodiment 1 having the cross-sectional structure shown in FIG. 1C. Thus, the resist film 602 is exposed with the exposing light 604 having passed through the photomask. At this point, a mask pattern of the photomask includes a semi-light-shielding portion made of a bare region of a semi-light-shielding film 107 formed on a transparent substrate of a quartz substrate 105 and a light-shielding portion made of a bare region of a light-shielding film 106 formed on the semi-light-shielding film 107. In other words, a semi-light-shielding portion is provided in an outer region of the mask pattern and a light-shielding portion is provided at the center of the mask pattern.

In the exposure procedure shown in FIG. 29C, the resist film 602 is subjected to the exposure by using a light source of, for example, oblique incident exposure (off-axis illumination). In this case, as shown in FIG. 29C, merely a latent image portion 602a of the resist film 602 corresponding to a region of the photomask excluding the mask pattern is irradiated at exposure energy sufficiently high for allowing the resist to dissolve in development.

Figure 29D:
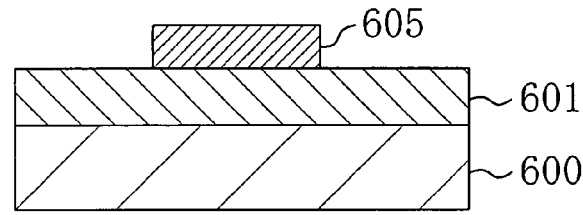

Next, the resist film 602 is developed so as to remove the latent image portion 602a, thereby forming resist pattern 605 corresponding to the mask pattern of the photomask as shown in FIG. 29D.

In this embodiment, since the photomask of this invention (specifically, the photomask of any of Embodiments 1 through 3 and their modifications) is used in the pattern formation method, the same effects as those attained in Embodiments 1 through 3 and their modifications can be attained.

Figure 30A:
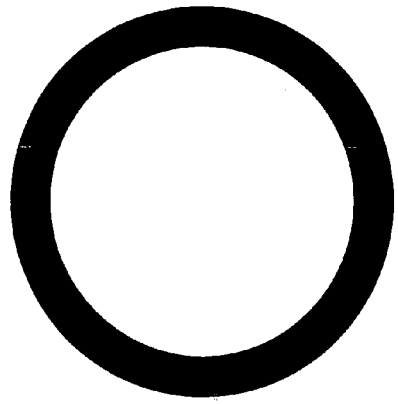
FIG. 30A is a diagram for schematically showing a general exposure light source and FIGS. 30B, 30C and 30D are diagrams for schematically showing light sources for oblique incident illumination.
Figure 30B:
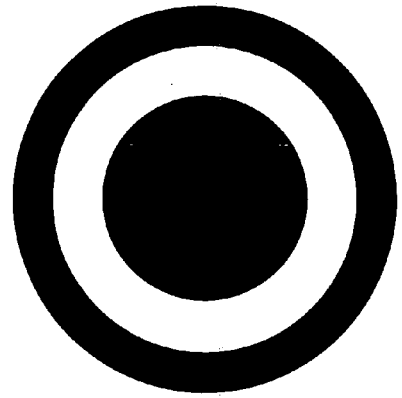
Figure 30C:
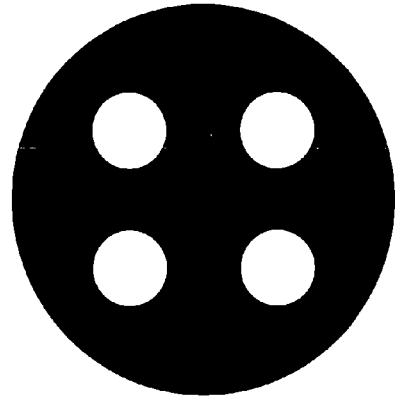
Figure 30D:
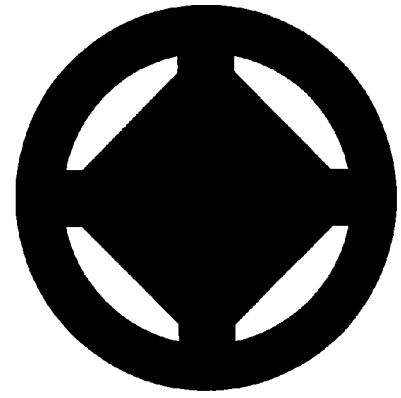

Furthermore, in this embodiment, when an oblique incident exposure light source is used in the exposure, performed through the photomask of this invention, of a substrate (a wafer) on which a resist has been applied, a light-shielded image with high contrast can be obtained even in formation of a fine pattern by using particularly the photomask including the phase shifter portion of Embodiment 2 or the modification of Embodiment 3, and therefore, a finer pattern can be formed. Herein, an oblique incident exposure light source means a light source as shown in any of FIGS. 30B through 30D obtained by removing a vertical incident component (a component of the exposing light vertically entering the photomask from the light source) from a general exposure light source of FIG. 30A. Typical examples of the oblique incident exposure light source are an annular exposure light source of FIG. 30B and quadrupole exposure light sources of FIGS. 30C and 30D. Although slightly depending upon a target pattern, the quadrupole exposure light source is generally more effectively used than the annular exposure light source for improving the contrast and increasing the DOF.

Embodiment 5

A mask data creation method according to Embodiment 5 of the invention will now be described with reference to the accompanying drawings. In this embodiment, mask data for the photomask of any of Embodiments 1 through 3 and their modifications (hereinafter referred to as the photomask of this invention) is created.

Figure 31:
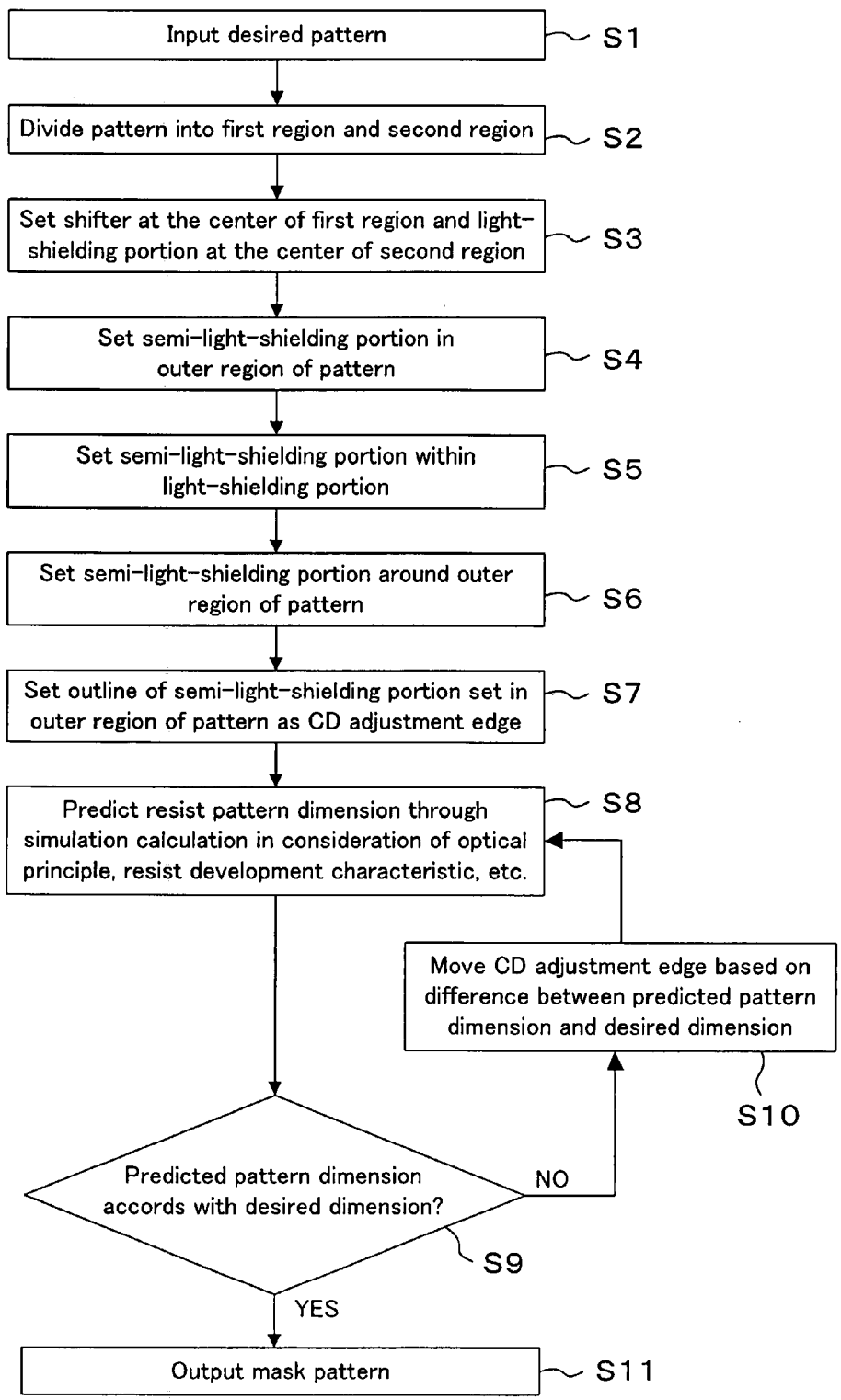
FIG. 31 is a flowchart of a basic flow of a mask data creation method according to Embodiment 5 of the invention.
Figure 32A:
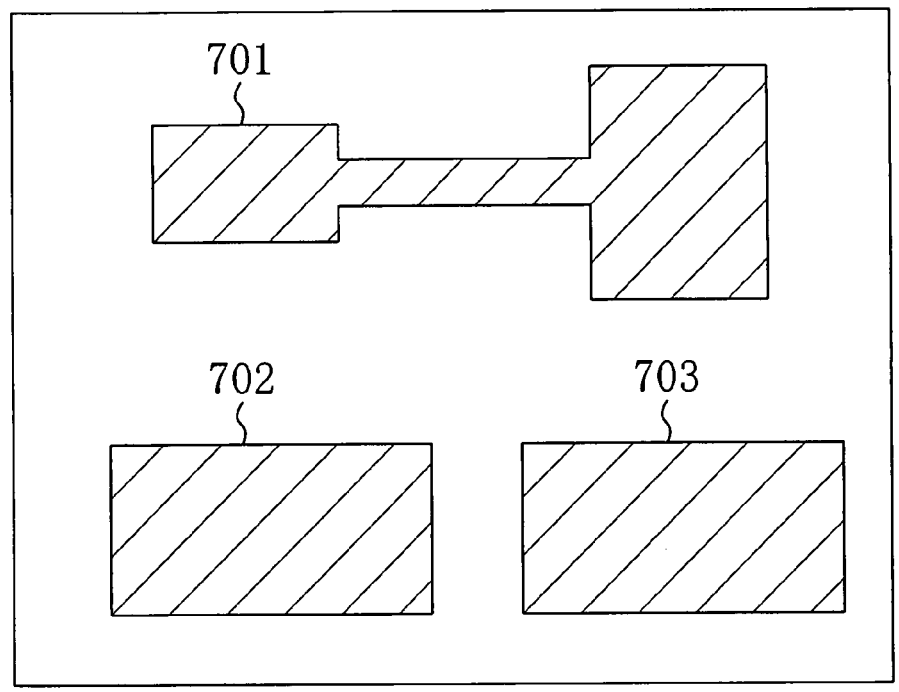
FIG. 32A is a diagram of an exemplified desired pattern to be formed by using a photomask of this invention and FIG. 32B is a diagram of a specifically exemplified mask pattern created in one procedure of the mask data creation method of Embodiment 5 of the invention.

FIG. 31 is a flowchart for showing the basic flow of the mask data creation method of this embodiment. FIG. 32A shows an example of a desired pattern to be formed by using the photomask of this invention, and specifically, an example of a design pattern corresponding to a mask pattern of the photomask of this invention. Specifically, patterns 701 through 703 shown in FIG. 32A are patterns corresponding to portions of a resist not desired to be exposed to exposing light in the exposure performed by using the photomask of this invention, namely, resist patterns. Also, FIGS. 32B, 33A, 33B, 34A, 34B and 35 respectively show exemplified mask patterns to be specifically created in respective procedures in the mask data creation method of this embodiment.

In the description of the pattern formation in this embodiment, the positive resist process is employed unless otherwise mentioned. In other words, it is premised in the description below that an exposed region of a resist is removed through development and an unexposed region of the resist remains as a resist pattern. Accordingly, when the negative resist process is employed instead of the positive resist process, the mask data creation method is performed in the same manner as in this embodiment except that an exposed region of a resist remains as a resist pattern with an unexposed region of the resist removed.

First, in step S1, desired patterns such as the patterns 701 through 703 shown in FIG. 32A are input to a computer used for the mask data creation. At this point, the transmittances of a phase shifter portion and a semi-light-shielding portion included in a mask pattern are set. Also, the desired patterns may be previously deformed, namely, enlarged or reduced, in each portion thereof if necessary.

Figure 32B:
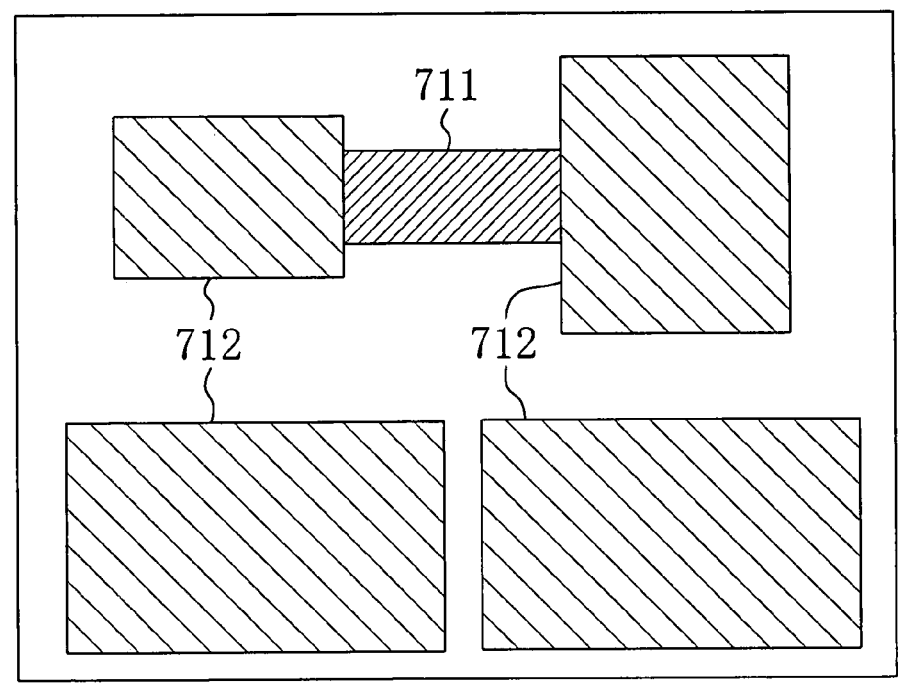

Next, in step S2, on the basis of exposure conditions and mask parameters such as transmittances of the phase shifter portion and the semi-light-shielding portion, each of the patterns 701 through 703 is divided into a first pattern region 711 to be provided with a phase shifter portion and a second pattern region 712 to be provided with a light-shielding portion as shown in FIG. 32B. At this point, as a method for dividing the patterns, for example, a given line width L0 may be set with respect to the patterns 701 through 703, so that a region having a line width not larger than the line width L0 can be defined as the first pattern region 711 and that a region having a line width larger than the line width L0 can be defined as the second pattern region 712.

Figure 33A:
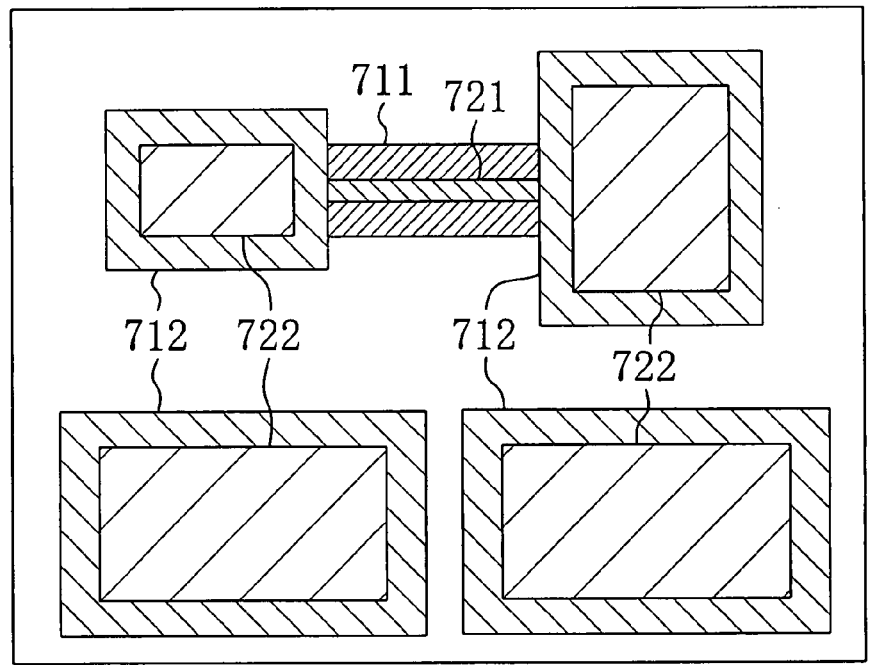
FIGS. 33A and 33B are diagrams of specifically exemplified mask patterns created in procedures of the mask data creation method of Embodiment 5 of the invention.

Then, in step S3, a phase shifter portion 721 for transmitting exposing light in an opposite phase with respect to a transparent portion is provided within the first pattern region 711 as shown in FIG. 33A, and a light-shielding portion 722 is provided within each second pattern region 712. At this point, with respect to the phase shifter portion 721 provided within the first pattern region 711, in the case where the first pattern region 711 includes a first shifter region with a line width L1 (L1≦L0) and a second shifter region with a line width L2 (L1<L2≦L0), the phase shifter portion 721 provided in the first shifter region preferably has a width U1 larger than a width U2 of the phase shifter portion 721 provided within the second shifter region (see Embodiment 2).

Figure 33B:
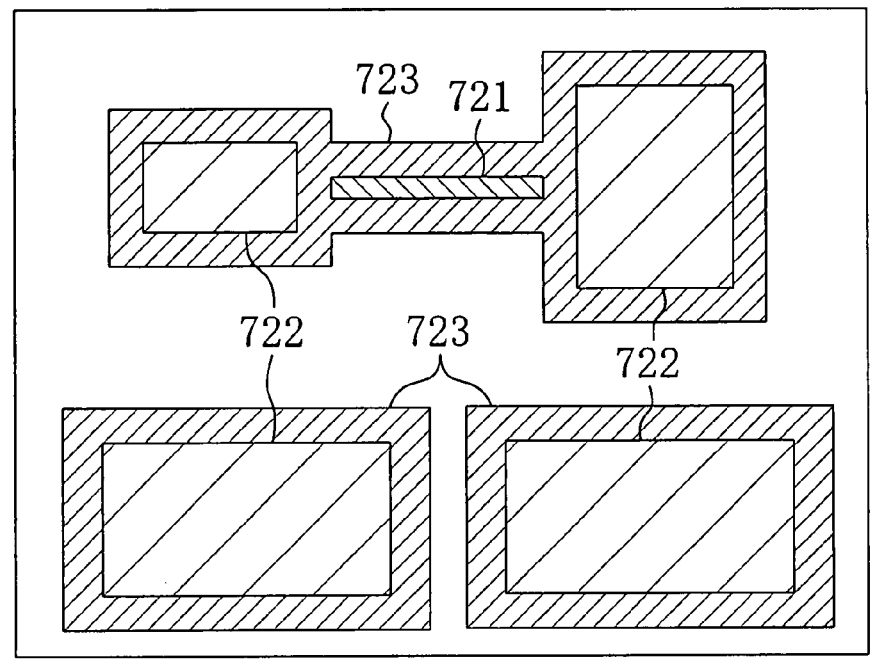

Next, in step S4, a semi-light-shielding portion 723 that partially transmits the exposing light in an identical phase with respect to the transparent portion is provided in an outer region of each of the first pattern region 711 and the second pattern regions 712 as shown in FIG. 33B. Specifically, the semi-light-shielding portion 723 is set so as to surround each of the phase shifter portion 721 and the light-shielding portion 722 set in step S3. At this point, the dimension of the semi-light-shielding portion 723 is preferably set so that a desired resist pattern can be formed, but the semi-light-shielding portion 723 may be set in a provisional dimension in step S4 because the optical proximity correction (OPC) is performed in a subsequent step in this embodiment.

Figure 34A:
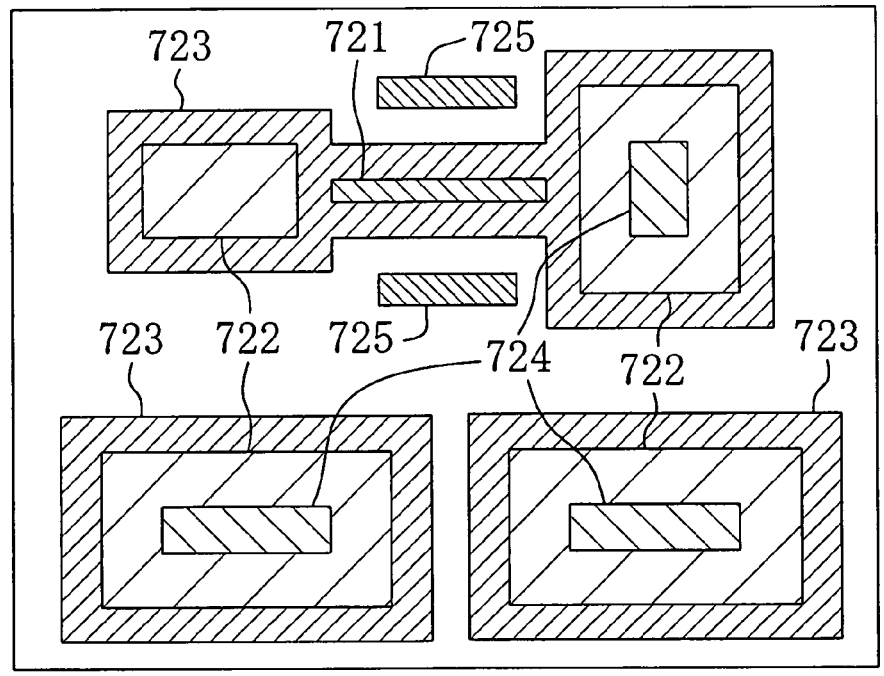
FIGS. 34A and 34B are diagrams of specifically exemplified mask patterns created in procedures of the mask data creation method of Embodiment 5 of the invention.

Next, in step S5, a semi-light-shielding portion 724 may be provided within the light-shielding portion 721 if necessary as shown in FIG. 34A.

Then, in step S6, an additional semi-light-shielding portion 725 may be provided, if necessary, around the semi-light-shielding portion 723 provided in the outer region of each of the first pattern region 711 and the second pattern regions 712 with a part of the transparent portion sandwiched therebetween as shown in FIG. 34A.

It is noted that the procedures in steps S5 and S6 may be appropriately omitted.

Figure 34B:
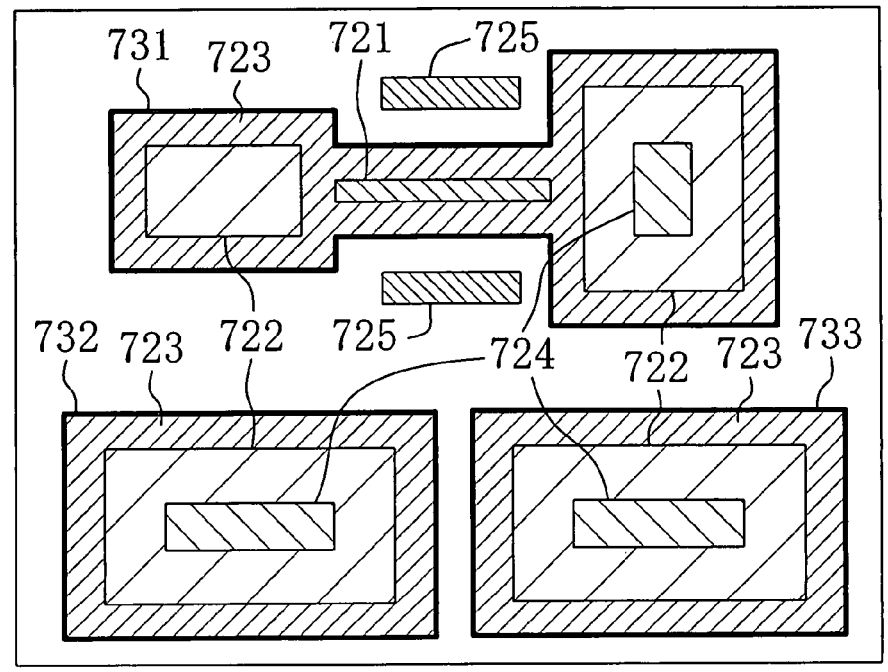

Next, in step S7, preparations are made for a process to adjust the dimension of the mask pattern (namely, OPC processing) so that a resist pattern with a desired dimension can be formed correspondingly to the mask pattern of the photomask through the exposure performed by using the photomask of this invention. Since the dimensions of the phase shifter portion 721 and the light-shielding portion 722 have been already determined in the procedures up to step S4 in this embodiment, merely the dimension of the semi-light-shielding portion 723 is adjusted in the OPC processing, so as to create photomask data for realizing a desired CD values. For this purpose, for example, the outlines of the semi-light-shielding portions 723 provided in the outer regions of the first pattern region 711 and the second pattern regions 712 in step S4 are set as CD adjustment edges 731 through 733 as shown in FIG. 34B. In other words, the OPC processing is performed through modification of the outline shape of the mask pattern by dividing and/or moving the CD adjustment edges 731 through 733. It is noted that the CD adjustment edges 731 through 733 may be divided correspondingly to respective sides of the mask pattern so as to move each of the divided edges.

Next, in steps S8, S9 and S10, the OPC processing (such as model base OPC processing) is performed. Specifically, in step S8, the dimension of a resist pattern (more accurately, the dimension of an unexposed region of the resist) to be formed by using the photomask of this invention is predicted through simulation performed in consideration of the optical principle, a resist development characteristic and, if necessary, an etching characteristic and the like. Subsequently, in step S9, it is examined whether or not the predicted pattern dimension accords with the dimension of a desired target pattern. When they do not accord with each other, the CD adjustment edges 731 through 733 are moved on the basis of a difference between the predicted pattern dimension and the desired dimension in step S10, so as to deform the outline shapes of the semi-light-shielding portions 723 provided in the outer regions of the mask pattern, thereby deforming the mask pattern.

Figure 35:
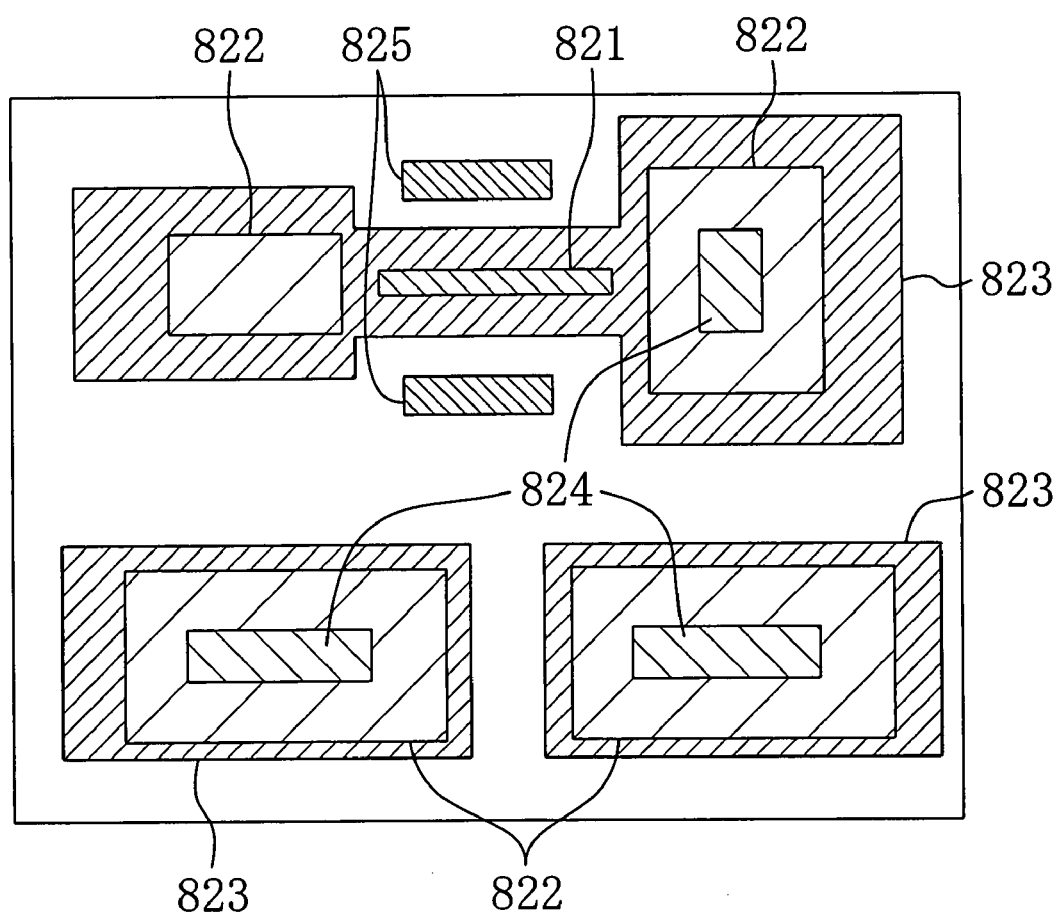
FIG. 35 is a diagram of a specifically exemplified mask pattern created in a procedure of the mask data creation method of Embodiment 5 of the invention.
Figure 36A:
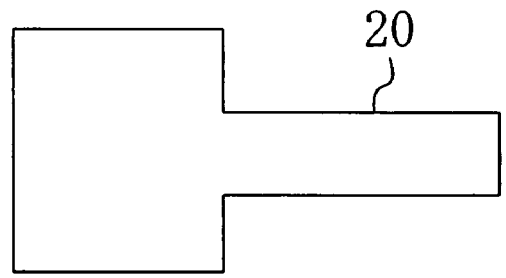
FIG. 36A is a diagram for showing the shape of a desired resist pattern to be formed by using a conventional photomask and FIG. 36B is a plan view of the conventional photomask.
Figure 36B:
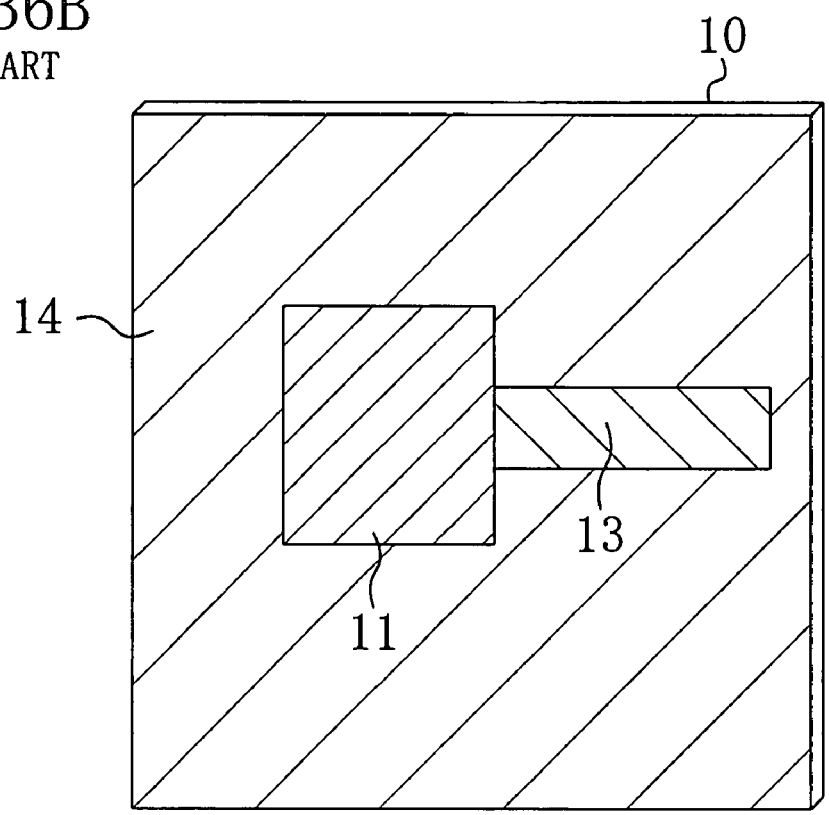

As a characteristic of this embodiment, the shapes of the phase shifter portion and the light-shielding portion provided within the mask pattern are determined in accordance with the desired pattern shape in step S3, and the shape of merely the semi-light-shielding portion provided in the outer region of the mask pattern is changed in steps S8 through S10, so as to realize the mask pattern for forming the pattern with the desired dimension. In other words, the procedures of steps S8 through S10 are repeated until the predicted pattern dimension and the desired dimension accord with each other, so that the mask pattern for forming the pattern with the desired dimension can be output ultimately in step S11. FIG. 35 shows an example of the mask pattern output in step S11. As shown in FIG. 35, pattern data of regions corresponding to a phase shifter portion 821, a light-shielding portion 822 and semi-light-shielding portions 823 through 825 is created.

When the photomask including the mask pattern created by the aforementioned mask data creation method of this embodiment is used in exposure of a wafer on which a resist has been applied, the following effect can be attained: Since a semi-light-shielding portion is provided in an outer region or around the mask pattern, the MEF can be reduced in formation of a pattern with an arbitrary dimension in simultaneously forming patterns with various dimensions including a fine line pattern, and therefore, a pattern with a desired dimension can be accurately formed on the wafer.

Furthermore, since the MEF with respect to the outer region of the mask pattern is reduced in the photomask of this invention, a formation error of a CD value caused on a wafer derived from a correction error of the mask dimension occurring in the OPC processing can be reduced in this embodiment.

Although the description is given with respect to a transmission photomask in this embodiment, this does not limit the invention. It goes without saying that mask data creation for a reflection mask can be performed in a similar manner to this embodiment by replacing all the transmission phenomenon of the exposing light with the reflection phenomenon by, for example, replacing the transmittance with the reflectance.

INDUSTRIAL APPLICABILITY

As described so far, the present invention relates to a photomask, a pattern formation method using the photomask and a mask data creation method, and is very useful in application to fine pattern formation employed in the fabrication of a semiconductor integrated circuit device or the like.

The invention claimed is:

1. A photomask comprising a mask pattern provided on a transparent substrate having a transparent property against exposing light,
   wherein said mask pattern includes a light-shielding portion and a semi-light-shielding portion,
   a transparent portion having a transparent property against the exposing light and surrounding said mask pattern is provided on said transparent substrate, and
   said semi-light-shielding portion is provided in at least a part of an outer region of said mask pattern and partially transmits the exposing light in an identical phase to the exposing light passing through said transparent portion.

2. The photomask of claim 1,
   wherein said mask pattern at least includes a first pattern region having a first width and a second pattern region having a second width larger than said first width,
   a phase shifter portion for transmitting the exposing light in an opposite phase to the exposing light passing through said transparent portion is provided in said first pattern region,
   said light-shielding portion is provided in said second pattern region, and
   said semi-light-shielding portion is provided in an outer region of at least said second pattern region.

3. The photomask of claim 2,
   wherein said semi-light-shielding portion is provided in an outer region of said first pattern region.

4. The photomask of claim 2,
   wherein said phase shifter portion is provided in such a manner as to be in contact with a given part of said light-shielding portion, and
   said semi-light-shielding portion is provided in such a manner as to be in contact with a part of said light-shielding portion other than said given part.

5. The photomask of claim 2,
   wherein said semi-light-shielding portion is not provided in at least a part of an outer region of said first pattern region.

6. The photomask of claim 2,
   wherein said phase shifter portion and said light-shielding portion are in contact with each other and are together surrounded with said semi-light-shielding portion.

7. The photomask of claim 2,
   wherein a part of said semi-light-shielding portion is sandwiched between said phase shifter portion and said light-shielding portion.

8. The photomask of claim 2,
   wherein said phase shifter portion and said light-shielding portion are individually surrounded with said semi-light-shielding portion.

9. The photomask of claim 8,
   wherein said semi-light-shielding portion includes at least one of a hammer-shaped pattern provided at an end of said phase shifter portion and a serif pattern provided at a corner of said light-shielding portion.

10. The photomask of claim 2,
    wherein said semi-light-shielding portion is made of a semi-light-shielding film formed on said transparent substrate, and
    said phase shifter portion is made of an opening formed in said semi-light-shielding film.

11. The photomask of claim 10,
    wherein said transparent substrate is trenched within said opening formed as said phase shifter portion.

12. The photomask of claim 2,
    wherein said phase shifter portion transmits the exposing light in a phase difference not less than (150+360×n) degrees and not more than (210+360×n) degrees with respect to said transparent portion (wherein n is an integer).

13. The photomask of claim 2,
    wherein said first width is not more than M×λ/NA (wherein λ indicates a wavelength of the exposing light and M and NA respectively indicate a reduction ratio and numerical aperture of a reduction projection optical system of a projection aligner).

14. The photomask of claim 1,
    wherein said semi-light-shielding portion transmits the exposing light in a phase difference not less than (−30+360×n) degrees and not more than (30+360×n) degrees with respect to said transparent portion (wherein n is an integer).

15. The photomask of claim 1,
    wherein said semi-light-shielding portion has transmittance against the exposing light of 4% or more and 64% or less.

16. The photomask of claim 1,
wherein said semi-light-shielding portion has transmittance against the exposing light of 10% or more and 40% or less.

17. The photomask of claim 1,
wherein said semi-light-shielding portion is made of a metal thin film with a thickness of 30 nm or less.

18. The photomask of claim 1,
wherein said semi-light-shielding portion provided in said outer region of said mask pattern has a width not more than M×λ/NA (wherein λ indicates a wavelength of the exposing light and M and NA respectively indicate a reduction ratio and numerical aperture of a reduction projection optical system of a projection aligner).

19. The photomask of claim 1,
wherein an additional semi-light-shielding portion is provided around said mask pattern with a part of said transparent portion sandwiched therebetween.

20. The photomask of claim 19,
wherein said part of said transparent portion sandwiched between said semi-light-shielding portion provided in said outer region of said mask pattern and said additional semi-light-shielding portion has a width not more than M×λ/NA (wherein λ indicates a wavelength of the exposing light and M and NA respectively indicate a reduction ratio and numerical aperture of a reduction projection optical system of a projection aligner).

21. The photomask of claim 19,
wherein said additional semi-light-shielding portion has transmittance against the exposing light of 25% or more.

22. The photomask of claim 21,
wherein said additional semi-light-shielding portion has a width not less than M+λ/NA (wherein λ indicates a wavelength of the exposing light and M and NA respectively indicate a reduction ratio and numerical aperture of a reduction projection optical system of a projection aligner).

23. The photomask of claim 1,
wherein said semi-light-shielding portion is provided in whole of said outer region of said mask pattern, and
said light-shielding portion is surrounded with said semi-light-shielding portion.

24. The photomask of claim 23,
wherein said mask pattern further includes an additional semi-light-shielding portion surrounded with said light-shielding portion.

25. The photomask of claim 23,
wherein said semi-light-shielding portion of said mask pattern has a periphery surrounded with said transparent portion, and
said transparent portion has a periphery surrounded with an additional semi-light-shielding portion provided on said transparent substrate.

26. The photomask of claim 23,
wherein said mask pattern is in a polygonal shape, and
respective sides of said mask pattern are surrounded with a plurality of rectangular patterns opposing said respective sides and corresponding to said transparent portion.

27. A photomask comprising a mask pattern surrounded with a reflection portion on a substrate,
wherein said mask pattern includes a non-reflection portion and a semi-reflection portion, and
said semi-reflection portion is provided in at least a part of an outer region of said mask pattern and partially reflects exposing light in an opposite phase to the exposing light reflected by said reflection portion.

28. The photomask of claim 27,
wherein said mask pattern includes at least a first pattern region having a first width and a second pattern region having a second width larger than said first width,
a phase shifter portion for reflecting the exposing light in an opposite phase to the exposing light reflected by said reflection portion is provided in said first pattern region,
said non-reflection portion is provided in said second pattern region, and
said semi-reflection portion is provided in an outer region of at least said second pattern region.

29. The photomask of claim 28,
wherein said semi-reflection portion is provided in an outer region of said first pattern region.

30. A method for fabricating the photomask of claim 2, comprising the steps of:
(a) successively forming a semi-light-shielding film and a light-shielding film on said transparent substrate;
(b) removing said semi-light-shielding film and said light-shielding film in a region for said transparent portion and in a region for said phase shifter portion;
(c) trenching said transparent substrate in the region for said phase shifter portion by a given depth after the step (b); and
(d) removing said light-shielding film in a region for said semi-light-shielding portion after the step (b).

31. A pattern formation method using the photomask of claim 1, comprising the steps of:
(a) forming a resist film on a substrate;
(b) irradiating said resist film with the exposing light through said photomask; and
(c) forming a resist pattern by developing said resist film having been irradiated with the exposing light.

32. The pattern formation method of claim 31,
wherein oblique incident illumination is employed in the step (b).

33. A mask data creation method for a photomask including a mask pattern formed on a transparent substrate having a transparent property against exposing light and a transparent portion of said transparent substrate where said mask pattern is not formed, comprising the steps of:
(a) creating a pattern corresponding to a desired unexposed region of a resist by irradiating said resist with the exposing light through said photomask;
(b) dividing said pattern into a first region having a width not larger than a given value and a second region having a width larger than said given value;
(c) providing, in said first region, a phase shifter portion for transmitting the exposing light in an opposite phase to the exposing light passing through said transparent portion;
(d) providing a light-shielding portion in said second region; and
(e) providing, in an outer region of said second region, a semi-light-shielding portion for partially transmitting the exposing light in an identical phase to the exposing light passing through said transparent portion.

34. The mask data creation method of claim 33, further comprising a step of providing said semi-light-shielding portion in an outer region of said first region.

35. The mask data creation method of claim 33, further comprising a step of creating a mask pattern for realizing a desired resist pattern by dividing and/or moving an outline of said semi-light-shielding portion after providing said semi-light-shielding portion.

36. The mask data creation method of claim 33, further comprising a step of providing an additional semi-light-shielding portion around said pattern with a part of said transparent portion sandwiched therebetween.

* * * * *